(12) United States Patent
Imai et al.

(10) Patent No.: US 9,166,624 B2
(45) Date of Patent: Oct. 20, 2015

(54) ERROR-CORRECTING CODE PROCESSING METHOD AND DEVICE

(75) Inventors: Masaharu Imai, Osaka (JP); Yoshinori Takeuchi, Osaka (JP); Keishi Sakanushi, Osaka (JP); Takashi Hamabe, Osaka (JP); Kazuki Ohya, Osaka (JP); Masaaki Abe, Osaka (JP)

(73) Assignee: OSAKA UNIVERSITY, Osaka (JP)

( * ) Notice: Subject to any disclaimer, the term of this patent is extended or adjusted under 35 U.S.C. 154(b) by 172 days.

(21) Appl. No.: 13/697,576

(22) PCT Filed: May 11, 2011

(86) PCT No.: PCT/JP2011/002639
§ 371 (c)(1),
(2), (4) Date: Nov. 13, 2012

(87) PCT Pub. No.: WO2011/142133
PCT Pub. Date: Nov. 17, 2011

(65) Prior Publication Data
US 2013/0061115 A1    Mar. 7, 2013

(30) Foreign Application Priority Data

May 11, 2010    (JP) ................................. 2010-109590

(51) Int. Cl.
*H03M 13/09*    (2006.01)
*H03M 13/19*    (2006.01)
(Continued)

(52) U.S. Cl.
CPC .............. *H03M 13/19* (2013.01); *H03M 13/05* (2013.01); *H03M 13/09* (2013.01); *H03M 13/11* (2013.01);
(Continued)

(58) Field of Classification Search
CPC . H03M 13/19; H03M 13/353; H03M 13/616; H03M 13/618; H03M 13/6502; H03M 13/05; H03M 13/09; H03M 13/11
See application file for complete search history.

(56) References Cited

U.S. PATENT DOCUMENTS

| | | |
|---|---|---|
| 5,313,475 A | 5/1994 | Cromer et al. |
| 5,574,717 A | 11/1996 | Tomizawa et al. |

(Continued)

FOREIGN PATENT DOCUMENTS

| | | |
|---|---|---|
| JP | 6-324951 | 11/1994 |
| JP | 8-265172 | 10/1996 |

(Continued)

OTHER PUBLICATIONS

International Search Report issued Sep. 6, 2011 in International (PCT) Application No. PCT/JP2011/002639.

(Continued)

*Primary Examiner* — Cynthia Britt
*Assistant Examiner* — Dipakkumar Gandhi
(74) *Attorney, Agent, or Firm* — Wenderoth, Lind & Ponack, L.L.P.

(57) ABSTRACT

An error-correcting code processing method includes: calculating descending symbols or ascending symbols or both, and calculating, as a parity, exclusive OR of all elements of an information symbol sequence; one or both of calculating exclusive OR for each element of the descending symbols, to generate low-order n bits of the descending symbols and calculating exclusive OR for each element of the ascending symbols, to generate low-order n bits of the ascending symbols; one or both of calculating exclusive OR of elements obtained by selecting, in descending order, elements from an element sequence resulting from arranging parities, to generate a high-order m bit of the descending symbols and calculating exclusive OR of elements obtained by selecting, in ascending order, elements from the element sequence, to generate a high-order m bit of the ascending symbols; and outputting the descending symbols or the ascending symbols or both as check symbols or a syndrome.

6 Claims, 52 Drawing Sheets

(51) Int. Cl.
*H03M 13/35* (2006.01)
*H03M 13/00* (2006.01)
*H03M 13/05* (2006.01)
*H03M 13/11* (2006.01)
*H03M 13/53* (2006.01)

(52) U.S. Cl.
CPC .......... *H03M 13/353* (2013.01); *H03M 13/616* (2013.01); *H03M 13/618* (2013.01); *H03M 13/6502* (2013.01)

(56) References Cited

U.S. PATENT DOCUMENTS

| | | | |
|---|---|---|---|
| 5,886,654 | A | 3/1999 | Ichikawa et al. |
| 6,799,287 | B1 | 9/2004 | Sharma et al. |
| 7,613,980 | B2 | 11/2009 | Cavanna et al. |
| 2004/0187064 | A1* | 9/2004 | Takahashi et al. ............. 714/758 |
| 2004/0243887 | A1 | 12/2004 | Sharma et al. |
| 2004/0250193 | A1 | 12/2004 | Cavanna et al. |
| 2005/0138523 | A1* | 6/2005 | Leonard et al. ............... 714/758 |
| 2005/0268209 | A1* | 12/2005 | Mann ............................ 714/776 |
| 2009/0319863 | A1 | 12/2009 | Shirai |
| 2011/0029838 | A1 | 2/2011 | Shinagawa et al. |

FOREIGN PATENT DOCUMENTS

| | | |
|---|---|---|
| JP | 9-298471 | 11/1997 |
| JP | 10-55630 | 2/1998 |
| JP | 11-225133 | 8/1999 |
| JP | 2001-237808 | 8/2001 |
| JP | 2001-358702 | 12/2001 |
| JP | 2005-6298 | 1/2005 |
| JP | 2009-253440 | 10/2009 |
| JP | 2010-9643 | 1/2010 |

OTHER PUBLICATIONS

Robert H. Morelos-Zaragoza, "The Art of Error Correcting Coding, Second Edition", Wiley, Aug. 29, 2006.
Shu Lin et al., "Error Control Coding, Second Edition", Pearson Prentice Hall, May 14, 2004.
Eiji Fujiwara, "Code Design for Dependable Systems: Theory and Practical Applications", Wiley-Interscience, Jul. 11, 2006.
Hirofumi Iwato et al., "A Low Power SoC for Pressure Measurement Capsules in Ambulatory Urodynamic Monitoring", COOL Chips XIII: Yokohama, Apr. 14-16, 2010, pp. 441-443.
Supplementary European Search Report issued Oct. 29, 2013 in corresponding European patent application No. 11 78 0392.
Wikipedia: "Hamming-Code", Apr. 30, 2000, XP002711348, Retrieved from the Internet: URL:http://de.wikipedia.org/w/index.php?title=Hamming-Code&oldid=73778459#Erweiterter Hamming-Code [retrieved on Aug. 15, 2013] (English version attached).
C. Lee: "Error-Control Block Codes for Communication Engineers", 2000, Artech House, pp. 58-63, XP002711349.

* cited by examiner

FIG. 4

$$H = \begin{bmatrix} \overbrace{\begin{matrix} 1 & 1 & 1 & 1 & 1 & 1 & 1 & 0 & 0 & 0 & 0 \\ 1 & 1 & 1 & 1 & 0 & 0 & 0 & 1 & 1 & 1 & 0 \\ 1 & 1 & 0 & 0 & 1 & 1 & 0 & 1 & 1 & 0 & 1 \\ 1 & 0 & 1 & 0 & 1 & 0 & 1 & 1 & 0 & 1 & 1 \end{matrix}}^{A} & \overbrace{\begin{matrix} 1 & 0 & 0 & 0 \\ 0 & 1 & 0 & 0 \\ 0 & 0 & 1 & 0 \\ 0 & 0 & 0 & 1 \end{matrix}}^{I_n} \end{bmatrix}$$

FIG. 5

$$G = \begin{bmatrix} \overbrace{\begin{matrix} 1 & 0 & 0 & 0 & 0 & 0 & 0 & 0 & 0 & 0 & 0 \\ 0 & 1 & 0 & 0 & 0 & 0 & 0 & 0 & 0 & 0 & 0 \\ 0 & 0 & 1 & 0 & 0 & 0 & 0 & 0 & 0 & 0 & 0 \\ 0 & 0 & 0 & 1 & 0 & 0 & 0 & 0 & 0 & 0 & 0 \\ 0 & 0 & 0 & 0 & 1 & 0 & 0 & 0 & 0 & 0 & 0 \\ 0 & 0 & 0 & 0 & 0 & 1 & 0 & 0 & 0 & 0 & 0 \\ 0 & 0 & 0 & 0 & 0 & 0 & 1 & 0 & 0 & 0 & 0 \\ 0 & 0 & 0 & 0 & 0 & 0 & 0 & 1 & 0 & 0 & 0 \\ 0 & 0 & 0 & 0 & 0 & 0 & 0 & 0 & 1 & 0 & 0 \\ 0 & 0 & 0 & 0 & 0 & 0 & 0 & 0 & 0 & 1 & 0 \\ 0 & 0 & 0 & 0 & 0 & 0 & 0 & 0 & 0 & 0 & 1 \end{matrix}}^{I_m} & \overbrace{\begin{matrix} 1 & 1 & 1 & 1 \\ 1 & 1 & 1 & 0 \\ 1 & 1 & 0 & 1 \\ 1 & 1 & 0 & 0 \\ 1 & 0 & 1 & 1 \\ 1 & 0 & 1 & 0 \\ 1 & 0 & 0 & 1 \\ 0 & 1 & 1 & 1 \\ 0 & 1 & 1 & 0 \\ 0 & 1 & 0 & 1 \\ 0 & 0 & 1 & 1 \end{matrix}}^{A^T} \end{bmatrix}$$

FIG. 6

$$Y = X \cdot G$$

$$= [1\ 0\ 1\ 1\ 0\ 1\ 1\ 1\ 1\ 0\ 1\ 1] \cdot G$$

$S = Y' \cdot H^T$ $$= [1\ 0\ 1\ 1\ 0\ 1\ 1\ \underline{0}\ 0\ 1\ 1\ 1\ 1\ 0\ 0] \cdot \begin{bmatrix} 1 & 1 & 1 & 1 \\ 1 & 1 & 1 & 0 \\ 1 & 1 & 0 & 1 \\ 1 & 1 & 0 & 0 \\ 1 & 0 & 1 & 1 \\ 1 & 0 & 1 & 0 \\ 1 & 0 & 0 & 1 \\ 0 & 1 & 1 & 1 \\ 0 & 1 & 1 & 0 \\ 0 & 1 & 0 & 1 \\ 0 & 0 & 1 & 1 \\ 1 & 0 & 0 & 0 \\ 0 & 1 & 0 & 0 \\ 0 & 0 & 1 & 0 \\ 0 & 0 & 0 & 1 \end{bmatrix}$$

1 ↓ Bit invert

Eighth (on left vector)

Eighth (on right matrix)

Same vector $= [0\ 1\ 1\ 1]$

FIG. 8

$$H' = \begin{bmatrix} 1 & 1 & 1 & 1 & 1 & 1 & 1 & 0 & 0 & 0 & 0 & 1 & 0 & 0 & 0 & 0 \\ 1 & 1 & 1 & 1 & 0 & 0 & 0 & 1 & 1 & 1 & 0 & 0 & 1 & 0 & 0 & 0 \\ 1 & 1 & 0 & 0 & 1 & 1 & 0 & 1 & 1 & 0 & 1 & 0 & 0 & 1 & 0 & 0 \\ 1 & 0 & 1 & 0 & 1 & 0 & 1 & 1 & 0 & 1 & 1 & 0 & 0 & 0 & 1 & 0 \\ 1 & 1 & 1 & 1 & 1 & 1 & 1 & 1 & 1 & 1 & 1 & 1 & 1 & 1 & 1 & 1 \end{bmatrix}$$

FIG. 9

$S = Y' \cdot H'^T$ $= [1\ 0\ 1\ 1\ 0\ 1\ 1\ (\underset{\uparrow}{0})\ 0\ 1\ 1\ 1\ 0\ 0\ 0] \cdot$ Bit invert, 1

$= [0\ 1\ 1\ 1\ 1]$

Eighth

Same vector $$\begin{bmatrix} 1 & 1 & 1 & 1 & 1 & 1 & 1 & 1 & 1 & 1 & 1 & 1 & 1 & 1 & 1 \\ 1 & 1 & 1 & 1 & 1 & 1 & 0 & 1 & 1 & 1 & 1 & 1 & 1 & 0 & 1 \\ 1 & 1 & 1 & 0 & 1 & 1 & 1 & 1 & 1 & 0 & 1 & 1 & 0 & 1 & 1 \\ 1 & 1 & 0 & 1 & 1 & 0 & 1 & 1 & 0 & 1 & 1 & 0 & 1 & 1 & 1 \\ 1 & 0 & 1 & 1 & 0 & 1 & 1 & 1 & 1 & 0 & 0 & 1 & 1 & 1 & 1 \\ 1 & 0 & 1 & 0 & 1 & 1 & 0 & 1 & 0 & 1 & 1 & 0 & 1 & 1 & 0 \\ 1 & 0 & 0 & 1 & 1 & 0 & 0 & 1 & 1 & 1 & 0 & 0 & 0 & 1 & 1 \\ 0 & 0 & 0 & 0 & 0 & 0 & 0 & 1 & 0 & 0 & 1 & 1 & 1 & 0 & 1 \end{bmatrix}$$

FIG. 12

| Syndrome $S_3S_2S_1S_0$ | Bit error location $a_3a_2a_1a_0$ |
|---|---|
| 0 0 0 0 | 0 0 0 0 |
| 0 0 0 1 | 0 0 0 1 |
| 0 0 1 0 | 0 0 1 0 |
| 0 0 1 1 | 0 1 0 1 |
| 0 1 0 0 | 0 0 1 1 |
| 0 1 0 1 | 0 1 1 0 |
| 0 1 1 0 | 0 1 1 1 |
| 0 1 1 1 | 1 0 0 0 |
| 1 0 0 0 | 0 1 0 0 |
| 1 0 0 1 | 1 0 0 1 |
| 1 0 1 0 | 1 0 1 0 |
| 1 0 1 1 | 1 0 1 1 |
| 1 1 0 0 | 1 1 0 0 |
| 1 1 0 1 | 1 1 0 1 |
| 1 1 1 0 | 1 1 1 0 |
| 1 1 1 1 | 1 1 1 1 |

FIG. 13

$$H = \begin{bmatrix} 1 & 1 & 1 & 1 & 1 & 1 & 1 & 1 & 0 & 0 & 0 & 0 & 0 & 0 & 0 & 0 \\ 1 & 1 & 1 & 1 & 0 & 0 & 0 & 0 & 1 & 1 & 1 & 1 & 0 & 0 & 0 & 0 \\ 1 & 1 & 0 & 0 & 1 & 1 & 0 & 0 & 1 & 1 & 0 & 0 & 1 & 1 & 0 & 0 \\ 1 & 0 & 1 & 0 & 1 & 0 & 1 & 0 & 1 & 0 & 1 & 0 & 1 & 0 & 1 & 0 \\ 1 & 1 & 1 & 1 & 1 & 1 & 1 & 1 & 1 & 1 & 1 & 1 & 1 & 1 & 1 & 1 \end{bmatrix}$$

FIG. 14

$$q_0 = \sum_{i=0}^{N/2-1} x'_{2i+1}$$

$$q_1 = \sum_{i=0}^{N/4-1} \sum_{j=0}^{1} x'_{4i+j+2} = \sum_{i=0}^{N/4-1} (x'_{4i+3} \oplus x'_{4i+2})$$

$$q_2 = \sum_{i=0}^{N/8-1} \sum_{j=0}^{1} x'_{8i+j+4} = \sum_{i=0}^{N/8-1} (x'_{8i+7} \oplus x'_{8i+6} \oplus x'_{8i+5} \oplus x'_{8i+4})$$

$$\vdots$$

$$q_{n-2} = \sum_{i=0}^{1} \sum_{j=0}^{N/4-1} x'_{(N/2)i+j+N/4}$$

$$= (x'_{N-1} \oplus x'_{N-2} \oplus \cdots \oplus x'_{3N/4}) \oplus (x'_{N/2-1} \oplus x'_{N/2-2} \oplus \cdots \oplus x'_{N/4})$$

$$q_{n-1} = \sum_{i=0}^{N/2-1} x'_{j+N/2} = x'_{N-1} \oplus x'_{N-2} \oplus \cdots \oplus x'_{N/2}$$

$$p = \sum_{i=0}^{L-1} x_i \oplus \sum_{i=0}^{n-1} q_i$$

FIG. 16

$q_3 = x'_{15} \oplus x'_{14} \oplus x'_{13} \oplus x'_{12} \oplus x'_{11} \oplus x'_{10} \oplus x'_9 \oplus x'_8$ $q_2 = x'_{15} \oplus x'_{14} \oplus x'_{13} \oplus x'_{12} \oplus x'_7 \oplus x'_6 \oplus x'_5 \oplus x'_4$ $q_1 = x'_{15} \oplus x'_{14} \oplus x'_{11} \oplus x'_{10} \oplus x'_7 \oplus x'_6 \oplus x'_3 \oplus x'_2$ $q_0 = x'_{15} \oplus x'_{13} \oplus x'_{11} \oplus x'_9 \oplus x'_7 \oplus x'_5 \oplus x'_3 \oplus x'_1$ $p = \sum_{i=1}^{15} x'_i$

FIG. 17

$$G^{(1)} = \left[ \begin{array}{cccccccccccc|cccc} 1 & 0 & 0 & 0 & 0 & 0 & 0 & 0 & 0 & 0 & 0 & & 1 & 1 & 1 & 1 \\ 0 & 1 & 0 & 0 & 0 & 0 & 0 & 0 & 0 & 0 & 0 & & 1 & 1 & 1 & 0 \\ 0 & 0 & 1 & 0 & 0 & 0 & 0 & 0 & 0 & 0 & 0 & & 1 & 1 & 0 & 1 \\ 0 & 0 & 0 & 1 & 0 & 0 & 0 & 0 & 0 & 0 & 0 & & 1 & 1 & 0 & 0 \\ 0 & 0 & 0 & 0 & 1 & 0 & 0 & 0 & 0 & 0 & 0 & & 1 & 0 & 1 & 1 \\ 0 & 0 & 0 & 0 & 0 & 1 & 0 & 0 & 0 & 0 & 0 & & 1 & 0 & 1 & 0 \\ 0 & 0 & 0 & 0 & 0 & 0 & 1 & 0 & 0 & 0 & 0 & & 1 & 0 & 0 & 1 \\ 0 & 0 & 0 & 0 & 0 & 0 & 0 & 1 & 0 & 0 & 0 & & 0 & 1 & 1 & 1 \\ 0 & 0 & 0 & 0 & 0 & 0 & 0 & 0 & 1 & 0 & 0 & & 0 & 1 & 1 & 0 \\ 0 & 0 & 0 & 0 & 0 & 0 & 0 & 0 & 0 & 1 & 0 & & 0 & 1 & 0 & 1 \\ 0 & 0 & 0 & 0 & 0 & 0 & 0 & 0 & 0 & 0 & 1 & & 0 & 0 & 1 & 1 \\ 0 & 0 & 0 & 0 & 0 & 0 & 0 & 0 & 0 & 0 & 0 & & 1 & 0 & 0 & 0 \\ 0 & 0 & 0 & 0 & 0 & 0 & 0 & 0 & 0 & 0 & 0 & & 0 & 1 & 0 & 0 \\ 0 & 0 & 0 & 0 & 0 & 0 & 0 & 0 & 0 & 0 & 0 & & 0 & 0 & 1 & 0 \\ 0 & 0 & 0 & 0 & 0 & 0 & 0 & 0 & 0 & 0 & 0 & & 0 & 0 & 0 & 1 \end{array} \right]$$

with $I_m$ labeling the left block and $H^T$ labeling the right block.

FIG. 18

$$G^{(2)} = \begin{bmatrix} 1 & 0 & 0 & 0 & 0 & 0 & 0 & 0 & 0 & 0 & 0 & 1 & 1 & 1 & 1 \\ 0 & 1 & 0 & 0 & 0 & 0 & 0 & 0 & 0 & 0 & 0 & 1 & 1 & 1 & 0 \\ 0 & 0 & 1 & 0 & 0 & 0 & 0 & 0 & 0 & 0 & 0 & 1 & 1 & 0 & 1 \\ 0 & 0 & 0 & 1 & 0 & 0 & 0 & 0 & 0 & 0 & 0 & 1 & 1 & 0 & 0 \\ 0 & 0 & 0 & 0 & 1 & 0 & 0 & 0 & 0 & 0 & 0 & 1 & 0 & 1 & 1 \\ 0 & 0 & 0 & 0 & 0 & 1 & 0 & 0 & 0 & 0 & 0 & 1 & 0 & 1 & 0 \\ 0 & 0 & 0 & 0 & 0 & 0 & 1 & 0 & 0 & 0 & 0 & 1 & 0 & 0 & 1 \\ 0 & 0 & 0 & 0 & 0 & 0 & 0 & 1 & 0 & 0 & 1 & 0 & 0 & 0 & 0 \\ 0 & 0 & 0 & 0 & 0 & 0 & 0 & 1 & 0 & 0 & 0 & 0 & 1 & 1 & 1 \\ 0 & 0 & 0 & 0 & 0 & 0 & 0 & 0 & 1 & 0 & 0 & 0 & 1 & 1 & 0 \\ 0 & 0 & 0 & 0 & 0 & 0 & 0 & 0 & 0 & 1 & 0 & 0 & 1 & 0 & 1 \\ 0 & 0 & 0 & 0 & 0 & 0 & 0 & 0 & 0 & 0 & 0 & 1 & 0 & 0 \\ 0 & 0 & 0 & 0 & 0 & 0 & 0 & 0 & 0 & 0 & 1 & 0 & 0 & 1 & 1 \\ 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 1 \end{bmatrix}$$

FIG. 19

$$G^{(3)} = \begin{bmatrix} 1 & 0 & 0 & 0 & 0 & 0 & 0 & 1 & 0 & 0 & 0 & 1 & 0 & 1 & 1 \\ 0 & 1 & 0 & 0 & 0 & 0 & 0 & 1 & 0 & 0 & 0 & 1 & 0 & 1 & 0 \\ 0 & 0 & 1 & 0 & 0 & 0 & 0 & 1 & 0 & 0 & 0 & 1 & 0 & 0 & 1 \\ 0 & 0 & 0 & 1 & 0 & 0 & 0 & 1 & 0 & 0 & 0 & 1 & 0 & 0 & 0 \\ 0 & 0 & 0 & 0 & 1 & 0 & 0 & 1 & 0 & 0 & 0 & 0 & 0 & 1 & 1 \\ 0 & 0 & 0 & 0 & 0 & 1 & 0 & 1 & 0 & 0 & 0 & 0 & 0 & 1 & 0 \\ 0 & 0 & 0 & 0 & 0 & 0 & 1 & 1 & 0 & 0 & 0 & 0 & 0 & 0 & 1 \\ 0 & 0 & 0 & 0 & 0 & 0 & 0 & 1 & 0 & 0 & 0 & 0 & 0 & 0 & 0 \\ 0 & 0 & 0 & 0 & 0 & 0 & 0 & 0 & 1 & 0 & 0 & 1 & 0 & 1 & 1 \\ 0 & 0 & 0 & 0 & 0 & 0 & 0 & 0 & 0 & 1 & 0 & 1 & 0 & 1 & 0 \\ 0 & 0 & 0 & 0 & 0 & 0 & 0 & 0 & 0 & 0 & 1 & 1 & 0 & 0 & 1 \\ 0 & 0 & 0 & 0 & 0 & 0 & 0 & 0 & 0 & 0 & 0 & 1 & 0 & 0 & 0 \\ 0 & 0 & 0 & 0 & 0 & 0 & 0 & 0 & 0 & 0 & 0 & 0 & 1 & 1 & 1 \\ 0 & 0 & 0 & 0 & 0 & 0 & 0 & 0 & 0 & 0 & 0 & 0 & 0 & 1 & 0 \\ 0 & 0 & 0 & 0 & 0 & 0 & 0 & 0 & 0 & 0 & 0 & 0 & 0 & 0 & 1 \end{bmatrix}$$

with column groupings labeled $I_7$, $q_3$, $I_3$, $q_2$, $I_1$, $q_1$, $q_0$.

FIG. 20

| | 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|---|
| | ⊕ | ⊕ | ⊕ | ⊕ | ⊕ | ⊕ | ⊕ | | | | | ⊕ | | | | | $q_3$ |
| | ⊕ | ⊕ | ⊕ | ⊕ | | | | ⊕ | ⊕ | ⊕ | | ⊕ | | | | | $q_2$ |
| | ⊕ | ⊕ | | | ⊕ | ⊕ | | ⊕ | ⊕ | | ⊕ | | ⊕ | | | | $q_1$ |
| | ⊕ | | ⊕ | | ⊕ | | ⊕ | ⊕ | | ⊕ | ⊕ | | | ⊕ | | | $q_0$ |

FIG. 21

|    | 15 | 14 | 13 | 12 | 11 | 10 | 9 | 8 | 7 | 6 | 5 | 4 | 3 | 2 | 1 | 0 |     |
|----|----|----|----|----|----|----|---|---|---|---|---|---|---|---|---|---|-----|
|    | ⊕  | ⊕  | ⊕  | ⊕  | ⊕  | ⊕  | ⊕ | ⊕ |   |   |   |   |   |   |   |   | $q_3$ |
|    | ⊕  | ⊕  | ⊕  | ⊕  |    |    |   |   | ⊕ | ⊕ | ⊕ | ⊕ |   |   |   |   | $q_2$ |
|    | ⊕  | ⊕  |    |    | ⊕  | ⊕  |   |   | ⊕ | ⊕ |   |   | ⊕ | ⊕ |   |   | $q_1$ |
|    | ⊕  |    | ⊕  |    | ⊕  |    | ⊕ |   | ⊕ |   | ⊕ |   | ⊕ |   | ⊕ |   | $q_0$ |

FIG. 40

$$s_0 = \sum_{i=0}^{N/2-1} y'_{2i+1}$$

$$s_1 = \sum_{i=0}^{N/4-1} \sum_{j=0}^{1} y'_{4i+j+2} = \sum_{i=0}^{N/4-1} (y'_{4i+3} \oplus y'_{4i+2})$$

$$s_2 = \sum_{i=0}^{N/8-1} \sum_{j=0}^{1} y'_{8i+j+4} = \sum_{i=0}^{N/8-1} (y'_{8i+7} \oplus y'_{8i+6} \oplus y'_{8i+5} \oplus y'_{8i+4})$$

$$\vdots$$

$$s_{n-2} = \sum_{i=0}^{1} \sum_{j=0}^{N/4-1} y'_{(N/2)i+j+N/4}$$

$$= (y'_{N-1} \oplus y'_{N-2} \oplus \cdots \oplus y'_{3N/4}) \oplus (y'_{N/2-1} \oplus y'_{N/2-2} \oplus \cdots \oplus y'_{N/4})$$

$$s_{n-1} = \sum_{i=0}^{N/2-1} y'_{j+N/2} = y'_{N-1} \oplus y'_{N-2} \oplus \cdots \oplus y'_{N/2}$$

$$r = \sum_{i=0}^{N-1} y'_i = y'_{N-1} \oplus y'_{N-2} \oplus \cdots \oplus y'_0$$

FIG. 41

| 15 | 14 | 13 | 12 | 11 | 10 | 9 | 8 | 7 | 6 | 5 | 4 | 3 | 2 | 1 | 0 | |
|---|---|---|---|---|---|---|---|---|---|---|---|---|---|---|---|---|
| ⊕ | ⊕ | ⊕ | ⊕ | ⊕ | ⊕ | ⊕ | ⊕ | | | | | | | | | $s_3$ |
| ⊕ | ⊕ | ⊕ | ⊕ | | | | | ⊕ | ⊕ | ⊕ | ⊕ | | | | | $s_2$ |
| ⊕ | ⊕ | | | ⊕ | ⊕ | | | ⊕ | ⊕ | | | ⊕ | ⊕ | | | $s_1$ |
| ⊕ | | ⊕ | | ⊕ | | ⊕ | | ⊕ | | ⊕ | | ⊕ | | ⊕ | | $s_0$ |
| ⊕ | ⊕ | ⊕ | ⊕ | ⊕ | ⊕ | ⊕ | ⊕ | ⊕ | ⊕ | ⊕ | ⊕ | ⊕ | ⊕ | ⊕ | ⊕ | r |

FIG. 43

$$q_j = \sum_{i=0}^{m-1} q_{i,j}, \text{ for } j = 0, 1, \cdots, n-1$$

$$q_n = \sum_{i=0}^{M/2-1} p_{2i+1} = p_{M-1} \oplus p_{M-3} \oplus \cdots \oplus p_3 \oplus p_1$$

$$q_{n+1} = \sum_{i=0}^{M/4-1} p_{4i+j+2} = \sum_{i=0}^{M/4-1} (p_{4i+3} \oplus p_{4i+2})$$

$$q_{n-2} = \sum_{i=0}^{M/8-1} p_{8i+j+4} = \sum_{i=0}^{M/8-1} (p_{8i+7} \oplus p_{8i+6} \oplus p_{8i+5} \oplus p_{8i+4})$$

$$\cdots$$

$$q_{m+n-2} = \sum_{i=0}^{1} \sum_{j=0}^{M/4-1} p_{(M/2)i+j+M/4}$$

$$= (p_{M-1} \oplus p_{M-2} \oplus \cdots \oplus p_{3M/4}) \oplus (p_{N/2-1} \oplus p_{N/2-2} \oplus \cdots \oplus p_{N/4})$$

$$q_{m+n-1} = \sum_{j=0}^{N/2-1} p_{j+M/2} = p_{M-1} \oplus p_{M-2} \oplus \cdots \oplus p_{M/2}$$

FIG. 45

$$s_j = \sum_{i=0}^{m-1} s_{i,j}, \text{ for } j = 0, 1, \cdots, n-1$$

$$s_n = \sum_{i=0}^{M/2-1} r_{2i+1} = r_{M-1} \oplus r_{M-3} \oplus \cdots \oplus r_3 \oplus r_1$$

$$s_{n+1} = \sum_{i=0}^{M/4-1} \sum_{j=0}^{1} r_{4i+j+2} = \sum_{i=0}^{M/4-1} (r_{4i+3} \oplus r_{4i+2})$$

$$s_{n+2} = \sum_{i=0}^{M/8-1} \sum_{j=0}^{3} r_{8i+j+4} = \sum_{i=0}^{M/8-1} (r_{8i+7} \oplus r_{8i+6} \oplus r_{8i+5} \oplus r_{8i+4})$$

$$\cdots$$

$$s_{m+n-2} = \sum_{i=0}^{1} \sum_{j=0}^{M/4-1} r_{(M/2)i+j+M/4}$$

$$= (r_{M-1} \oplus r_{M-2} \oplus \cdots \oplus r_{3M/4}) \oplus (r_{N/2-1} \oplus r_{N/2-2} \oplus \cdots \oplus r_{N/4})$$

$$s_{m+n-1} = \sum_{j=0}^{N/2-1} r_{j+M/2} = r_{M-1} \oplus r_{M-2} \oplus \cdots \oplus r_{M/2}$$

FIG. 47

$$p_0 = \sum_{i=0}^{N/2-1} x_{2i} = x_{N-2} \oplus x_{N-4} \oplus \cdots \oplus x_2 \oplus x_0$$

$$p_1 = \sum_{i=0}^{N/4-1} \sum_{j=0}^{1} x_{4i+j} = \sum_{i=0}^{N/4-1} (x_{4i+1} \oplus x_{4i+0})$$

$$p_2 = \sum_{i=0}^{N/8-1} \sum_{j=0}^{3} x_{8i+j} = \sum_{i=0}^{N/8-1} (x_{8i+3} \oplus x_{8i+2} \oplus x_{8i+1} \oplus x_{8i})$$

$$\vdots$$

$$p_{n-2} = \sum_{i=0}^{1} \sum_{j=0}^{N/4-1} x_{(N/2)i+j}$$
$$= (x_{3N/4-1} \oplus x_{3N/4-2} \oplus \cdots \oplus x_{N/2}) \oplus (x_{N/4-1} \oplus x_{N/4-2} \oplus \cdots \oplus x_0)$$

$$p_{n-1} = \sum_{j=0}^{N/2-1} x_j = x_{N/2-1} \oplus x_{N/2-2} \oplus \cdots \oplus x_0$$

$$q_0 = \sum_{j=0}^{N/2-1} x_{2i+1} = x_{N-1} \oplus x_{N-3} \oplus \cdots \oplus x_3 \oplus x_1$$

$$q_1 = \sum_{i=0}^{N/4-1} \sum_{j=0}^{1} x_{4i+j+2} = \sum_{i=0}^{N/4-1} (x_{4i+3} \oplus x_{4i+2})$$

$$q_2 = \sum_{i=0}^{N/8-1} \sum_{j=0}^{3} x_{8i+j+4} = \sum_{i=0}^{N/8-1} (x_{8i+7} \oplus x_{8i+6} \oplus x_{8i+5} \oplus x_{8i+4})$$

$$\vdots$$

$$q_{n-2} = \sum_{i=0}^{1} \sum_{j=0}^{N/4-1} x_{(N/2)i+j+N/4}$$
$$= (x_{N-1} \oplus x_{N-2} \oplus \cdots \oplus x_{3N/4}) \oplus (x_{N/2-1} \oplus x_{N/2-2} \oplus \cdots \oplus x_{N/4})$$

$$q_{n-1} = \sum_{j=0}^{N/2-1} x_{j+N/2} = x_{N-1} \oplus x_{N-2} \oplus \cdots \oplus x_{N/2}$$

$$r = \sum_{j=0}^{N-1} x_i = x_{N-1} \oplus x_{N-2} \oplus \cdots \oplus x_0$$

FIG. 48

|   | $q_3$ | $q_2$ | $q_1$ | $q_0$ | $p_3$ | $p_2$ | $p_1$ | $p_0$ | $p$ |
|---|---|---|---|---|---|---|---|---|---|
| 0 |   |   |   |   | ⊕ | ⊕ | ⊕ | ⊕ | ⊕ |
| 1 |   |   |   | ⊕ | ⊕ | ⊕ | ⊕ |   | ⊕ |
| 2 |   |   | ⊕ |   | ⊕ | ⊕ |   | ⊕ | ⊕ |
| 3 |   |   | ⊕ | ⊕ | ⊕ | ⊕ |   |   | ⊕ |
| 4 |   | ⊕ |   |   | ⊕ |   | ⊕ | ⊕ | ⊕ |
| 5 |   | ⊕ |   | ⊕ | ⊕ |   | ⊕ |   | ⊕ |
| 6 |   | ⊕ | ⊕ |   | ⊕ |   |   | ⊕ | ⊕ |
| 7 |   | ⊕ | ⊕ | ⊕ | ⊕ |   |   |   | ⊕ |
| 8 | ⊕ |   |   |   |   | ⊕ | ⊕ | ⊕ | ⊕ |
| 9 | ⊕ |   |   | ⊕ |   | ⊕ | ⊕ |   | ⊕ |
| 10 | ⊕ |   | ⊕ |   |   | ⊕ |   | ⊕ | ⊕ |
| 11 | ⊕ |   | ⊕ | ⊕ |   | ⊕ |   |   | ⊕ |
| 12 | ⊕ | ⊕ |   |   |   |   | ⊕ | ⊕ | ⊕ |
| 13 | ⊕ | ⊕ |   | ⊕ |   |   | ⊕ |   | ⊕ |
| 14 | ⊕ | ⊕ | ⊕ |   |   |   |   | ⊕ | ⊕ |
| 15 | ⊕ | ⊕ | ⊕ | ⊕ |   |   |   |   | ⊕ |

FIG. 51

$$\begin{pmatrix} 0 & 0 & 0 & 0 & 0 & 1 & 1 & 1 \\ 1 & 0 & 0 & 0 & 0 & 0 & 0 & 0 \\ 0 & 1 & 0 & 0 & 0 & 0 & 0 & 0 \\ 0 & 0 & 1 & 0 & 0 & 0 & 0 & 0 \\ 0 & 0 & 0 & 1 & 0 & 0 & 0 & 0 \\ 0 & 0 & 0 & 0 & 1 & 0 & 0 & 0 \\ 0 & 0 & 0 & 0 & 0 & 1 & 0 & 0 \\ 0 & 0 & 0 & 0 & 0 & 0 & 1 & 0 \end{pmatrix}$$

FIG. 52

$$\begin{pmatrix} 1 & 0 & 0 & 0 & 1 & 0 & 0 & 1 \\ 1 & 1 & 0 & 0 & 0 & 1 & 1 & 1 \\ 1 & 1 & 1 & 0 & 0 & 0 & 0 & 0 \\ 0 & 1 & 1 & 1 & 0 & 0 & 0 & 0 \\ 0 & 0 & 1 & 1 & 1 & 0 & 0 & 0 \\ 0 & 0 & 0 & 1 & 1 & 1 & 0 & 0 \\ 0 & 0 & 0 & 0 & 1 & 1 & 1 & 0 \\ 0 & 0 & 0 & 0 & 0 & 1 & 1 & 1 \end{pmatrix}$$

FIG. 53

$$\begin{pmatrix} 1 & 0 & 1 & 1 & 0 & 1 & 1 & 0 \\ 0 & 1 & 0 & 1 & 1 & 0 & 1 & 1 \\ 1 & 0 & 1 & 0 & 1 & 1 & 1 & 0 \\ 0 & 1 & 0 & 1 & 0 & 1 & 1 & 1 \\ 1 & 0 & 1 & 0 & 1 & 0 & 0 & 0 \\ 0 & 1 & 0 & 1 & 0 & 1 & 0 & 0 \\ 0 & 0 & 1 & 0 & 1 & 0 & 1 & 0 \\ 0 & 0 & 0 & 1 & 0 & 1 & 0 & 1 \end{pmatrix}$$

FIG. 55

| | |
|---|---|
| 0 | 1 1 1 0 0 0 0 0 |
| 1 | 0 1 1 1 0 0 0 0 |
| 2 | 0 0 1 1 1 0 0 0 |
| 3 | 0 0 0 1 1 1 0 0 |
| 4 | 1 0 0 0 1 1 1 0 |
| 5 | 0 1 0 0 0 1 1 1 |
| 6 | 0 1 0 0 0 0 1 1 |
| 7 | 1 1 0 0 0 0 0 1 |

$$\begin{pmatrix} 1 & 0 & 0 & 0 & 0 & 0 & 1 & 1 \\ 1 & 1 & 0 & 0 & 0 & 0 & 1 & 0 \\ 0 & 1 & 1 & 0 & 0 & 0 & 0 & 1 \\ 1 & 0 & 1 & 1 & 0 & 0 & 1 & 1 \\ 1 & 1 & 0 & 1 & 1 & 0 & 1 & 0 \\ 0 & 1 & 1 & 0 & 1 & 1 & 0 & 1 \\ 1 & 0 & 1 & 1 & 0 & 1 & 0 & 1 \\ 1 & 1 & 0 & 1 & 1 & 0 & 0 & 1 \end{pmatrix}$$

ERROR-CORRECTING CODE PROCESSING METHOD AND DEVICE

TECHNICAL FIELD

The present invention relates to an error-correcting code processing method and an error-correcting code processing device that make it possible to achieve power saving and an increase in efficiency of error correction in information communication or data transmission within an electronic system (hereafter, collectively referred to as information transmission).

BACKGROUND ART

Because there is always a possibility that a transmission error occurs in the field of information transmission, a means to detect and correct an error is needed. In an application field where a probability that a single error occurs during transmission (hereafter, referred to as a bit error rate) is relatively low, a coding scheme such as the extended Hamming coding scheme and high-dimensional parity coding scheme that has high coding efficiency and transmission efficiency is employed (see Non Patent Literatures (NPLS) 1 to 3).

FIG. 1 shows a general procedure for information transmission involving error correction. When a transmission system transmits information symbols X to a receiving system, the transmission system first generates a code word Y by adding, to the information symbols X, check symbols for error correction, using a coding device, and transmits the code word Y to the receiving system. Here, there is a possibility that a transmission error (E) occurs on a communication path due to disturbance, and part of a value of the code word Y changes. The code word received by the receiving system is denoted by Y'. FIG. 2 shows a relationship among the transmitted information symbols, check symbols, and code word. A code word having a length of N that is obtained by adding check symbols having a length of N−L to information symbols having a length of L is referred to as an (N, L) code. In addition, L/N is referred to as a code rate of the (N, L) code.

FIG. 3 shows a procedure for decoding and error correction. The receiving system decodes the received code word Y', calculates information called a syndrome for error detection and correction, and checks whether or not the received code word Y' includes a transmission error. When finding out that the code word Y' includes a correctable error, the receiving system corrects the information symbols. Information symbols to be outputted by the decoding and error correcting circuit are denoted by Z. There are four scenarios below for an error included in the information symbols Z to be outputted, depending on the capability of an employed error detection and correcting scheme. The following describes a coding scheme which enables single error correction and double error detection.

(1) When an error does not occur on a transmission path, a decoding and error correcting circuit determines that a received code word Y' does not include the error (Y'=Y).

(2) When an error (single error) that can be detected and corrected by a decoding and error correcting circuit occurs on a transmission path, the decoding and error correcting circuit can detect the single error included in a received code word Y' and correct the single error to a correct value.

(3) When an error (double error) that can be detected but cannot be corrected by a decoding and error correcting circuit occurs on a transmission path, the decoding and error correcting circuit can detect the double error included in a received code word Y' but cannot correct the double error to a correct value.

(4) When an error (at least 3-bit error) that cannot be detected by a decoding and error correcting circuit occurs on a transmission path, the decoding and error correcting circuit cannot detect the error included in a received code word Y' and thus cannot correct the error to a correct value.

The following describes a coding and decoding method in the extended Hamming coding scheme that enable single error correction and double error detection are used, and an elementary operation used in the coding and decoding method. A single error correcting method in which simple Hamming codes are used is first described, and the extended Hamming coding scheme that enables single error correction and double error detection is then described.

(1-1) Coding and Decoding in which Hamming Codes are Used

A Hamming code is a $(2^n-1, 2^n-1)$ code that constitutes a code word obtained by adding n-bit check symbols to information symbols having a length of $L=2^n-n-1$ bits, and is a single error correcting code. For instance, when n=4, a (15, 11) code is calculated. Information symbols X and a code word Y are expressed below by Equation 1 and Equation 2, respectively.

[Math. 1]

$$X=[x_{L-1}, x_{L-2}, \ldots, x_0], L=2^n-n-1 \quad \text{(Equation 1)}$$

[Math. 2]

$$Y=[y_{N-1}, y_{N-2}, \ldots, y_0], N=2^n-1 \quad \text{(Equation 2)}$$

In the Hamming coding scheme, a generator matrix G is used for coding, and a check matrix H is used for decoding. The check matrix H is an $n \times (2^n-1)$ matrix where each column includes all of n-dimensional column vectors except all zeros. FIG. 4 shows an exemplary check matrix H in the Humming coding scheme when n=4. The columns of the check matrix H may be arranged in any manner.

The generator matrix G corresponding to the check matrix H is a matrix that satisfies properties expressed by Equation 3. However, all additions (exclusive OR operation) are performed in modulo 2. $G^T$ and $H^T$ represent a transposed matrix of G and a transposed matrix of H, respectively. Hereafter, when a superior letter of a character representing a matrix is T, the character with the superior letter represents a transposed matrix of the matrix.

[Math. 3]

$$HG^T=(GH^T)^T=0 \quad \text{(Equation 3)}$$

When the check matrix H is expressed by Equation 4, a coding scheme is referred to as a systematic coding scheme.

[Math. 4]

$$H=[A I_n] \quad \text{(Equation 4)}$$

Here, A represents a given $n \times (2^n-n-1)$ matrix, and $I_n$ represents an $n \times n$ identity matrix. In the systematic coding scheme, the generator matrix G corresponding to the check matrix H is easily determined by Equation 5.

[Math. 5]

$$G=[I_{HL} A^T] \quad \text{(Equation 5)}$$

Here, $m=2^n-n-1$, and $A^T$ represents a transposed matrix of A. FIG. 5 shows the generator matrix G corresponding to the check matrix H shown by FIG. 4.

Coding is performed by multiplying the information symbols X by the generator matrix G. A code word obtained by coding the information symbols X is denoted by Y. For example, a code word corresponding to X=[10110111011] is Y=[101101110111100] as shown by FIG. 6.

Decoding and error correcting are performed in the following manner. It is assumed that a received code word is denoted by Y', and the received code word includes at most a single error. Here, a syndrome S of the received code word Y' is defined by Equation 6.

[Math. 6]

$$S = Y'H^T \quad \text{(Equation 6)}$$

Whether or not the received code word includes an error is determined based on a value of the syndrome S in the following manner.

When all elements of S are 0, it is determined that the received code word has not included the transmission error.

When S includes an element that indicates a value other than 0, it is determined that the error has been at a location in a column of H that matches a vector obtained by transposing S.

For instance, in the above example, assuming that the transmission error occurs at the 8th bit from the left of the received code word and that the received code word is Y'= [101101100111100], a syndrome is S=[0111] as shown by FIG. 7. A transposed vector of S matches a value of the 8th column from the left of the check matrix H, and thus it is clear that the error is at the 8th bit from the left of the received code word. (Note that the location at which the bit error occurs is underlined.)

(1-2) Coding and Decoding in which Extended Hamming Codes are Used

Using Hamming codes enables single error correction. However, when a double error occurs, it is impossible to determine whether a single error or double error occurs, and thus correction cannot be performed accurately.

Extended Hamming codes obtained by extending Hamming codes are used as a method of performing single error correction and double error detection. A code word in the extended Hamming coding scheme is obtained by adding, to a code word resulting from coding using the generator matrix G, a parity bit of the whole code word (exclusive OR of all bits of the code word). Thus, a code word length in the extended Hamming coding scheme is $2^n$.

In the above example, a parity of the code word [101101110111100] obtained by applying the generator matrix G to the information symbols X=[10110111011] is 0, and thus 0 is added to the end of the code word to generate Y=[1011011101111000].

Decoding and error detection and correction in the extended Hamming coding scheme are performed using an extended check matrix H' obtained by adding a column vector whose all elements are 0 after the last column of the check matrix H in the original Hamming coding scheme, and adding a vector whose all elements are 1 below the last row of the check matrix H. FIG. 8 shows the extended check matrix H' corresponding to the check matrix H shown by FIG. 4.

When the error occurs at the 8th bit from the left of the code word in the example, the received code word is Y'= [1011011001111100]. When a syndrome Y'H'$^T$ is calculated for the code word Y' using the extended check matrix, [01111] is obtained as shown by FIG. 9.

A transposed vector of [01111], the multiplication result, matches a value of the 8th column from the left of the extended check matrix, and thus it is clear that the error occurs at the 8th bit from the left of the received code word. When the received code word includes a double error, the last element of Y'H'$^T$ is 0, because even numbers of 1 are included in the received code word. All the elements of the last row of the extended check matrix are 1, and thus a column vector obtained by transposing the check result does not match any column of the extended check matrix. In this case, it is determined that the double error has occurred. When an at least 3-bit error occurs, it is impossible to detect the at least 3-bit error. The above description can be summarized into <Case 1> to <Case 3> indicated below. Hereafter, a syndrome is represented by S=[$s_{n-1}$, $s_{n-2}$, ..., $s_{1,0}$, r]. In addition, or (element 1, element 2, ..., element n) is a logic function for calculating a logical sum of all elements.

<Case 1> When all elements of S are 0 (r=0 and or ($s_{n-1}$, $s_{n-2}$, ..., $s_1$, $s_0$)=0), it is determined that an error has not occurred.

<Case 2> When the element r=1 in S, it is determined that a single error has occurred. A location where the error occurs is an element corresponding to a column having a pattern that matches S.

<Case 3> In a case other than <Case 1> and <Case 2> (r=0 and or ($s_{n-1}$, $s_{n-2}$, ..., $s_1$, $s_0$)=1), it is determined that a double error has occurred.

Next, conventional methods of implementing a device for coding and a device for decoding and error correcting can be classified into the following two types: (A) Implementation using software on a general-purpose processor (hereafter, referred to as a conventional method (A)); and (B) Implementation using dedicated hardware (ASIC: Application Specific Integrated Circuit) (hereafter, referred to as a conventional method (B)).

FIG. 10 is a diagram showing implementation of conventional error-correcting code processing, using software on a general-purpose processor. In FIG. 10, an instruction memory 111 and a data memory 112 are outside of a general-purpose processor 110. The instruction memory 111 holds instructions for coding operations and decoding operations in the error-correcting code processing. The general-purpose processor 110 performs a coding operation and a decoding operation in the error-correcting code processing according to an instruction read from the instruction memory 111. Moreover, the general-purpose processor 110 reads data held in the data memory 112 via a data bus 113, according to an instruction read from the instruction memory 111. Furthermore, the general-purpose processor 110 stores the results of the operations performed, into the data memory 112 via the data bus 113.

FIG. 11 is a diagram showing implementation of the conventional error-correcting code processing, using a general-purpose processor and a dedicated peripheral circuit (ASIC). In FIG. 11, an instruction memory 121, a data memory 122, a coding circuit 123, and a decoding circuit 124 are outside of a general-purpose processor 120. The instruction memory 121 holds instructions for coding operations and decoding operations in the error-correcting code processing. The general-purpose processor 120 reads data and a command specifying a process to be performed that are held in the data memory 122 via a data bus 125, according to an instruction read from the instruction memory 121, and transmits the command and data to the coding circuit 123 and the decoding circuit 124 via the data bus 125. Moreover, the general-purpose processor 120 reads, from the coding circuit 123 and the decoding circuit 124, status information indicating whether coding and decoding are possible or the like and the results of operations after the coding and decoding, and stores the status information and the results of the operations into the data memory 122 via the data bus 125. The coding circuit 123 performs a coding operation in the error-correcting code processing according to an instruction read from the instruction memory 121. The decoding circuit 124 performs a decoding operation in the error-correcting code processing according to an instruction read from the instruction memory 121. Here, the coding circuit 123 and the decoding circuit 124 include the ASIC. In addition, the coding circuit 123 generates check symbols, and the decoding circuit 124 generates a syndrome and corrects an error.

The following trade-offs exist between the convention methods (A) and (B).

In comparison with the conventional method (B), the conventional method (A) has the following advantages: (a) a smaller hardware amount required for implementation (it is sufficient to provide only a memory for storing programs.); and (b) more flexibility in responding to a change of specifications (it is possible to easily respond to a change of a coding scheme or a code length.).

However, in comparison with the convention method (B), the conventional method (A) has the following disadvantages: (c) a longer execution time (a larger number of execution cycles); and (d) a larger power consumption.

CITATION LIST

[Non Patent Literature]
[NPL 1]
Robert H. Morelos-Zaragoza: The art of error correcting coding, Second Ed., Wiley
[NPL 2]
Shu Lin, D. J. Costello, Jr.: Error Control Coding, Pearson Prentice Hall
[NPL 3]
Eiji Fujiwara: Code Design for Dependable Systems, Wiley

SUMMARY OF INVENTION

Technical Problem

The extended Hamming coding scheme excels, in a code rate, other coding schemes having equivalent error-correcting capability, and are highly practical. However, the extended Hamming coding scheme does not make it easy to efficiently identify a location of a bit where an error has occurred, based on bit-error information obtained when decoding is performed.

To put it another way, the extended Hamming coding scheme is characterized by having the highest code rate among the coding schemes that enable single error correction and double error detection. However, as described in the conventional examples in Background Art, when the single error is detected, in order to identify the location where the bit error is included, it is necessary to compare each column of the extended check matrix and the column vector obtained by transposing the operation result of the syndrome $S=Y'H'^T$, to identify, among the columns, a column that matches the column vector. And yet when the systematic coding scheme is used, the arrangement of columns of the check matrix in the case where each column is considered as a binary number is not monotonous, and thus a method of efficiently identifying, using both a hardware amount and an execution time, a column that matches a syndrome S is not obvious.

For instance, when the extended Hamming coding scheme using the systematic codes are implemented by software for the conventional method (A), in order to efficiently identify a location where an error has occurred, the following approaches are conceivable: (a) sequentially searching a matching column vector; (b) increasing the efficiency of search by using hashing; (c) preparing in advance a translation table for calculating a location of a bit error from a syndrome, as shown by FIG. 12, and reducing a calculation time by table lookup; and so on. However, the approach (a) involves a large calculation amount, the approaches (b) and (c) require a large memory when a code length is great, and so on. All of the approaches are disadvantageous in the power consumption.

Moreover, to enhance, using dedicated hardware for the conventional method (B), the speed of the extended Hamming coding scheme using the systematic codes, a mechanism for identifying an error location must be implemented by hardware. As a result, not only the hardware amount but also the power consumption are increased.

As a result of further miniaturization of semiconductors, an integration degree and a clock frequency of Very Large Scale Integration (VLSI) are increased, and performance of the VLSI is enhanced. However, consequently, a power consumption of the VLSI is likely to increase. In particular, the general-purpose processor has a significant problem that an amount of heat generation and a temperature are increased with the increase in the power consumption. Although the conventional method (B) excels the conventional method (A) in the power consumption, the conventional method (B) has difficulty flexibly responding to a change of specifications or a change in a transmission path error rate of a transmission path. Therefore, a problem to be solved is to develop an error-correcting code processing device that flexibly responds to a change of specifications or a change in a transmission path error rate of a transmission path, and uses an implementation method that consumes less power.

The present invention is conceived to solve such conventional problems, and an object of the present invention is to provide an error-correcting code processing method and an error-correcting code processing device that easily identify a location where an error has occurred, flexibly respond to a change of specifications or a change in a transmission path error rate of a transmission path, and consume less power.

Solution to Problem

In order to achieve the object, an error-correcting code processing method according to an aspect of the present invention is an error-correcting code processing method for processing, as data, an information symbol sequence $V=(v_{L-1}, v_{L-2}, \ldots, v_1, v_0)$ having a length of $L=2^{m+n}$ (m is an integer greater than or equal to 1 and n is an integer greater than or equal to 2), the method including, when the information symbol sequence V has a length of M words ($M=2^m$ and a bit length of one word is $L_w=2^n$), an information symbol sequence of an i-th word is $W_i=(v_{i, Lw-1}, v_{i, Lw-2}, \ldots, v_{i, 1}, v_{i, 0})$, and the information symbol sequence V is $(W_{M-1}, W_{M-2}, \ldots, W_1, W_0)$ obtained by arranging the M words in descending order, when either descending symbols $Q=(q_{m+n-1}, q_{m+n-2}, \ldots, q_1, q_0)$ or ascending symbols $PP=(pp_{m+n-1}, pp_{m+n-2}, \ldots, pp_1, pp_0)$ or both are calculated, the descending symbols Q being obtained by arranging, in a descending order of j ($j=0, 1, 2, \ldots, m+n-1$), elements resulting from exclusive OR of $2^{m+n-1}$ elements of the information symbol sequence V which are obtained by selecting every other $2^j$ elements ($j=0, 1, 2, \ldots, m+n-1$) in descending order according to subscripts of elements $v_i$ of the information symbol sequence V, and the ascending symbols PP being obtained by arranging, in a descending order of j, elements resulting from exclusive OR of $2^{m+n-1}$ elements of the information symbol sequence V which are obtained by selecting every other $2^j$ elements (j=0, 1, 2, ..., m+n−1) in ascending order according to the subscripts of the elements $v_i$ of the information symbol sequence V: calculating either descending symbols $Q_{Li}=(q_{i,n-1}, q_{i,n-2}, ..., q_{i,1}, q_{i,0})$ or ascending symbols $PP_{Li}=(pp_{i,n-1}, pp_{i,n-2}, ..., pp_{i,1}, pp_{i,0})$ or both, and calculating, as a parity $p_i$, exclusive OR of all elements of the information symbol sequence $W_i$, the descending symbols $Q_{Li}$ being obtained by arranging, in descending order of k (k=0, 1, 2, ..., n−1), elements resulting from exclusive OR of $2^{n-1}$ elements of the information symbol sequence $W_i$ which are obtained by selecting every other $2^k$ elements (k=0, 1, 2, ..., n−1) from elements $v_{i,j}$ of the information symbol sequence $W_i$ in descending order according to subscripts j (j=0, 1, 2, ..., $2^{n-1}$) of the elements $v_{i,j}$, and the ascending symbols $PP_{Li}$ being obtained by arranging, in descending order of k, elements resulting from exclusive OR of $2^{n-1}$ elements of the information symbol sequence $W_i$ which are obtained by selecting every other $2^k$ elements (k=0, 1, 2, ..., n−1) from the elements $v_{i,j}$ of the information symbol sequence $W_i$ in ascending order according to the subscripts j of the elements $v_{i,j}$; one or both of (i) calculating exclusive OR for each subscript i=0, 1, 2, ..., M−1 for each of the elements of the descending symbols $Q_{Li}$, to generate low-order n bits $Q_L=(q_{n-1}, q_{n-2}, ..., q_1, q_0)$ of the descending symbols Q and (ii) calculating exclusive OR for each subscript i=0, 1, 2, ..., M−1 for each of the elements of the ascending symbols $PP_{Li}$, to generate low-order n bits $PP_L=(pp_{n-1}, pp_{n-2}, ..., pp_1, pp_0)$ of the ascending symbols PP; one or both of (i) calculating exclusive OR of $2^{m-1}$ elements obtained by selecting every other $2^k$ elements (k=0, 1, 2, ..., m−1) from elements $p_i$ of an element sequence $P_w=(p_{M-1}, p_{M-2}, ..., p_1, p_0)$ in descending order according to subscripts i of the elements $p_i$, to generate a high-order m bit $Q_H=(q_{m+n-1}, q_{m+n-2}, ..., q_{n+1}, q_n)$ of the descending symbols Q and (ii) calculating exclusive OR of $2^{m-1}$ elements obtained by selecting every other $2^k$ elements (k=0, 1, 2, ..., m−1) from the elements $p_i$ in ascending order according to the subscripts i of the elements $p_i$, to generate a high-order m bit $PP_H=(pp_{m+n-1}, pp_{m+n-2}, ..., pp_{n+1}, pp_n)$ of the ascending symbols PP; and outputting either the generated descending symbols Q or ascending symbols PP or both as one of check symbols and a syndrome.

With this configuration, the check symbols and the syndrome have regularity, and thus the error-correcting code processing method makes it possible to easily identify a location where an error has occurred, flexibly respond to a change of specifications or a change in a transmission path error rate of a transmission path, and consume less power.

The error-correcting code processing method for use in transmitting, as data, information symbols $X=(x_{L-1}, x_{L-2}, ..., x_1, x_0)$ having a length of $L=2^h-1$ (h is an integer greater than or equal to 2), the method further including, when a code length of a code word Y is $N=2^h$, check symbols are $Q=(q_{h-1}, q_{n-2}, ..., q_1, q_0)$ and a parity p, and extended information symbols $X'=(x_{L-1}, x_{L-2}, ..., x_{L-N/2+1}, 0, x_{L-N/2}, ..., x_{10}, x_9, x_8, x_7, x_6, x_5, x_4, 0, x_3, x_2, x_1, 0, x_0, 0, 0, 0)$ have a length of N and are extended by assigning 0 to, among elements $x'_i$ of the extended information symbols X', elements $x'_i$ whose subscripts i are $0, 2^0, 2^1, ..., 2^{h-1}$ and arranging, from right, the elements $x_i$ of the information symbols X as the remaining elements $x'_i$, in ascending order according to the subscripts i of the elements $x_i$: the following steps performed when the code length of the code word Y is less than or equal to one word: calculating exclusive OR of $2^{h-1}$ elements obtained by selecting every other $2^j$ elements (j=0, 1, 2, ..., h−1) from elements $x'_i$ (i=0, 1, 2, ..., $2^h-1$) of the extended information symbols X' in descending order according to subscripts i of the elements $x'_i$, to generate, as check symbol data, the elements $q_j$ (j=0, 1, 2, ..., h−1) of the check symbols Q; and calculating exclusive OR of all the calculated $q_j$ and all the elements $x_i$ of the extended information symbols X to generate the parity p as data; the following step performed when the code length of the code word Y is M words ($M=2^m$, a bit length of one word is $Lw=2^n$, m is an integer greater than or equal to 1, and h=m+n): generating, using the extended information symbols X' extended as the information symbol sequence V, (i) descending symbols Q, as the check symbols Q, and (ii) exclusive OR of all elements of an element sequence $P_w$ to be obtained, as the parity p, when the elements of the check symbols Q are calculated by calculating exclusive OR of $2^{m+n-1}$ elements obtained by selecting every other $2^j$ elements (j=0, 1, 2, ..., m+n−1) from the elements $x'_i$ of the extended information symbols $X'=(x_{L-1}, x_{L-2}, ..., x_{L-N/2+1}, 0, x_{L-N/2}, ..., x_{10}, x_9, x_8, x_7, x_6, x_5, x_4, 0, x_3, x_2, x_1, 0, x_0, 0, 0, 0)$ in descending order according to the subscripts i (i=0, 1, 2, ..., $2^{m+n}-1$) of the elements $x'_i$; and a step of generating a code word $Y=(x_{L-1}, x_{L-2}, ..., x_{L-N/2+1}, q_{h-1}, x_{L-N/2}, ..., x_{10}, x_9, x_8, x_7, x_6, x_5, x_4, q_3, x_3, x_2, x_1, q_2, x_0, q_1, q_0, p)$ as data by replacing the elements $x'_i$ (i=0, $2^0$, $2^1$, ..., $2^{h-1}$) of the extended information symbols X' to which 0 is assigned with the parity p and $q_k$ (k=0, 1, 2, ..., h−1) in ascending order according to the subscripts i of the elements $x'_i$.

The error-correcting code processing method for use in transmitting, as data, information symbols $X=(x_0, x_1, ..., x_{L-1}, x_{L-2})$ having a length of $L=2^h-h-1$ (h is an integer greater than or equal to 2), the method further including, when a code length of a code word Y is $N=2^h$, check symbols are $PP=(pp_{h-1}, pp_{h-2}, ..., pp_1, pp_0)$ and a parity p, and extended information symbols $X'=(0, 0, 0, x_0, x_1, x_2, x_3, 0, x_4, x_5, x_6, x_7, x_8, x_9, x_{10}, ..., x_{L-N/2}, 0, x_{L-N/2+1}, ..., x_{L-2}, x_{L-1})$ have a length of N and are obtained by extending the information symbols X by assigning 0 to, among elements $x'_i$ of the extended information symbols X', elements $x'_i$ whose subscripts i are $0, 2^0, 2^1, ..., 2^{h-1}$ and arranging, from the left, the elements of the information symbols X as the remaining elements $x'_i$ in ascending order according to the subscripts i: the following steps performed when the code word Y has the code length less than or equal to one word: calculating exclusive OR of $2^{h-1}$ elements obtained by selecting every other $2^j$ elements (j=0, 1, 2, ..., h−1) from elements $x'_i$ of the extended information symbols X' in descending order according to subscripts i of the elements $x'_i$, (i=0, 1, 2, ..., $2^h-1$) to generate elements $pp_j$ of the check symbols PP as check symbol data; and calculating exclusive OR of all the calculated $pp_j$ and all the elements $x_i$ of the information symbols X to generate the parity p as data; and the following step performed when the code length of the code word Y is M words ($M=2^m$, a bit length of one word is $Lw=2^n$, m is an integer greater than or equal to 1 and h=m+n): generating, using the extended information symbols X' as the information symbol sequence V, (i) ascending symbols PP, as the check symbols PP, and (ii) exclusive OR of all elements of an element sequence $P_w$ to be obtained, as the parity p, when exclusive OR of $2^{m+n-1}$ elements obtained by selecting every other $2^j$ elements (j=0, 1, 2, ..., m+n−1) from the elements $x'_i$ of the information symbols $X'=(0, 0, 0, x_0, 0, x_1, x_2, x_3, 0, x_4, x_5, x_6, x_7, x_8, x_9, x_{L-N/2}, 0, x_{L-N/2+1}, ..., x_{L-2}, x_{L-1})$ in descending order according to the subscripts i of the elements $x'_i$ (i=0, 1, 2, ..., $2^{m+n}-1$); and a step of generating a code word $Y=(p, pp_0, pp_1, x_0, pp_2, x_1, x_2, x_3, pp_3, x_4, x_5, x_6, x_7, x_8, x_9, x_{L-N/2}, pp_{h-1}, x_{L-N/2+1}, ..., x_{L-2}, x_{L-1})$ as data by replacing the elements $x'_i$ (i=0, $2^0$, $2^1$, ..., $2^{h-1}$) of the extended information symbols X' to which 0 is assigned with the parity p and $pp_k$ (k=0, 1, 2, ..., h−1) in ascending order according to the subscripts i of the elements $x'_i$.

With this, the coding in the error-correcting code processing can be performed in the super Hamming coding scheme.

The error-correcting code processing method for decoding a code word $Y'=(y'_{N-1}, y'_{N-2}, \ldots, y'_1, y'_0)$ that is data obtained by receiving the code word Y transmitted as data, the method further including: the following steps performed when the code word Y' has a code length less than or equal to one word: calculating exclusive OR of $2^{h-1}$ elements obtained by selecting every other $2^j$ elements (j=0, 1, 2, ..., h−1) from elements $y'_i$ (i=0, 1, 2, ..., N−1) of the received code word Y' in descending order according to the subscripts of the elements $y'_i$, to generate elements $s_j$ of a syndrome $S=(s_{h-1}, s_{h-2}, \ldots, s_1, s_0, r)$; calculating exclusive OR of all the elements $y'_i$ of the code word Y' to generate, as data, an element r of the syndrome S; determining, based on the syndrome, presence or absence, and a type, of an error; correcting, when, in the case of r=1, it is determined that a single error is present, the code word Y' by inverting a value of one of the elements $y'_i$, which is at a location identified by $(s_{h-1}, s_{h-2}, \ldots, s_i, s_0)$, of the code word Y'; and extracting, from the corrected code word Y', information symbols $Z=(z_{L-1}, z_{L-2}, \ldots, z_1, z_0)$, and outputting the information symbols Z as data after error correction; and the following steps performed in the case where the code word Y has a length of M words: generating, using the code word Y' as the information symbol sequence V, (i) elements of descending symbols Q, as elements $s_j$ (j=0, 1, 2, ..., M+n−1) of a syndrome $S=(s_{m+n-1}, s_{m+n-2}, \ldots, s_n, s_{n-1}, \ldots, s_1, s_0, r)$ and (ii) exclusive OR of all elements of an element sequence $P_w$ to be obtained, as the element r of the syndrome S, when exclusive OR of $2^{n-1}$ elements obtained by selecting every other $2^j$ elements (j=0, 1, 2, ..., n−1) from the elements $y'_i$ (i=0, 1, 2, ..., N−1) of the received code word Y' in descending order according to the subscripts i of the elements $y'_i$; determining, based on the syndrome, presence or absence, and a type, of an error; correcting, when, in the case of r=1, it is determined that a single error is present, the code word Y' by inverting a value of one of the elements $y'_i$, which is at a location identified by a word number corresponding to a high-order m bit $S_H=(s_{m+n-1}, s_{m+n-2}, \ldots, s_n)$ of the syndrome S and a bit location, in a word, corresponding to low-order n bits $S_L=(s_{n-1}, \ldots, s_1, s_0)$ of the syndrome S except a bit location of the element r; and extracting, from the corrected code word Y', information symbols $Z=(z_{L-1}, z_{L-2}, \ldots, z_1, z_0)$, and outputting the information symbols Z as data after error correction.

The error-correcting code processing method for decoding a code word $Y'=(y'_0, y'_1, \ldots, y'_{N-2}, y'_{N-1})$ that is data obtained by receiving the code word Y transmitted as data, the method further including: the following steps performed when the code word Y' has a code length less than or equal to one word: calculating exclusive OR of $2^{h-1}$ elements obtained by selecting every other $2^j$ elements (j=0, 1, 2, ..., h−1) from elements $y'_i$ (i=0, 1, 2, ..., N−1) of the received code word Y' in descending order of subscripts i of the elements $y'_i$, to generate elements $s_j$ (j=0, 1, 2, ..., h−1) of a syndrome $S=(s_{h-1}, s_{h-2}, \ldots, s_1, s_0, r)$; calculating exclusive OR of all the elements $y'_i$ of the code word Y' to generate, as data, the element r of the syndrome S; determining, based on the syndrome, presence or absence, and a type, of an error; correcting, when, in the case of r=1, it is determined a single error is present, the code word Y' by inverting a value of one of the elements $y'_i$, which is at a location identified by $(s_{h-1}, s_{h-2}, \ldots, s_i, s_0)$, of the code word Y'; and extracting, from the corrected code word Y', information symbols $Z=(z_0, z_1, \ldots, z_{L-2}, z_{L-1})$, and outputting the information symbols Z as data after error correction; and the following steps performed when the code word has a length of M words: generating, using the code word as the information symbol sequence V, (i) elements of descending symbols Q that are obtained by using the method according to claim 1, as elements $s_j$ (j=0, 1, 2, ..., n−1) of a syndrome $S=(s_{m+n-1}, s_{m+n-2}, \ldots, s_n, s_{n-1}, \ldots, s_1, s_0, r)$ and (ii) exclusive OR of all elements of an element sequence $P_w$ to be obtained, as the element r of the syndrome S, when exclusive OR of $2^{n-1}$ elements obtained by selecting every other $2^j$ elements (j=0, 1, 2, ..., n−1) from the elements $y'_i$ (i=0, 1, 2, ..., N−1) of the received code word in descending order according to the subscripts i of the elements $y'_i$; determining, based on the syndrome, presence or absence, and a type, of an error; correcting, when, in the case of r=1, it is determined that a single error is present, the code word by inverting a value of one of the elements $y'_i$, which is at a location identified by a word number corresponding to a high-order m bit $S_H=(s_{m+n-1}, s_{m+n-2}, \ldots, s_n)$ of the syndrome S and a bit location, in a word, corresponding to low-order n bits $S_L=(s_{n-1}, \ldots, s_1, s_0)$ of the syndrome S except a bit location of the element r; and extracting, from the corrected code word Y', information symbols $Z=(z_0, z_1, \ldots, z_{L-2}, z_{L-1})$, and outputting the information symbols Z as data after error correction.

With this, the decoding in the error-correcting code processing can be performed in the super Hamming coding scheme.

In order to achieve the above object, an error-correcting code processing device according to another aspect of the present invention is an error-correcting code processing device including: a processor; an instruction memory that stores, as instructions issued when the method is performed, (i) a dedicated instruction for relocating information symbols based on a regularity of locations of elements of check symbols in a code word so that the code word is generated from the information symbols, (ii) a dedicated instruction for extracting information symbols from a decoded code word, (iii) a dedicated instruction for performing, in one cycle, a calculation of check symbols and a syndrome for a code word having a length less than or equal to one word, (iv) a dedicated instruction for performing, in one cycle, detection and correction of an error in a code word having a length less than or equal to one word, (v) an auxiliary instruction for efficiently performing a calculation of check symbols and a syndrome for respective symbol sequences each having a length greater than or equal to two words, based on regularity for which exclusive OR of the symbol sequences is calculated, and (vi) an auxiliary instruction for efficiently performing detection and correction of an error in a code word having a length greater than or equal to two words; a dedicated operation circuit that calculates a check matrix and a syndrome or error correction when the processor issues instructions including the dedicated instructions and the auxiliary instructions of the instruction memory, and outputs data resulting from the calculation; a data memory that stores data to be transmitted, received data, and the data resulting from the calculation; and a data bus for data transfer among the processor, the dedicated operation circuit, and the data memory.

Moreover, the dedicated operation circuit includes: a check matrix and syndrome operation circuit that calculates the check matrix and the syndrome, and outputs data resulting from the calculation; and an error correction circuit that calculates the error correction, and outputs data resulting from the calculation.

With this, the error-correcting code processing in the super Hamming coding scheme can be implemented in the device.

The error-correcting code processing method for use in transmitting, as data, information symbols $X=(x_{L-1}, x_{L-2}, \ldots, x_1, x_0)$ having a length of $L=2^{m+n}$ (m is an integer greater than or equal to 1 and n is an integer greater than or equal to 2), the method further including, when a code length of a code word Y is $N=2^{m+n}+2(m+n)$, check symbols are $Q=(q_{m+n-1}, q_{m+n-2}, \ldots, q_1, q_0)$, check symbols are $PP=(pp_{m+n-1}, pp_{m+n-2}, \ldots, pp_1, pp_0)$, and the information symbols X have a length of M words ($M=2^m$ and a bit length of one word is $Lw=2^n$), generating, using the information symbols X as the information symbol sequence V, (i) the descending symbols Q, as the check symbols Q, and (ii) the ascending symbols PP obtained by using the method, as the check symbols PP.

With this, the coding in the error-correcting code processing can be performed in the high-dimensional parity coding scheme.

The error-correcting code processing method for decoding a code word $Y'=(y'_0, y'_1, \ldots, y'_{N-2}, y'_{N-1})$ that is data obtained by receiving the code word Y transmitted as data, the method further including, when received information symbols are $X'=(x'_{L-1}, x'_{L-2}, \ldots, x'_1, x'_0)$ and received check symbols corresponding to transmitted check symbols Q and PP are $Q'=(q'_{m+n-1}, q'_{m+n-2}, \ldots, q'_1, q'_0)$ and $PP'=(pp'_{m+n-1}, pp_{m+n-2}, \ldots, pp_1, pp_0)$, the information symbols and the check symbols being included in the code word Y': generating, using the information symbols X' received as the information symbol sequence V, (i) the descending symbols Q obtained by using the method according to Claim 1, as check symbols $SQ=(sq_{m+n-1}, sq_{m+n-2}, \ldots, sq_1, sq_0)$, and (ii) the ascending symbols PP, as check symbols $SPP=(spp_{m+n-1}, spp_{m+n-2}, \ldots, spp_1, spp_0)$; calculating, for each element, exclusive OR of the received check symbols Q' and the generated check symbols SQ to generate a syndrome SSQ $(ssq_{m+n-1}, ssq_{m+n-2}, \ldots, ssq_1, ssq_0)$, and calculating, for each element, exclusive OR of the received check symbols PP' and the generated check symbols SPP to generate a syndrome $SSP=(ssp_{m+n-1}, ssp_{m+n-2}, ssp_1, ssp_0)$; determining, based on the syndromes SSQ and SSP, presence or absence, and a type, of an error; and correcting the information symbols X' by inverting a value of an element in a word of the information symbols X', when, in the case where at least 1 bit of the elements of the syndromes SSQ and SSP is 1, it is determined that the error is present, and when, in the case where at least 1 bit of the elements of the syndromes SSQ and SSP is 1 and all bits resulting from exclusive OR of the SSQ and SSP calculated for each element are 1, it is determined that a single error is present in the information symbols X', the word being at a location identified by $SSQ_H$ that is a high-order m bit of the syndrome SSQ, and the element being at a location, in the word, identified by $SSQ_L$ that is low-order n bits of the syndrome SSQ.

With this, the decoding in the error-correcting code processing can be performed in the high-dimensional parity coding scheme.

The present invention may be realized as a CRC coding method for calculating, as check symbols, coefficients of a remainder polynomial through a first operation, generating a code word by combining the check symbols and information symbols, and transmitting the code word as data, the first operation being calculating a remainder by dividing, by a generator polynomial, a shift information symbol polynomial obtained by multiplying, by $x^k$ (k is a degree of the generator polynomial), an information symbol polynomial obtained by expressing the information symbols in a polynomial having x as a variable (modulo 2), the method including: generating, by multiplying only a matrix G by a matrix G a predetermined number of times in advance, a submatrix that represents a sub operation unit of the first operation after a second operation is repeated the predetermined number of times, the second operation being (i) deleting in stages each of terms from a highest degree of the variable x of the shift information symbol polynomial in the first operation by multiplying the generator polynomial by a power of the variable x and subtracting the product from each term and (ii) represented by a product of a vector obtained by arranging coefficients of the shift information symbol polynomial and a corresponding matrix G and a product of a vector obtained by arranging remainder coefficients of the shift information symbol polynomial still in one of the stages of the deletion and a corresponding matrix G; and generating the check symbols by sequentially performing an operation starting from calculating, as a remainder vector still in one of the stages, a product of a vector of the shift information symbol polynomial and the submatrix, to calculating, as a next remainder vector still in one of the stages, a product of the remainder vector still in the stage and the submatrix for each of the predetermined number of times.

The CRC coding method for generating a code word and transmitting the code word as data, wherein when the number of bits of one word is a natural number multiple m of a bit length k of the check symbols, and the data has a length of M words, in the generating of a submatrix, the submatrix includes m product matrices $G^{mk}, G^{(m-1)k}, G^{(m-2)k}, \ldots, G^k$ with the predetermined number of times being mk, (m−1)k, ..., k each of which is a multiple of k, and when, in the generating of the check symbols, dividing the vector of the shift information symbol polynomial into words and sequentially performing a collective operation for each of the words, instead of sequentially performing the operation starting from calculating the vector of the shift information symbol polynomial, to calculating the remainder vector still in the stage for each of the predetermined number of times, the one word is divided into vectors each having a bit width k and including k elements, and exclusive OR of elements of (i) a vector and elements of (ii) a vector resulting from multiplying each of (m−1) vectors by a corresponding one of the matrices $G^{(m-1)k}, G^{(m-2)k}, \ldots, G^k$ is calculated as the collective operation for each word, (i) the vector being obtained by calculating exclusive OR of elements of a vector resulting from multiplying, among the vectors, a first vector by the product matrix $G^{mk}$ and elements of a vector resulting from the collective operation performed for a word previous to the word, and the (m−1) vectors each being subsequent to the first vector including the k elements and including the k elements.

With this, the coding in the error-correcting code processing can be performed in the CRC coding scheme.

Moreover, the present invention may be realized as a CRC decoding method for decoding a received code word that is data obtained by receiving the code word transmitted as data, the CRC decoding method including: generating a syndrome by sequentially performing, in a fourth operation that is deleting in stages each of terms from a highest order of a variable x of a received code word polynomial in a third operation by multiplying the generator polynomial by a power of the variable x and subtracting the product from each term, an operation starting from calculating, as a remainder vector still in one of the stages, a product of a vector of the received code word polynomial and the submatrix, to calculating, as a next remainder vector still in one of the stages, a product of the submatrix and a remainder vector still in the stage for each of a predetermined number of times, when coefficients of a remainder polynomial are generated as the syndrome, the received code word polynomial being obtained by expressing the received code word in a polynomial, and the third operation being calculating a remainder by dividing the received code word polynomial by the generator polynomial; calculating in advance an inverse matrix of the submatrix; determining, based on the syndrome, presence or absence, and a type, of an error; correcting the received code word by inverting a value of a bit of the received code word which is identified by a bit location where the bit is 1 in the syndrome, when, in the case where a total number of bits being 1 in the syndrome is one, it is determined that a single error is present in a bit width of check symbols from a low order of the received code word; and correcting the received code word by inverting a value of a bit identified by a bit location where the bit is 1 in a bit width at a t+1-th (t is an integer greater than or equal to 1) position from a low order of the received code word in a syndrome resulting from t-th repetition of multiplying the syndrome by the inverse matrix, when, in the case where a total number of bits being 1 in the syndrome is two or more and a total number of bits being 1 in the resultant syndrome is one, it is determined that a single error is present in a bit width at the t+1-th position from the low order of the received cord word with a bit width of the check symbols being a unit width.

The CRC decoding method for decoding a received code word that is data obtained by receiving the code word transmitted as data, wherein when the number of bits of one word is a natural number multiple m of a bit length k of the check symbols, and the data has a length of M words, in the generating, the submatrix includes m product matrices $G^{mk}$, $G^{(m-1)k}$, $G^{(m-2)k}$, ..., $G^k$ with the predetermined number of times being mk, (m−1)k, ..., k each of which is a multiple of k, when, in the generating of a syndrome, dividing the vector of the received code word polynomial on a word basis and performing a collective operation for each of the words, instead of sequentially performing the operation starting from calculating the vector of the shift information symbol polynomial, to calculating the remainder vector still in the stage for each of the predetermined number of times in the generating of the check symbols, the one word is divided into vectors each having a bit width k and including k elements, and exclusive OR of elements of (i) a vector and elements of (ii) a vector resulting from multiplying each of (m−1) vectors by a corresponding one of the matrices $G^{(m-1)k}$, $G^{(m-2)k}$, ..., $G^k$ is calculated as the collective operation for each word, (i) the vector being obtained by calculating exclusive OR of elements of a vector resulting from multiplying, among the vectors, a first vector by the product matrix $G^{mk}$ and elements of a vector resulting from the collective operation performed for a word previous to the word, and the (m−1) vectors each being subsequent to the vector including the k elements and including the k elements, and the inverse matrix is an inverse matrix $G^{-k}$ of $G^k$.

With this, the decoding in the error-correcting code processing can be applied in the CRC coding scheme.

In order to achieve the above object, an error-correcting code processing device according to another aspect of the present invention is an error-correcting code processing device that performs the above method, the device including: a processor; an instruction memory that stores, as instructions issued when the method is performed, (i) an instruction for collectively performing, for each word, an operation for calculating the check symbols or the syndrome in one of the generating of a syndrome and the generating of the check symbols, and (ii) an instruction for performing error correction in the code word; a dedicated operation circuit that calculates a check matrix and a syndrome or error correction when the processor issues the instructions of the instruction memory, and outputs data resulting from the calculation; a data memory that stores data to be transmitted, received data, and the data resulting from the calculation; and a data bus for data transfer among the processor, the dedicated operation circuit, and the data memory.

Moreover, the dedicated operation circuit includes: a check matrix and syndrome operation circuit that calculates the check matrix and the syndrome, and outputs data resulting from the calculation; and an error correction circuit that calculates the error correction, and outputs data resulting from the calculation.

Furthermore, the data memory includes an area for table lookup that holds a look-up table for error location calculation.

Moreover, the dedicated operation circuit includes reconfigurable hardware.

With this, the error-correcting code processing in the CRC coding scheme can be implemented in the device.

The present invention may be realized as a method of adjusting a code word length and a generator polynomial, the method including: receiving a code word transmitted from a transmission system, and counting the code word; counting a bit error when a correctable error is detected; increasing an error correction level when an error bit rate exceeds an upper limit of the bit error rate, setting an upper limit of the error correction level to the error correction level when the error correction level exceeds the upper limit of the error correction level, and sending the error correction level to the transmission system, the error bit rate being a quotient of the number of the bit errors and the number of the code words; and decreasing the error correction level when the number of the code words exceeds a minimum number of receptions necessary for changing the error correction level and the bit error rate is less than a lower limit of the bit error rate, setting a lower limit of the error correction level to the error correction level when the error correction level is less than the lower limit of the error correction level, and sending the error correction level to the transmission system.

With this, it is possible to adaptively change the code length according to the bit error rate, thereby reducing the power consumption necessary for communication.

Advantageous Effects of Invention

The present invention provides an error-correcting code processing method and an error-correcting code processing device that easily identify a location where an error has occurred, flexibly respond to a change of specifications or a change in a transmission path error rate of a transmission path, and consume less power.

BRIEF DESCRIPTION OF DRAWINGS

FIG. 4 is a diagram showing an exemplary check matrix in the conventional Hamming coding scheme.

FIG. 5 is a diagram showing an exemplary generator matrix in the conventional Hamming coding scheme.

Figure 6:
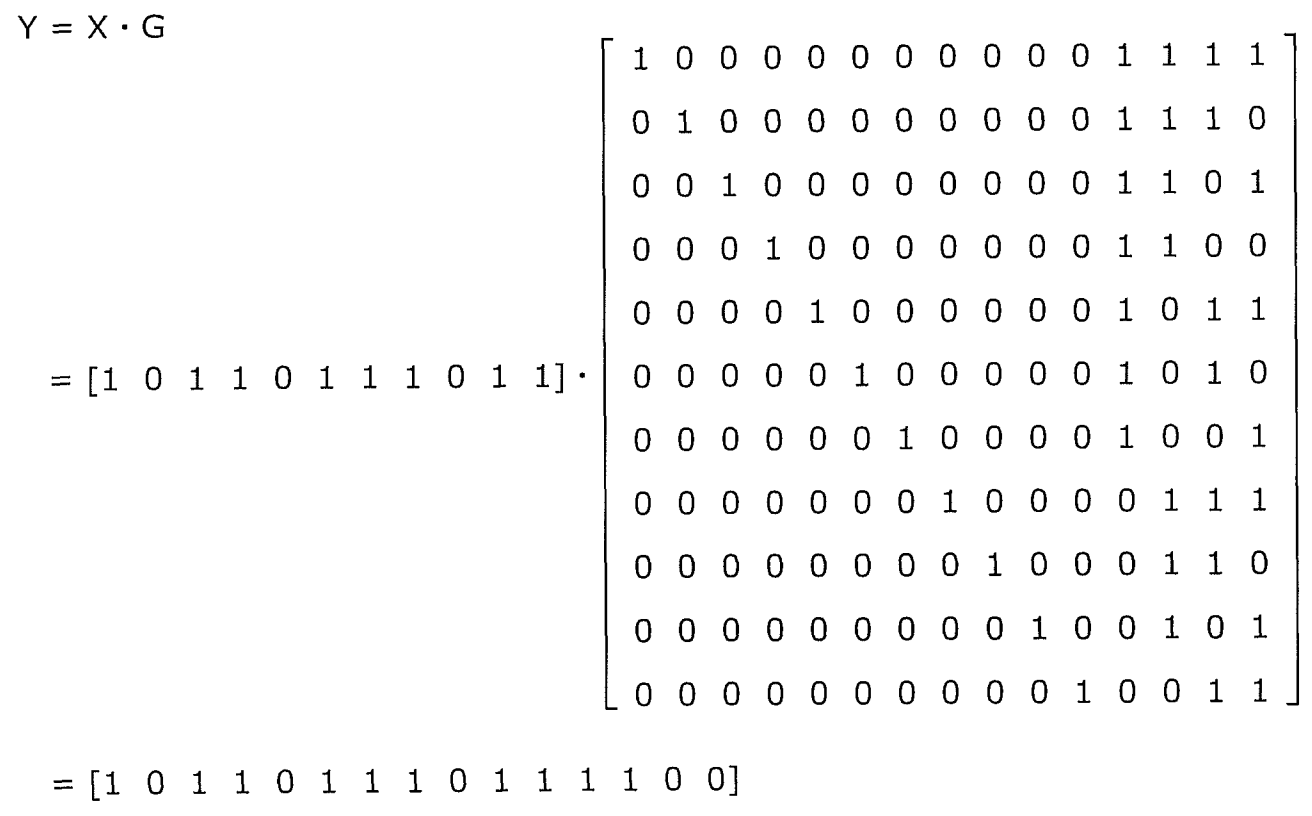

FIG. 6 is a diagram showing exemplary calculation of a code word in the conventional Hamming coding scheme.

FIG. 7 is a diagram showing an exemplary method of identifying a location where a single error occurs in the conventional Hamming coding scheme.

FIG. 8 is a diagram showing an exemplary check matrix in a conventional extended Hamming coding scheme.

FIG. 9 is a diagram showing an exemplary method of identifying a location where a single error occurs in the conventional extended Hamming coding scheme.

FIG. 12 is a diagram showing an exemplary correspondence table between syndrome and location of bit error in the conventional extended Hamming coding scheme.

FIG. 13 is a diagram showing an exemplary check matrix in a super Hamming coding scheme according to the present invention.

FIG. 14 is a diagram showing computation expressions for check symbols and a parity in the super Hamming coding scheme according to the present invention.

FIG. 16 is a diagram showing exemplary computation expressions for check symbols in the super Hamming coding scheme according to the present invention.

FIG. 17 is a diagram showing a procedure for deriving a generator matrix (1) in the super Hamming coding scheme according to the present invention.

FIG. 18 is a diagram showing a procedure for deriving a generator matrix (2) in the super Hamming coding scheme according to the present invention.

FIG. 19 is a diagram showing a procedure for deriving a generator matrix (3) in the super Hamming coding scheme according to the present invention.

FIG. 20 is a diagram showing an exemplary calculation pattern for a check matrix in the conventional extended Hamming coding scheme.

FIG. 21 is a diagram showing an exemplary calculation pattern for check symbols in the super Hamming coding scheme according to the present invention.

FIG. 40 is a diagram showing exemplary computation expressions for check symbols and a syndrome in the super Hamming coding scheme according to the present invention.

FIG. 41 is a diagram showing an exemplary calculation pattern for check symbols and a syndrome in the super Hamming coding scheme according to the present invention.

FIG. 43 is a diagram showing computation expressions for check symbols corresponding to information symbols including words in the super Hamming coding scheme according to the present invention.

FIG. 45 is a diagram showing exemplary computation expressions for a syndrome of a code word including words in the super Hamming coding scheme according to the present invention.

FIG. 47 is a diagram showing exemplary computation expressions for check symbols and a syndrome in a high-dimensional parity coding scheme according to the present invention.

FIG. 48 is a diagram showing an exemplary calculation pattern for check symbols and a syndrome in a high-dimensional parity coding scheme according to the present invention.

FIG. 51 is a diagram showing a matrix G representing a generator polynomial $x^8+x^2+x+1$ according to the present invention.

FIG. 52 is a diagram showing a matrix representing $G^8$ according to the present invention.

FIG. 53 is a diagram showing a matrix representing $G^{16}$ according to the present invention.

FIG. 55 is a diagram showing an exemplary $(G^8)^T$ table in FIG. 51 and according to the present invention.

DESCRIPTION OF EMBODIMENTS

Figure 1:
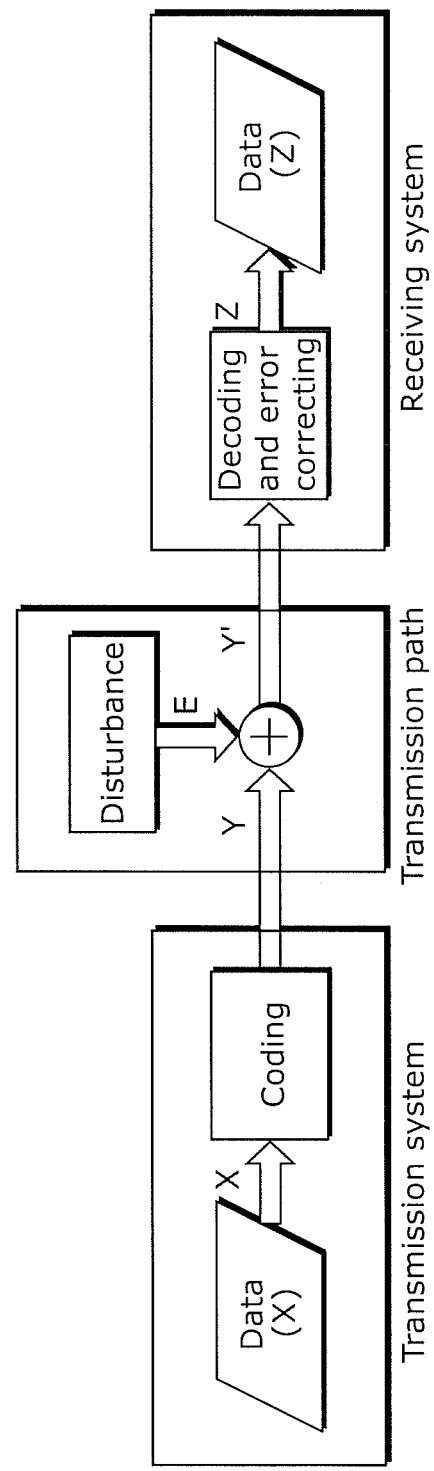
FIG. 1 is a diagram illustrating a procedure for information transmission involving error correction.

The following describes embodiments of the present invention.

A widely used error-correcting system based on the extended Hamming coding scheme using systematic codes has problems with an increase in speed and power saving. The inventors of the present invention have noticed that the problems are caused by employing systematic codes that make it easy to calculate a generator matrix from a check matrix. In view of ease of check, it is necessary to plan how rows of a check matrix are arranged so as to easily identify an error location from a syndrome. To do so, for instance, the rows of the check matrix may be arranged monotonously in descending order. However, such arrangement does not allow the check matrix to maintain a form indicated by Equation 4, and thus it is not easy to calculate, from a check matrix obtained for any n, a generator matrix that satisfies the condition of Equation 3. In addition, it is necessary to try again to calculate a generator matrix each time a code length is changed.

The extended Hamming coding scheme is improved so that it is possible to easily determine a generator matrix and efficiently perform execution according to a dedicated instruction. The improved coding scheme is referred to as a super Hamming coding scheme. A check matrix used in the super Hamming coding scheme has monotonicity between columns, and makes it very easy to identify, from a syndrome, a location where a bit error has occurred. Thus, it is possible to increase the speed of error correction, and also reduce power consumption. FIG. 13 shows an exemplary check matrix in a super Humming coding scheme when n=4. The following describes coding and decoding methods in the super Hamming coding scheme. Hereafter, a code length is represented by $N=2^n$, and a length of information symbols is represented by $L=2^n-n-1$. A length of check symbols is represented by n+1. Information symbols X to be transmitted are represented by Equation 7.

[Math. 7]

$$X=[x_{L-1}, x_{L-2}, \ldots, x_1, x_0] \quad \text{(Equation 7)}$$

A code word Y is generated from the information symbols X in the following manner. First, the information symbols X are extended as shown by Equation 8, and transformed into a code word X'.

[Math. 8]

$$X'=[x'_{n-1}, x'_{n-2}, \ldots, x'_1, x'_0] \quad \text{(Equation 8)}$$

A correspondence relationship between X and X' is as follows. First, elements of X are divided, from the right (in order of increasing subscript value), into n−1 groups including a group of 1 element, a group of 3 elements, a group of 7 elements, . . . , and a group of $2^{n-1}-1$ elements. Each of the groups is represented by $x_i$ (i=0, . . . , n−2). Each $X_i$ (i=0, . . . , n−2) is expressed as Equation 9.

[Math. 9]

$$\begin{aligned} X_0 &= [x_0] \\ X_1 &= [x_3, x_2, x_1] \\ X_2 &= [x_{10}, x_9, x_8, x_7, x_6, x_5, x_4] \\ &\vdots \\ X_{n-2} &= [x_{L-1}, x_{L-2}, \ldots, x_{L-N/2+1}] \end{aligned} \quad \text{(Equation 9)}$$

Next, X' is obtained by adding 0 to the right side of each $X_i$ (i=0, . . . , n−2) and further adding two 0s to the end of the same. X' is expressed by Equation 10. At this stage, check symbols are not added.

[Math. 10]

$$\begin{aligned} X' &= [x'_{N-1}, x'_{N-2}, \ldots, x'_1, x'_0] \\ &= [x_{L-1}, x_{L-2}, \ldots, x_{L-N/2+1}, 0, x_{L-N/2}, \ldots, \\ & \quad x_{11}, x_9, x_8, x_7, x_6, x_5, x_4, 0, x_3, x_2, x_1, 0, x_0, 0, 0, 0] \end{aligned} \quad \text{(Equation 10)}$$

Here, positions (indexes of the elements) where 0 is added are in order of 0, $2^0$, $2^1$, . . . , $2^{n-1}$ from the right. Moreover, since $L=2^n-n-1$, the number of the elements of X' is $N=L+n+1=2^n$.

Next, check symbols $Q=[q_{n-1}, q_{n-2}, \ldots, q_0]$ of X' and a parity p of the whole code word are calculated using equations shown by FIG. 14.

Coding is performed by substituting check symbols $q_i$ (i=0, 1, . . . , n−1) for $x'_i$ (i=$2^0$, $2^1$, . . . , $2^{n-1}$), an element obtained by plugging 0 in the vector X' in Equation 10. The code word Y is obtained by substituting $x_0$ (rightmost 0) for exclusive OR of all bits of X' thus calculated (parity) p. The code word Y is expressed by Equation 11.

[Math. 11]

$$Y=[x_{L-1}, x_{L-2}, \ldots, x_{L-N/2-1}, q_{n-1}, \ldots, x_3, x_2, x_1, q_2, x_0, q_1, q_0, p]$$ (Equation 11)

Figure 15:
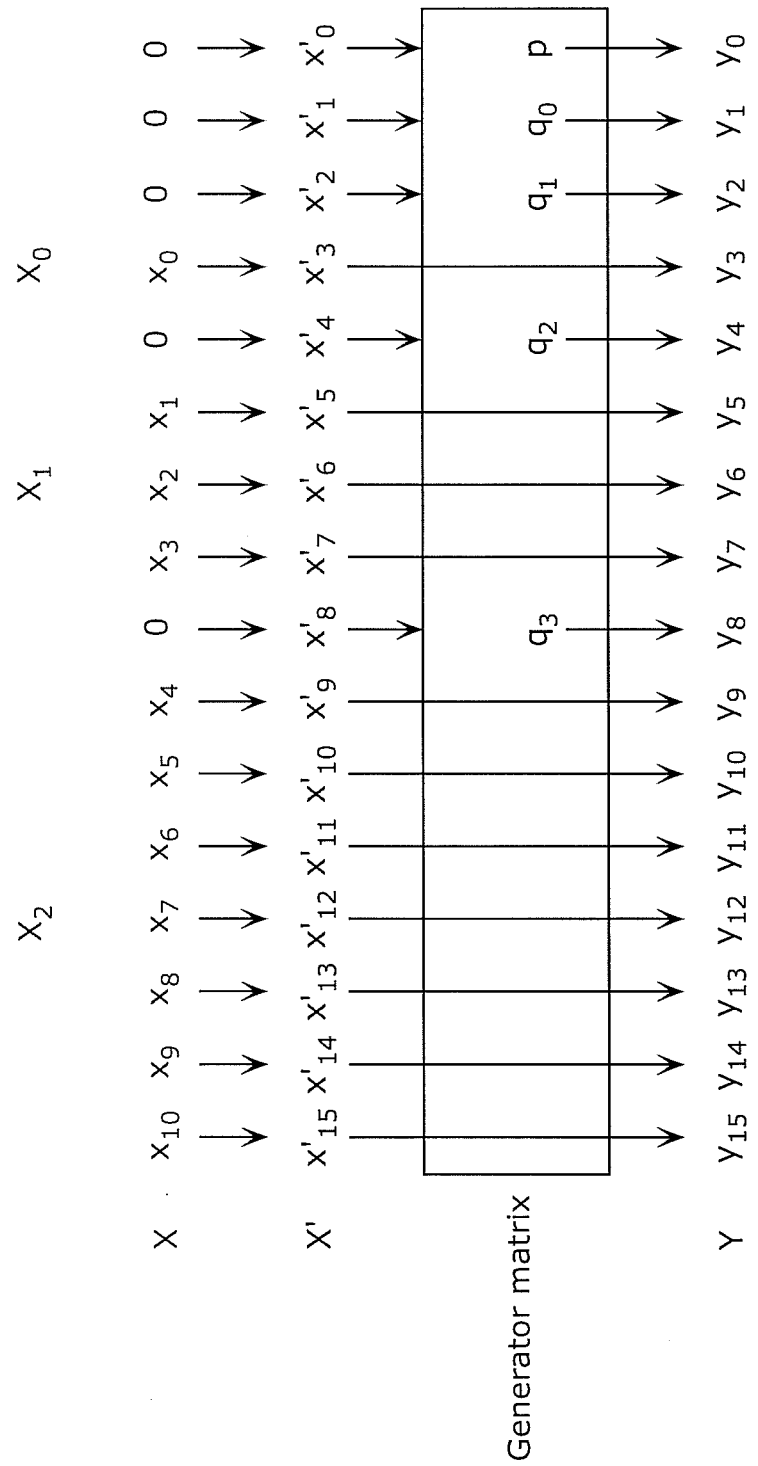
FIG. 15 is a diagram showing an exemplary correspondence relationship between information matrix and code word in the super Hamming coding scheme according to the present invention.

FIG. 15 shows a correspondence relationship between the information symbols X and the code word Y. FIG. 16 shows exemplary computation expressions for check symbols and a parity when n=4.

Figure 2:
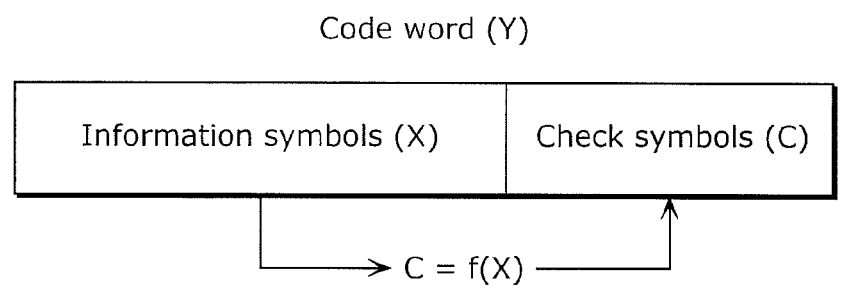
FIG. 2 is a diagram illustrating a procedure for coding.
Figure 3:
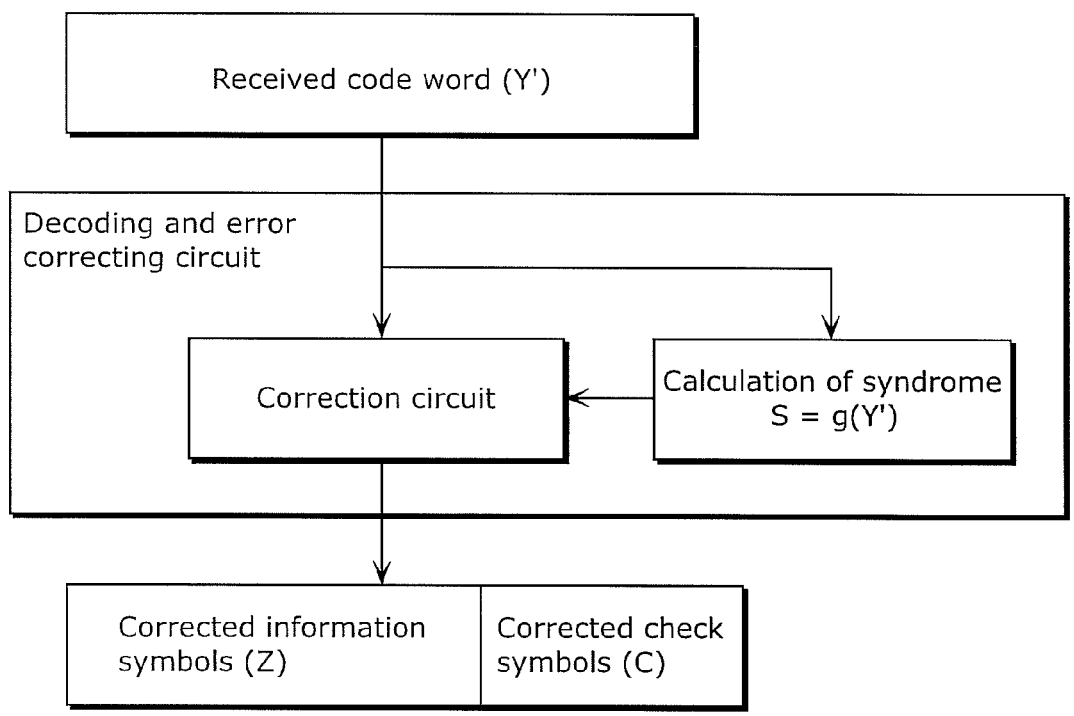
FIG. 3 is a diagram illustrating a procedure for decoding and error-correcting.

In the conventional method such as the Hamming coding scheme and the extended Hamming coding scheme, when a code word is formed, an information symbol block and a check symbol block are separately arranged as shown by FIG. 2. For instance, in the case of the extended Hamming coding scheme, when check symbols of information symbols X= $[x_{L-1}, x_{L-2}, \ldots, x_0]$ is Q=$[q_{n-1}, q_{n-2}, \ldots, q_0]$, a code word Y is expressed as shown by Equation 12.

[Math. 12]

$$Y=[x_{L-1}, x_{L-2}, \ldots, x_0, q_{n-1}, q_{n-2}, \ldots, q_0, p]$$ (Equation 12)

Although, when a code word is generated or is decoded to extract information symbols, this expression makes easy the generation or the extraction, as stated above, the expression does not make it easy to identify a bit location where a single error has occurred.

In the present invention, check symbols are placed at an index position of $2^i$ of a code word. This is one of features of the present invention, and makes it possible to easily identify, from a value of a syndrome, a position where an error has occurred.

The above coding is equivalent to coding using a generator matrix $G^{(3)}$ obtained through the following (Step 1) to (Step 3).

(Step 1) A $2^n \times (2^n-1)$ generator matrix $G^{(1)}$ that is extended is expressed as shown by Equation 13.

[Math. 13]

$$G^{(1)} = \begin{bmatrix} I_m \\ 0 \end{bmatrix} H^T$$ (Equation 13)

Here, $I_m$ represents the m×m identity matrix shown by Equation 5, and $H^T$ represents a transposed matrix of the check matrix shown by Equation 4. FIG. 17 shows an exemplary generator matrix $G^{(1)}$ when n=4.

(Step 2) Rows of the generator matrix $G^{(1)}$ are exchanged in the following manner. The rows of the whole generator matrix $G^{(1)}$ are exchanged so that the rows are arranged in descending order from the top to the bottom when a row vector of a submatrix corresponding to $H^T$ of the generator matrix $G^{(1)}$ is considered as a binary number. A generator matrix thus generated is $G^{(2)}$. FIG. 18 shows an exemplary generator matrix $G^{(2)}$ when n=4.

(Step 3) Columns of the generator matrix $G^{(2)}$ are transposed so that diagonal elements are 1. A generator matrix on which this operation is performed is $G^{(3)}$. FIG. 19 shows an exemplary generator matrix $G^{(3)}$ when n=4.

Information symbols included in a code word coded using the generator matrix $G^{(3)}$ are the same as a calculation result obtained using Equation 5, because the calculation is performed using an identity matrix. Moreover, check symbols are the same as check symbols calculated using Equation 5, because 0 is plugged into part of a transposed identity matrix of the check matrix. The coding using the generator matrix $G^{(3)}$ results in a symbol sequence in which elements of the code word calculated using Equation 5 are arranged in reverse order. A procedure for decoding, error detection, and error correction in the super Hamming coding scheme is substantially the same as a procedure in the extended Hamming coding scheme. As is the case in the extended Hamming coding scheme, a received code word Y' is decoded by applying a check matrix to the code word Y', and the presence or absence of a single error and the presence or absence of a double error are checked. When the single error is found, a location of a transmission error is identified using a syndrome. Here, it is possible to identify the location where the transmission error has occurred, without comparing bit patterns or using a complex correspondence table, because the columns of the check matrix are arranged in descending order from the left to the right when each of the columns is considered as a binary number. Thus, the super Hamming coding scheme makes it easier to perform error correction than the extended Hamming coding scheme. Finally, removing the check symbols embedded in the code word makes it possible to obtain corrected data. The super Hamming coding scheme has a single error correction capability and a double error detection capability, and is equivalent to the error correction and error detection capability of the extended Hamming coding scheme.

The following summarizes steps of a coding method and a decoding method in the super Hamming coding scheme.

Figure 21:
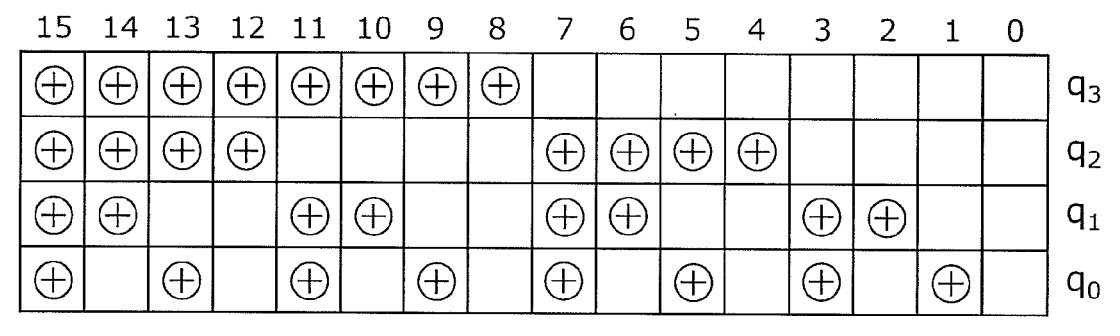

When an information symbol sequence V=$(v_{L-1}, v_{L-2}, \ldots, v_1, v_0)$ having a length of L=$2^{m+n}$ (m is an integer greater than or equal to 1 and n is an integer greater than or equal to 2) is processed as data, a method is common to the coding method and the decoding method, and includes, when the information symbol sequence V has a length of M words (M=$2^m$ and a bit length of one word is $L_w$=$2^n$), an information symbol sequence of an i-th word is $W_i$=$(v_{i, Lw-1}, v_{i, Lw-2}, \ldots, v_{i, 1}, v_{i, 0})$, and the information symbol sequence V is $(W_{M-1}, W_{M-2}, \ldots, W_1, W_0)$ obtained by arranging the M words in descending order, when either descending symbols Q=$(q_{m+n-1}, q_{m+n-2}, \ldots, q_1, q_0)$ or ascending symbols PP=$(pp_{m+n-1}, pp_{m+n-2}, \ldots, pp_1, pp_0)$ or both are calculated, the descending symbols Q being obtained by arranging, in a descending order of j (j=0, 1, 2, …, m+n−1), elements resulting from exclusive OR of $2^{m+n-1}$ elements of the information symbol sequence V which are obtained by selecting every other $2^j$ elements (j=0, 1, 2, …, m+n−1) in descending order according to subscripts of elements $v_i$ of the information symbol sequence V, and the ascending symbols PP being obtained by arranging, in a descending order of j, elements resulting from exclusive OR of $2^{m+n-1}$ elements of the information symbol sequence V which are obtained by selecting every other $2^j$ elements (j=0, 1, 2, …, m+n−1) in ascending order according to the subscripts of the elements $v_i$ of the information symbol sequence V: calculating either descending symbols $Q_{Li}(q_{i, n-1}, q_{i, n-2}, \ldots, q_{i, 1}, q_{i, 0})$ or ascending symbols $PP_{Li}$=$(pp_{i, n-1}, pp_{i, n-2}, \ldots, pp_{i, 1}, pp_{i, 0})$ or both, and calculating, as a parity $p_i$, exclusive OR of all elements of the information symbol sequence $W_i$, the descending symbols $Q_{Li}$ being obtained by arranging, in descending order of k (k=0, 1, 2, …, n−1), elements resulting from exclusive OR of $2^{n-1}$ elements of the information symbol sequence $W_i$ which are obtained by selecting every other $2^k$ elements (k=0, 1, 2, …, n−1) from elements $v_{i,j}$ of the information symbol sequence $W_i$ in descending order according to subscripts j (j=0, 1, 2, …, $2^{n-1}$) of the elements $v_{i,j}$, and the ascending symbols $PP_{Li}$ being obtained by arranging, in descending order of k, elements resulting from exclusive OR of $2^{n-1}$ elements of the information symbol sequence $W_i$ which are obtained by selecting every other $2^k$ elements (k=0, 1, 2, …, n−1) from the elements $v_{i,j}$ of the information symbol sequence $W_i$ in ascending order according to the subscripts j of the elements $v_{i,j}$; one or both of (i) calculating exclusive OR for each subscript $i=1, 2, \ldots, M-1$ for each of the elements of the descending symbols $Q_{Li}$, to generate low-order n bits $Q_L=(q_{n-1}, q_{n-2}, \ldots, q_1, q_0)$ of the descending symbols Q and (ii) calculating exclusive OR for each subscript $i=0, 1, 2, \ldots, M-1$ for each of the elements of the ascending symbols $PP_{Li}$, to generate low-order n bits $PP_L=(pp_{n-1}, pp_{n-2}, \ldots, pp_1, pp_0)$ of the ascending symbols PP; one or both of (i) calculating exclusive OR of $2^{m-1}$ elements obtained by selecting every other $2^k$ elements ($k=0, 1, 2, \ldots, m-1$) from elements $p_i$ of an element sequence $P_w=(p_{M-1}, p_{M-2}, \ldots, p_1, p_0)$ in descending order according to subscripts i of the elements $p_i$, to generate a high-order m bit $Q_H=(q_{m+n-1}, q_{m+n-2}, \ldots, q_{n+1}, q_n)$ of the descending symbols Q and (ii) calculating exclusive OR of $2^{m-1}$ elements obtained by selecting every other $2^k$ elements ($k=0, 1, 2, \ldots, m-1$) from the elements $p_i$ in ascending order according to the subscripts i of the elements $p_i$, to generate a high-order m bit $PP_H=(pp_{m+n-1}, pp_{m+n-2}, \ldots, pp_{n+1}, pp_n)$ of the ascending symbols PP; and outputting either the generated descending symbols Q or ascending symbols PP or both as one of check symbols and a syndrome. When information symbols $X=(x_{L-1}, x_{L-2}, \ldots, x_1, x_0)$ having a length of $L=2^h-h-1$ (h is an integer greater than or equal to 2) is transmitted as data, a coding process is performed using a method including, when a code length of a code word Y is $N=2^h$, check symbols are $Q=(q_{n-1}, q_{n-2}, \ldots, q_1, q_0)$ and a parity p, and extended information symbols $X'=(x_{L-1}, x_{L-2}, \ldots, x_{L-N/2+1}, 0, x_{L-N/2}, \ldots, x_{10}, x_9, x_8, x_7, x_6, x_5, x_4, 0, x_3, x_2, x_1, 0, x_0, 0, 0, 0)$ have a length of N and are obtained by extending the information symbols X by assigning 0 to, among elements $x'_i$ of the extended information symbols X', elements $x'_i$ whose subscripts i are $0, 2^0, 2^1, \ldots, 2^{h-1}$ and arranging, from right, the elements of the information symbols X as the remaining elements $x'_i$ in ascending order according to the subscripts i of the elements $x_i$: the following steps performed when the code length of the code word Y is less than or equal to one word: calculating exclusive OR of $2^{h-1}$ elements obtained by selecting every other $2^j$ elements ($j=0, 1, 2, \ldots, h-1$) from elements $x'_i$ ($i=0, 1, 2, \ldots, 2^{h-1}$) of the extended information symbols in descending order according to subscripts i of the elements $x'_i$, to generate, as check symbol data, the elements $q_j$ ($j=0, 1, 2, \ldots, h-1$) of the check symbols Q; and calculating exclusive OR of all the calculated $q_j$ and all the elements $x_i$ of the information symbols X to generate the parity p as data; the following step performed when the code length of the code word Y is M words ($M=2^m$, a bit length of one word is $Lw=2^n$, m is an integer greater than or equal to 1, and $h=m+n$): generating, using the extended information symbols as the information symbol sequence V, (i) descending symbols Q, as the check symbols Q, and (ii) exclusive OR of all elements of an element sequence $P_w$ to be obtained, as the parity p, when the elements of the check symbols Q are calculated by calculating exclusive OR of $2^{m+n-1}$ elements obtained by selecting every other $2^j$ elements ($j=0, 1, 2, \ldots, m+n-1$) from the elements $x'_i$ of the extended information symbols $X'=(x_{L-1}, x_{L-2}, \ldots, x_{L-N/2+1}, 0, x_{L-N/2}, \ldots, x_{10}, x_9, x_8, x_7, x_6, x_5, x_4, 0, x_3, x_2, x_1, 0, x_0, 0, 0, 0)$ in descending order according to the subscripts i ($i=0, 1, 2, \ldots, 2^{m+n+1}$) of the elements $x'_i$; and a step of generating a code word $Y=(x_{L-1}, x_{L-2}, \ldots, x_{L-N/2+1}, q_{h-1}, x_{L-N/2}, \ldots, x_{10}, x_9, x_8, x_7, x_6, x_5, x_4, q_3, x_3, x_2, x_1, q_2, x_0, q_1, q_0, p)$ as data by replacing the elements $x'_i$ ($i=0, 2^0, 2^1, \ldots, 2^{h-1}$) of the extended information symbols to which 0 is assigned with the parity p and $q_k$ ($k=0, 1, 2, \ldots, h-1$) in ascending order according to the subscripts i of the elements $x'_i$. When a code word $Y'=(y'_{N-1}, y'_{N-2}, \ldots, y'_1, y'_0)$ that is data obtained by receiving the code word Y transmitted as data is decoded, a decoding process is performed using a method including: the following steps performed when the code word Y' has a code length less than or equal to one word: calculating exclusive OR of $2^{h-1}$ elements obtained by selecting every other $2^j$ elements ($j=0, 1, 2, \ldots, h-1$) from elements $y'_i$ ($i=0, 1, 2, \ldots, N-1$) of the received code word Y' in descending order according to the subscripts of the elements $y'_i$, to generate elements $s_j$ of a syndrome $S=(s_{h-1}, s_{h-2}, \ldots, s_1, s_0, r)$; calculating exclusive OR of all the elements $y'_i$ of the code word Y' to generate, as data, an element r of the syndrome S; determining, based on the syndrome, presence or absence, and a type, of an error; correcting, when, in the case of $r=1$, it is determined that a single error is present, the code word Y' by inverting a value of one of the elements $y'_i$, which is at a location identified by $(s_{h-1}, s_{h-2}, \ldots, s_1, s_0)$, of the code word Y'; and extracting, from the corrected code word Y', information symbols $Z=(z_{L-1}, z_{L-2}, \ldots, z_1, z_0)$, and outputting the information symbols Z as data after error correction; and the following steps performed in the case where the code word Y has a length of M words: generating, using the code word Y' as the information symbol sequence V, (i) elements of descending symbols Q, as elements $s_j$ ($j=0, 1, 2, \ldots, m+n-1$) of a syndrome $S=(s_{m+n-1}, s_{m+n-2}, \ldots, s_n, s_{n-1}, \ldots, s_1, s_0, r)$ and (ii) exclusive OR of all elements of an element sequence $P_w$ to be obtained, as the element r of the syndrome S, when exclusive OR of $2^{n-1}$ elements obtained by selecting every other $2^j$ elements ($j=0, 1, 2, \ldots, n-1$) from the elements $y'_i$ ($i=0, 1, 2, \ldots, N-1$) of the received code word Y' in descending order according to the subscripts i of the elements $y'_i$; determining, based on the syndrome, presence or absence, and a type, of an error; correcting, when, in the case of $r=1$, it is determined that a single error is present, the code word Y' by inverting a value of one of the elements $y'_i$, which is at a location identified by a word number corresponding to a high-order m bit $S_H=(s_{m+n-1}, s_{m+n-2}, \ldots, s_n)$ of the syndrome S and a bit location, in a word, corresponding to low-order n bits $S_L=(s_{n-1}, \ldots, s_1, s_0)$ of the syndrome S except a bit location of the element r; and extracting, from the corrected code word Y', information symbols $Z=(z_{L-1}, z_{L-2}, \ldots, z_1, z_0)$, and outputting the information symbols Z as data after error correction. The expressions for check symbols and syndrome in the Hamming coding scheme and the extended Hamming coding scheme do not have high regularity (see FIGS. 4, 5, and 8). In view of the above, designing the coding method in the super Hamming coding scheme enables the calculation of the syndrome using the expressions having high regularity as shown by FIGS. 13 and 19, and the easy identification of a location where a bit error occurs. FIGS. 20 and 21 show, for the case of $n=4$, bit locations of information symbols which are for use in operation in the extended Hamming coding scheme and the super Hamming coding scheme, and bit locations of a symbol obtained by extending the information symbols, respectively. It is clear from FIGS. 20 and 21 that an operational expression in the super Hamming coding scheme has a structure in which the same pattern is repeated and that the same expression may be repeatedly applied even when the length of the code word changes. In addition, preparing this calculation pattern as an instruction enables efficient calculation of the check symbols or the syndrome.

It is to be noted that when the input $x_{L-1}, x_{L-2}, \ldots, x_0$ of the information symbols is arranged in reverse order to $x_0, x_1, \ldots, x_{L-1}$, and symbols having the same format as an expression for a symbol sequence $q_{h-1}, q_{h-2}, \ldots, q_1, q_0$ of the check symbols are used as new check symbols, the same process as above can be performed. To put it another way, the bit locations of the symbols obtained by extending the information symbols which are for use in operation and the bit locations not for use in operation are inverted.

As stated above, the super Hamming coding scheme is highly flexible for a code length, and thus it is possible to establish a communications system that uses a suitable code length according to a transmission error rate at the time of communication, by taking advantage of the characteristics of the super Hamming coding scheme. For instance, when the transmission error rate is low, transmission efficiency is increased by extending the code length, and it is possible to reduce a processing time overhead and a power consumption. Moreover, when the transmission error rate is high, it is possible to enhance bit error resistance by reducing the code length.

Embodiment 1

In an error correction coding scheme such as the extended Hamming coding scheme, check symbols corresponding to information symbols are calculated when coding is performed. In addition, to decode a received code word and perform error correction, a syndrome is calculated. In these calculations, it is necessary to calculate an inner product of bit vectors. Although this calculation is performed by a logical product for each of corresponding bits between two vectors and a modulo-2-sum of all bits resulting from the logical products, the calculation can be performed using an exclusive OR operation. However, such an operation is not prepared as an instruction in a general-purpose computer, and thus the calculation of a check vector or a syndrome must be performed using a combination of operation instructions or control instructions. For this reason, the calculation of check symbols or the syndrome requires long execution cycles. Moreover, although, when the error correction is performed, it is necessary to identify, using a value of a syndrome, a location where an error has occurred, the general-purpose computer does not include an instruction suitable for the identification. Thus, the identification of the error location requires the long execution cycles.

Figure 22:
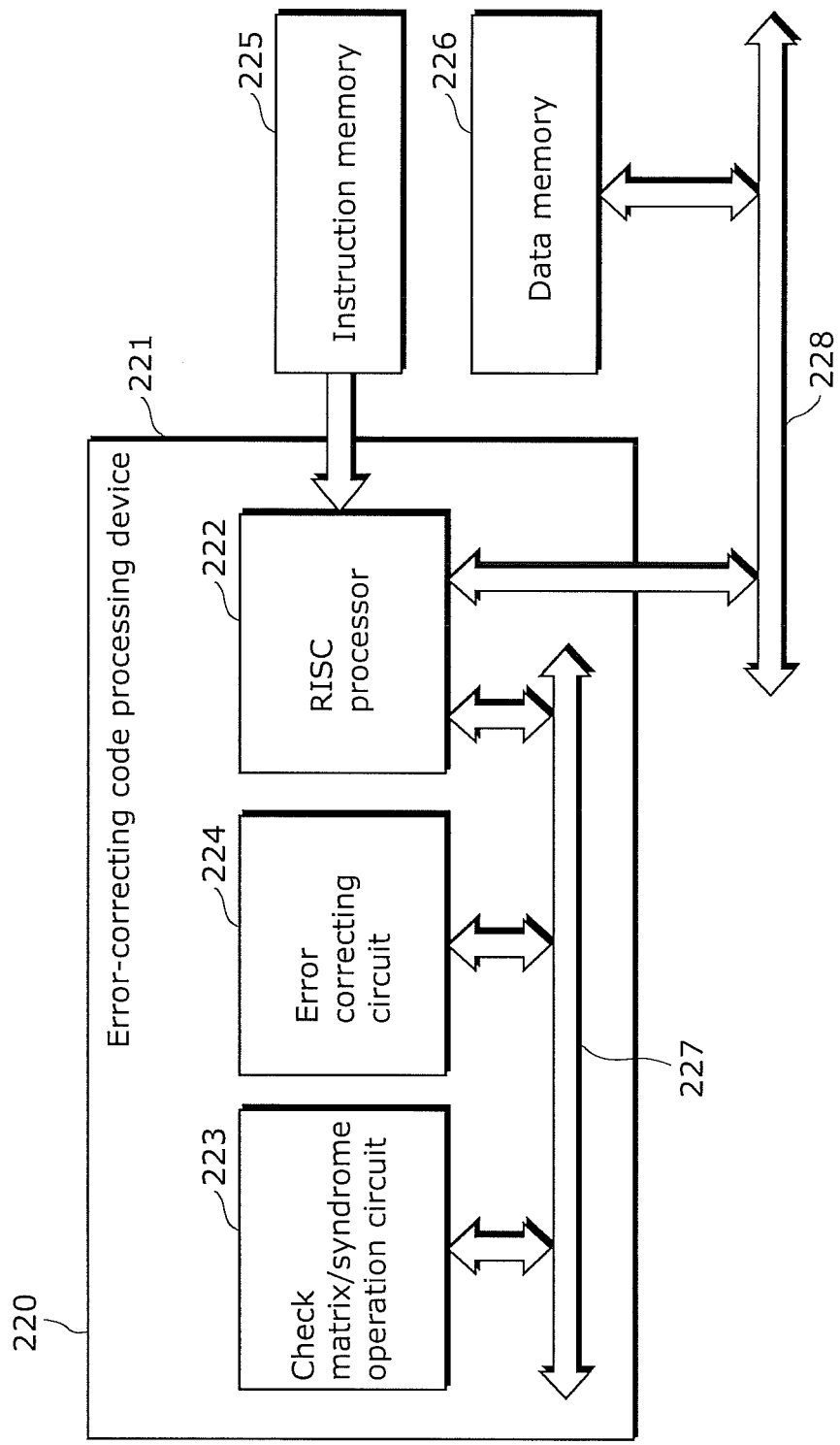
FIG. 22 is a diagram showing an error-correcting code processing device according to the present invention.

In view of the above, the following describes, as one of the embodiments, an error-correcting code processing device 220 that uses, as shown by FIG. 22, an application specific instruction-set processor (ASIP) that includes an instruction for calculating check symbols or a syndrome in a small number of execution cycles or an instruction for performing error correction in a small number of execution cycles. The error-correcting code processing device 220 makes it possible to perform processes such as coding of data, decoding of data, error correction, and error detection efficiently with small power consumption.

In FIG. 22, the error-correcting code processing device 220 includes a reduced instruction set computer (RISC) processor 222, a check matrix/syndrome operation circuit 223, and an error correcting circuit 224 that are connected to each other via an internal bus 227. Moreover, an instruction memory 225 is outside of the error-correcting code processing device 220, and the RISC processor 222 reads an instruction from the instruction memory 225 and executes the instruction. Furthermore, a data memory 226 stores data. After data read from the data memory 226 is inputted via a data bus 228 to the error-correcting code processing device 220 according to the necessity of an instruction to be executed and the data is used for an operation by the check matrix/syndrome operation circuit 223, the error correcting circuit 224, and so on, the operation result is stored via the data bus 228 into the data memory 226. Data from or to the outside that is written into or read from the data memory 226 is received from or transmitted to the outside of the error-correcting code processing device 220 through an input-output interface (not shown) via the data bus 228.

The RISC processor 222 holds, as instructions, dedicated instructions and auxiliary instructions indicated by (a) to (f) below, in the instruction memory 225. It is to be noted that although the RISC processor is used here, a CISC processor or the like may be used.

Figure 23:
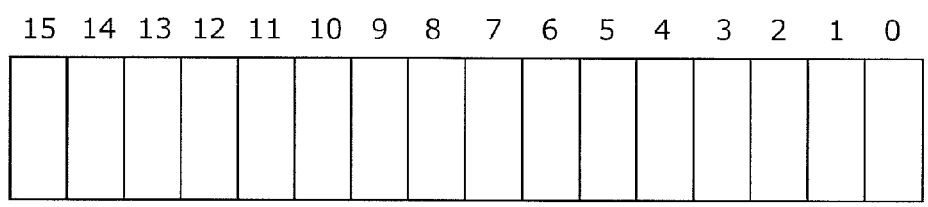
FIG. 23 is a diagram showing a method of assigning an index to each bit when 1 word includes 16 bits according to the present invention.
Figure 24:
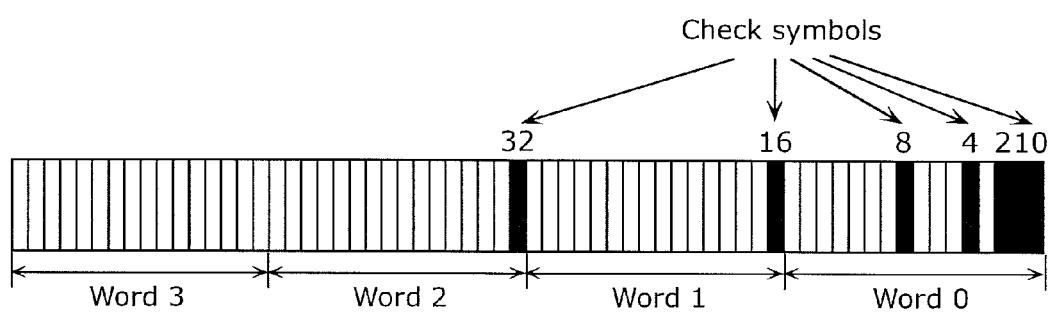
FIG. 24 is a diagram showing locations where check symbols are embedded in a code word including 4 words according to the present invention.

(a) Dedicated Instruction for Relocating Information Symbols to Generate a Code Word from the Information Symbols A bit length of one word in a processor is represented by $N_w=2^n$, and the rightmost index of a bit and the leftmost index of a bit are represented by 0 and $N_w-1$, respectively. FIG. 23 shows a method of assigning an index when $N_w=16$. In Equation 10, a location where check symbols and a parity are embedded in a code word is indicated by an index of a bit that is 0 or a power of 2. When one word consists of 16 bits (n=4), a case is considered where a series of indexes is assigned to data including four words. n+1 check symbols and parities are embedded in the first word having the smallest index. The rightmost index of the second word is $2^n=16$, check symbols are embedded at a location indicated by the rightmost index. Likewise, the rightmost index of the third word is $2^{n+1}=32$, check symbols are also embedded at a location indicated by the rightmost index. However, indexes of bits in the fourth word are 48 to 63 and none of the numbers is a power of 2, and thus no check symbol is embedded in the fourth word. FIG. 24 shows the locations where the check symbols are embedded, in connection with the case. Even when a value of $N_w$ changes, a location where check symbols is embedded complies with similar rules.

In sum, it is known that a location where check symbols are embedded complies with the following rules (1) to (3).

(1) n+1 check symbols are embedded in the first word.

(2) When check symbols are embedded in the second word or a subsequent word, the check symbols are embedded at the rightmost of the second or subsequent word.

(3) No check symbol is embedded in the fourth word or a subsequent word.

Figure 25:
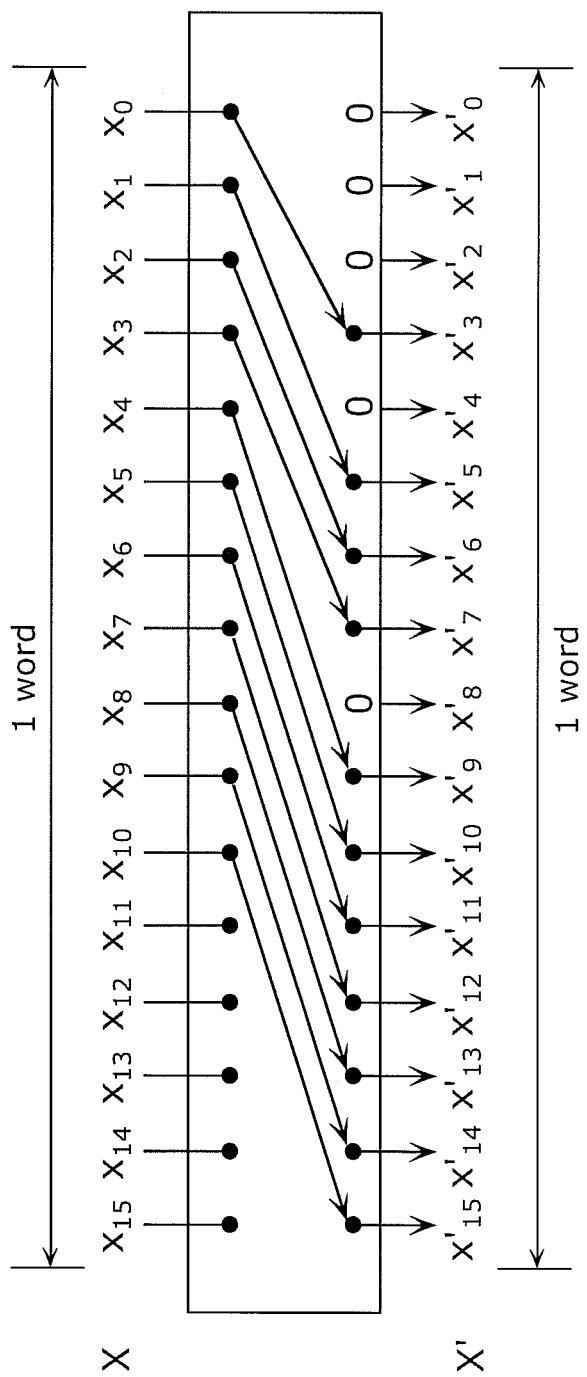
FIG. 25 is a diagram showing an information symbol relocation instruction (1) in the super Hamming coding scheme according to the present invention.
Figure 26:
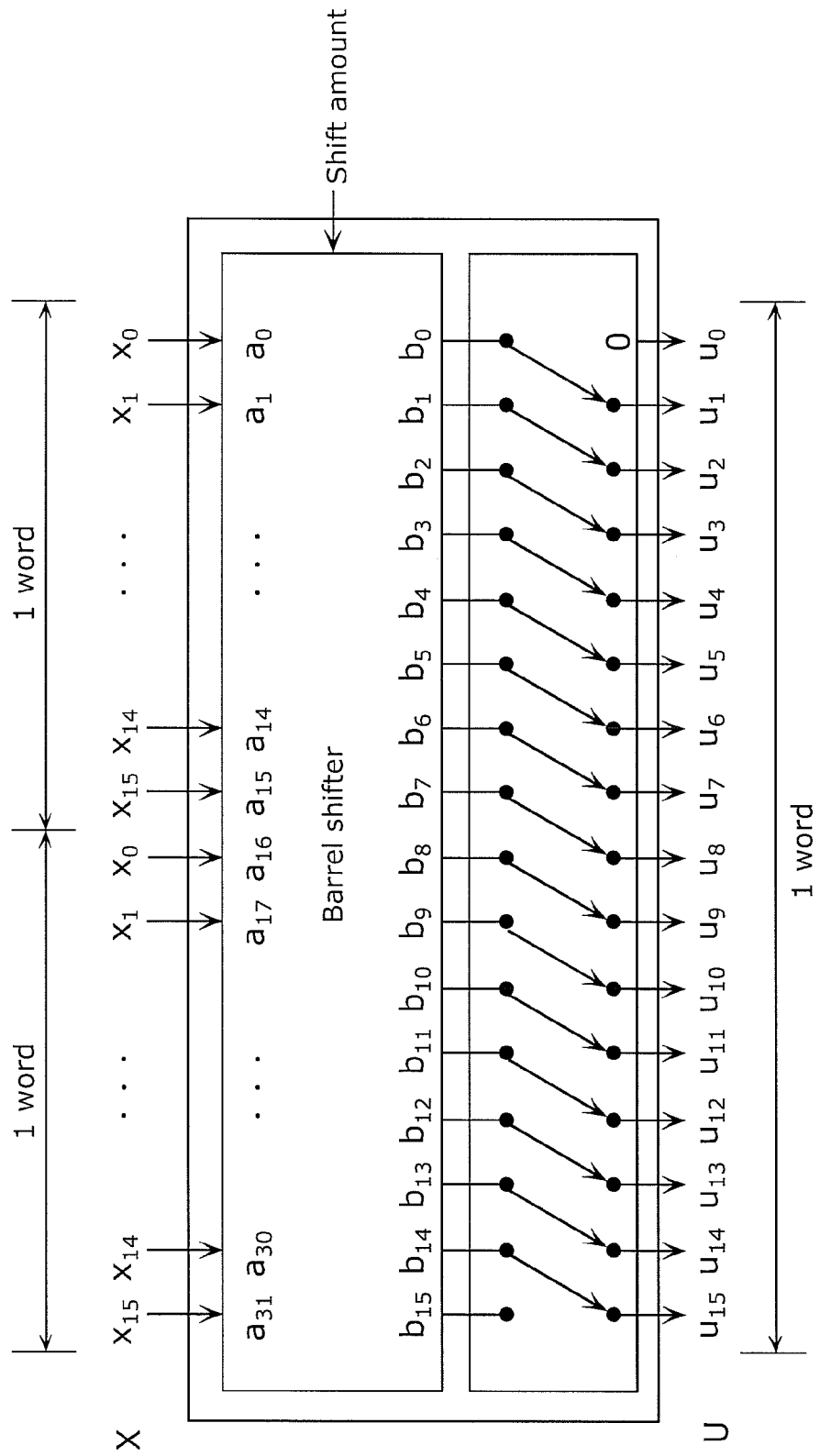
FIG. 26 is a diagram showing an information symbol relocation instruction (2) in the super Hamming coding scheme according to the present invention.
Figure 27:
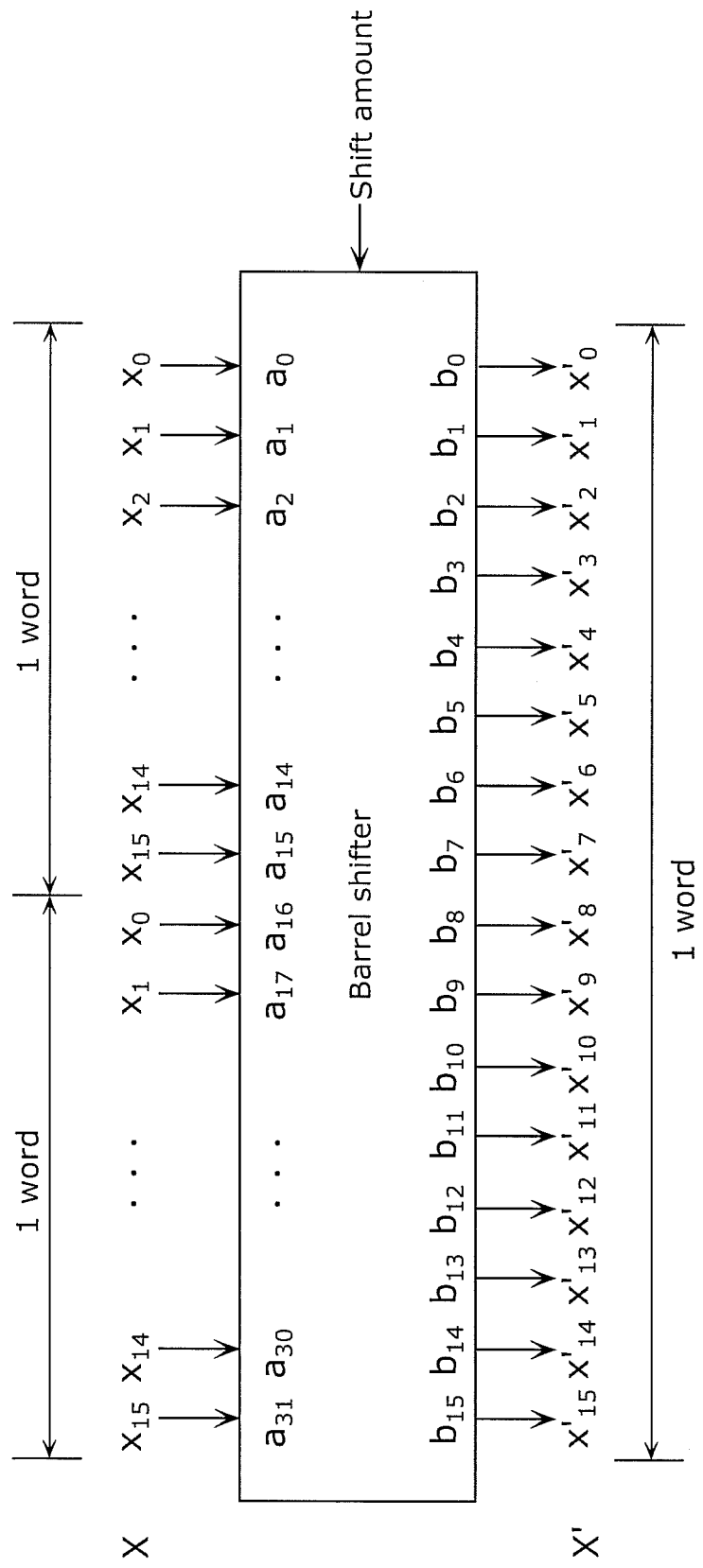
FIG. 27 is a diagram showing an information symbol relocation instruction (3) in the super Hamming coding scheme according to the present invention.
Figure 28:
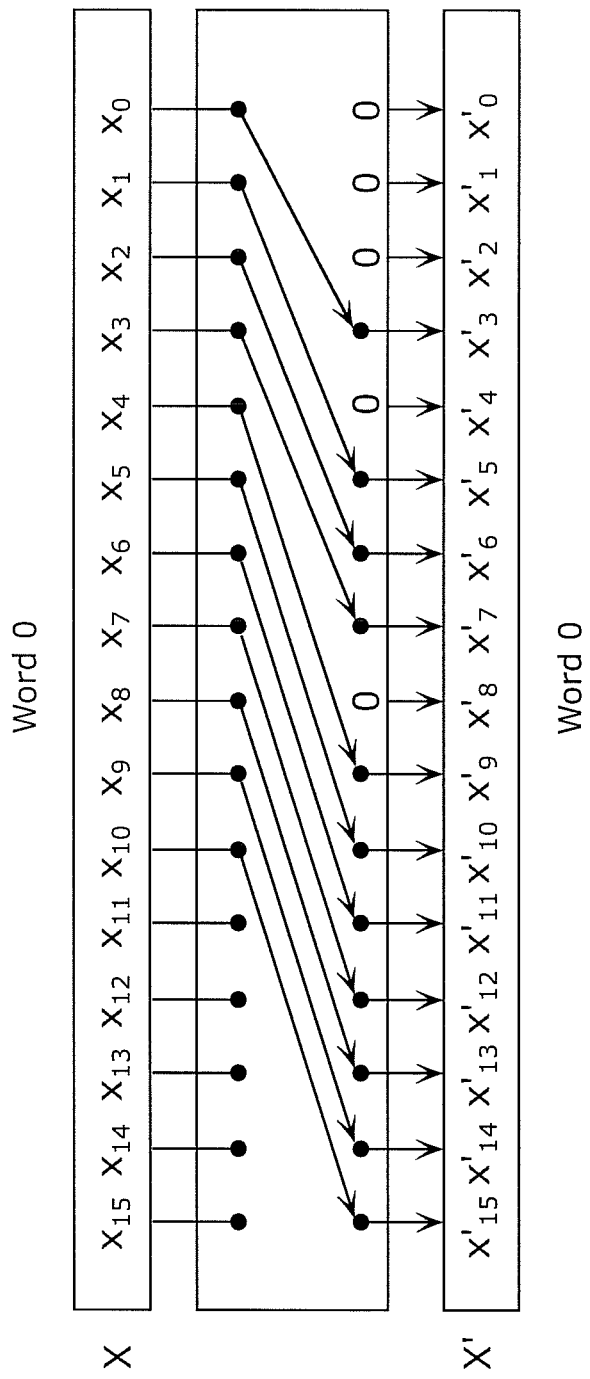
FIG. 28 is a diagram showing an example of application of the information symbol relocation instruction (1) in the super Hamming coding scheme according to the present invention.
Figure 29:
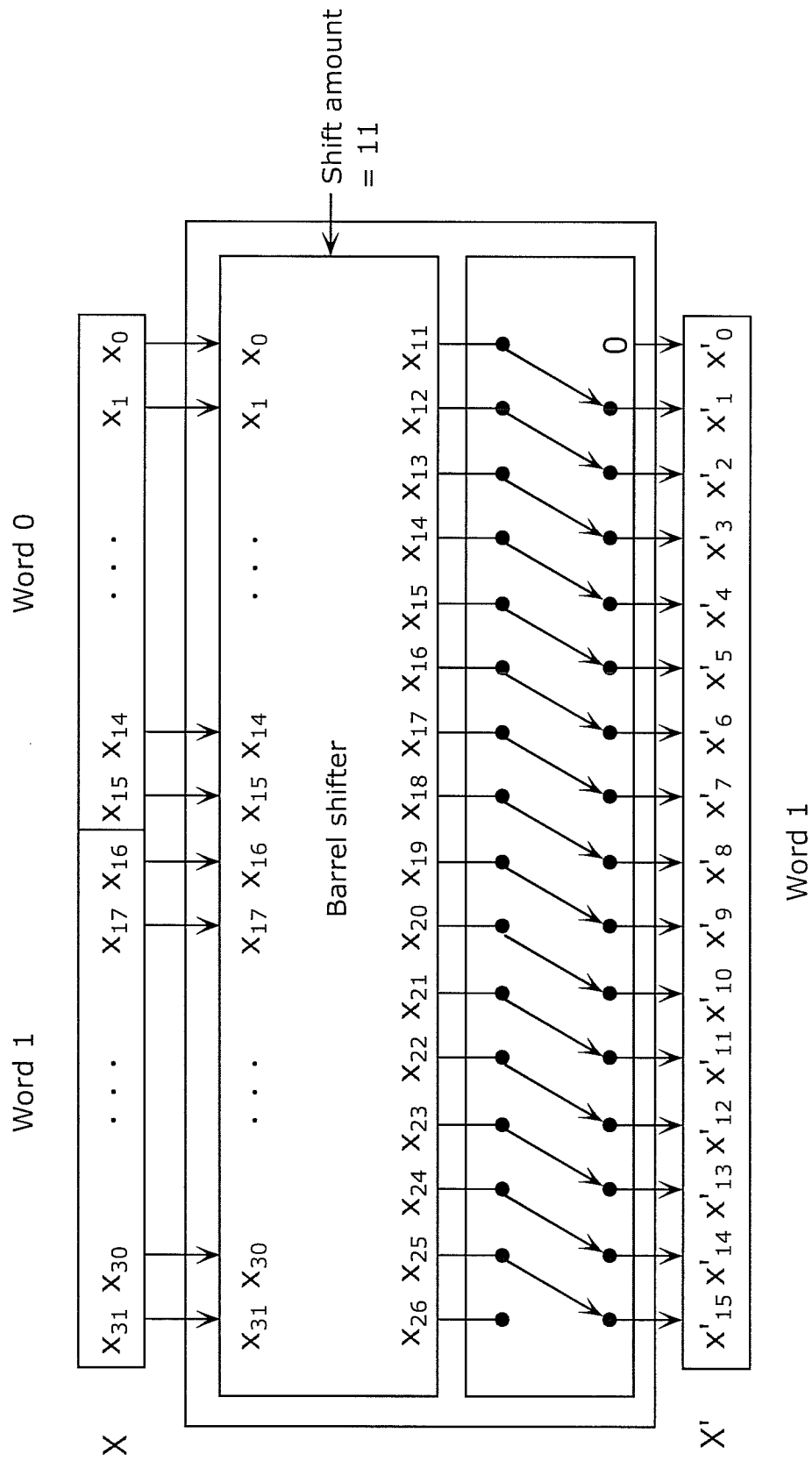
FIG. 29 is a diagram showing an example of application of the information symbol relocation instruction (2) in the super Hamming coding scheme according to the present invention.
Figure 30:
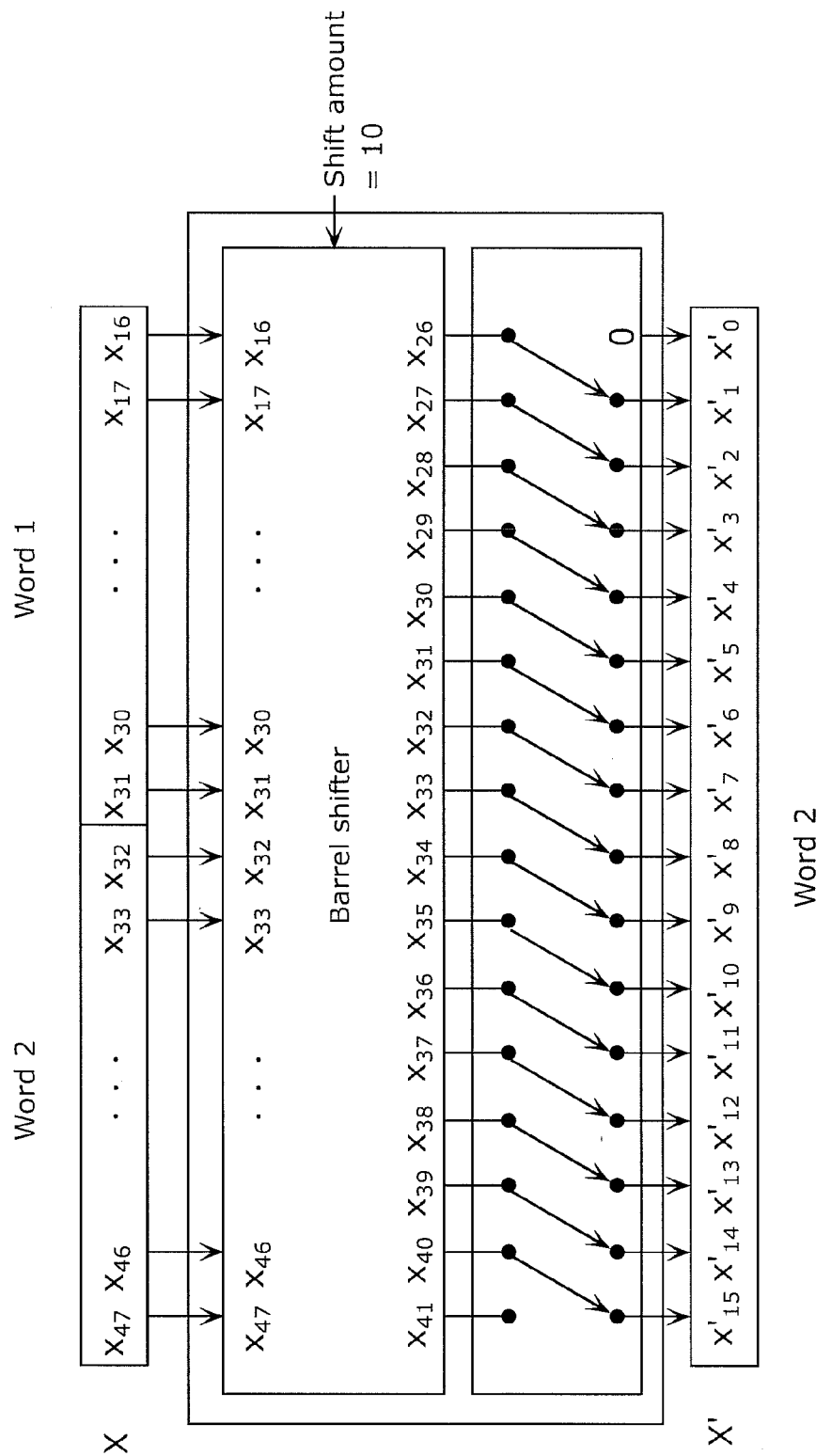
FIG. 30 is a diagram showing an example of application (1) of the information symbol relocation instruction (3) in the super Hamming coding scheme according to the present invention.
Figure 31:
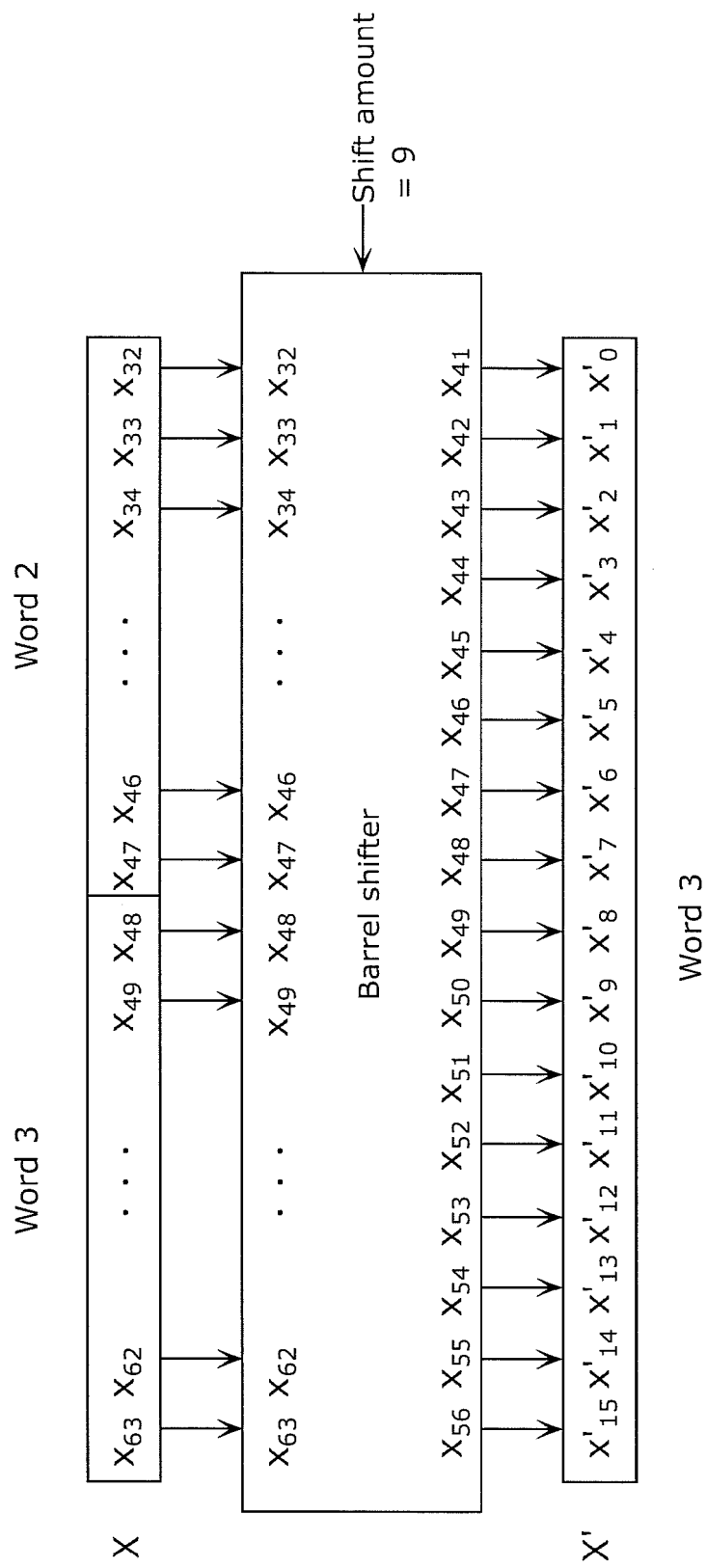
FIG. 31 is a diagram showing an example of application (2) of the information symbol relocation instruction (3) in the super Hamming coding scheme according to the present invention.
Figure 32:
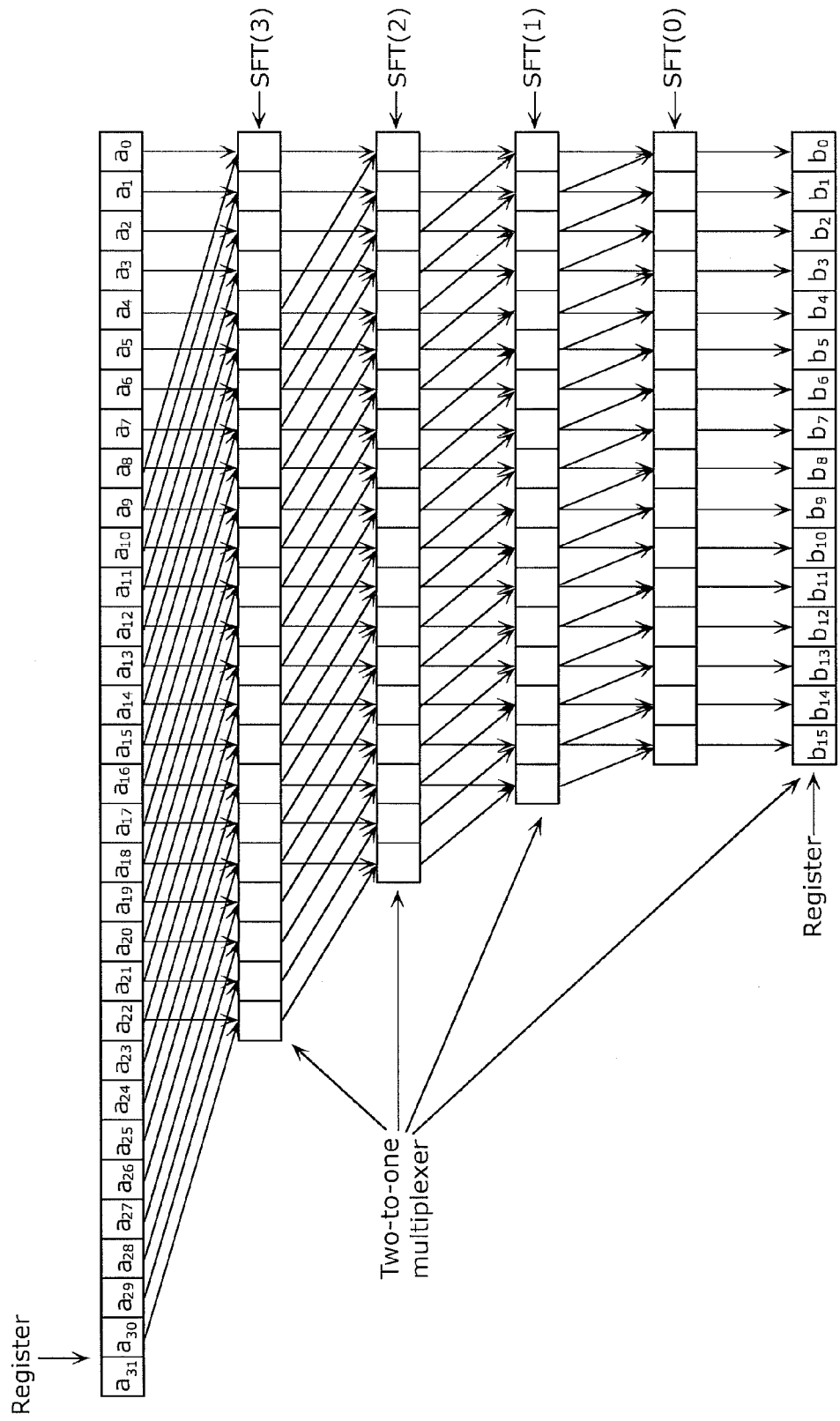
FIG. 32 is a diagram showing an exemplary method of implementing a barrel shifter according to the present invention.

In consideration of the above rules, it is known that by using three types of instructions having functions of block diagrams shown by FIGS. 25 to 27, it is possible to convert information symbols having a given length into a code word. It is to be noted that although FIGS. 25 to 27 show the case of $N_w=16$ as the example, when $N_w$ is a power of 2, it is possible to perform, using three similar types of instructions, processing on even information symbols having a greater word length. FIGS. 28 to 31 show examples of converting, using the three types of instructions, information symbols X of 57 bits in a form of Equation 7 expressed using four words when a length of one word is 16 bits, into an extended information symbols X' in a form of Equation 8. A relocation instruction (1) shown by FIG. 25 may be used to obtain a word 0 of X'. A relocation instruction (2) shown by FIG. 26 may be used to obtain a word 1 and a word 2 of X'. A relocation instruction (3) shown by FIG. 27 may be used to obtain a word 3 of X'. It is to be noted that suffixes of elements of X' are indicated not by serial numbers but by numbers in each word. A barrel shifter used in FIGS. 26 and 27 is an operation unit that efficiently clips a bit string $[b_{n-1}, \ldots, b_1, b_0]$ equivalent to one word from an inputted bit string $[a_{2n-1}, \ldots, a_1, a_0]$ equivalent to two words. Here, when a shift amount is k (0≤k<n), an output is $[b_{n-1}, \ldots, b_1, b_0]=[a_{n+k-1}, \ldots, a_{k+1}, a_k]$. FIG. 32 shows an implementation example of the barrel shifter. Square boxes at the central part of FIG. 32 are two-to-one multiplexers each of which selects one of two inputs based on a value indicated by a control signal.

When a word length of X is greater than 4, it is also possible to efficiently relocate the information symbols by using the three types of relocation instructions shown by FIGS. 25 to 27.

Figure 33:
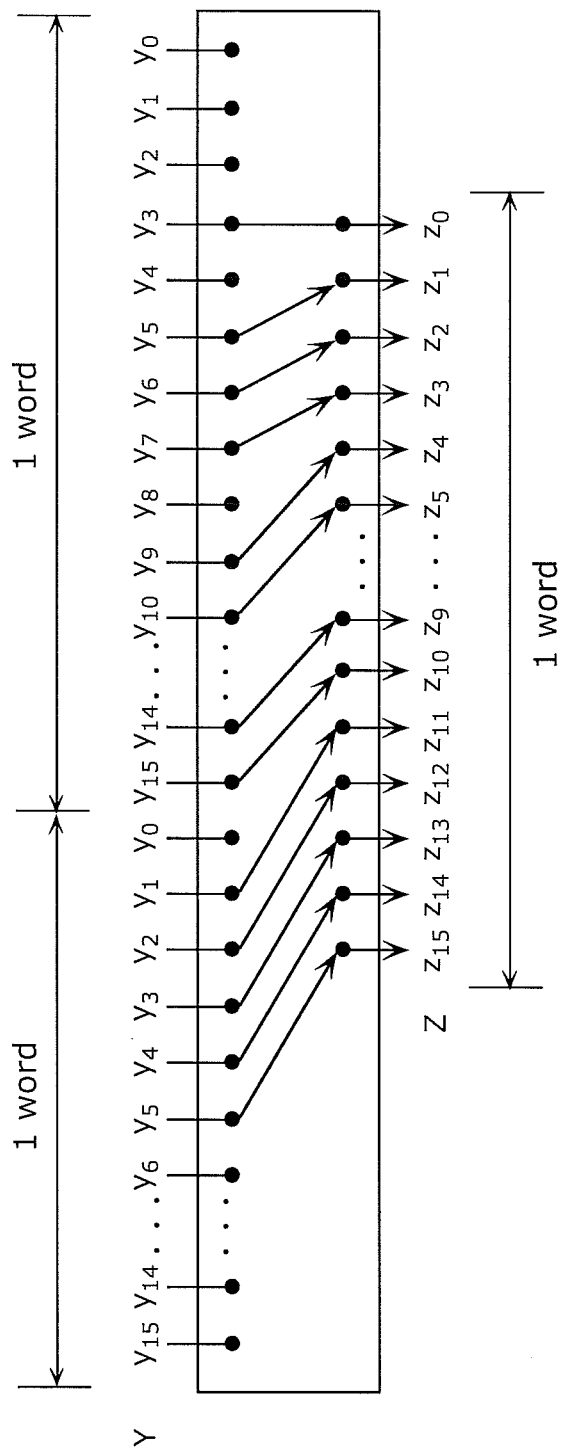
FIG. 33 is a diagram showing an information symbol extract instruction (1) in the super Hamming coding scheme according to the present invention.
Figure 34:
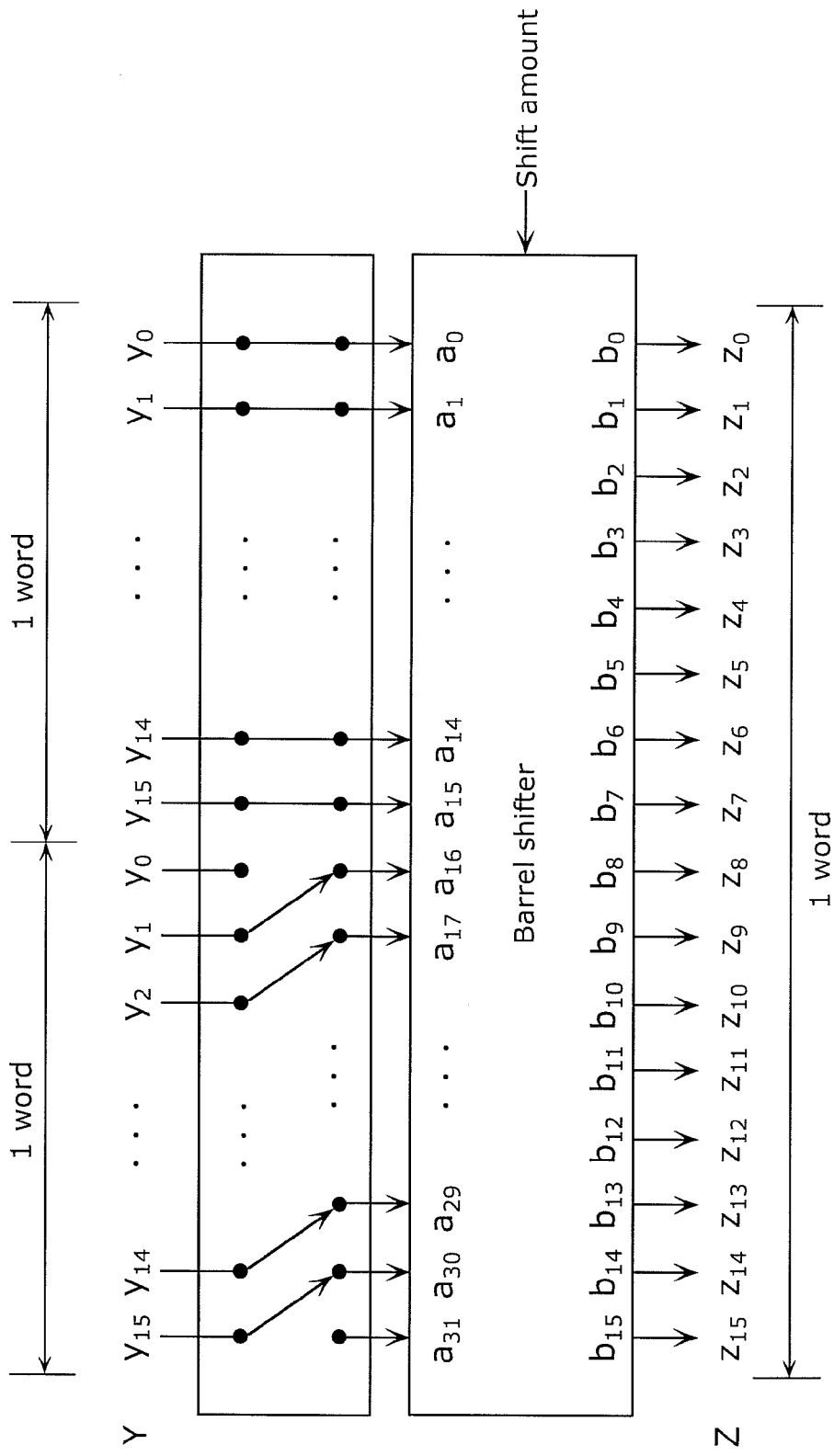
FIG. 34 is a diagram showing an information symbol extract instruction (2) in the super Hamming coding scheme according to the present invention.
Figure 35:
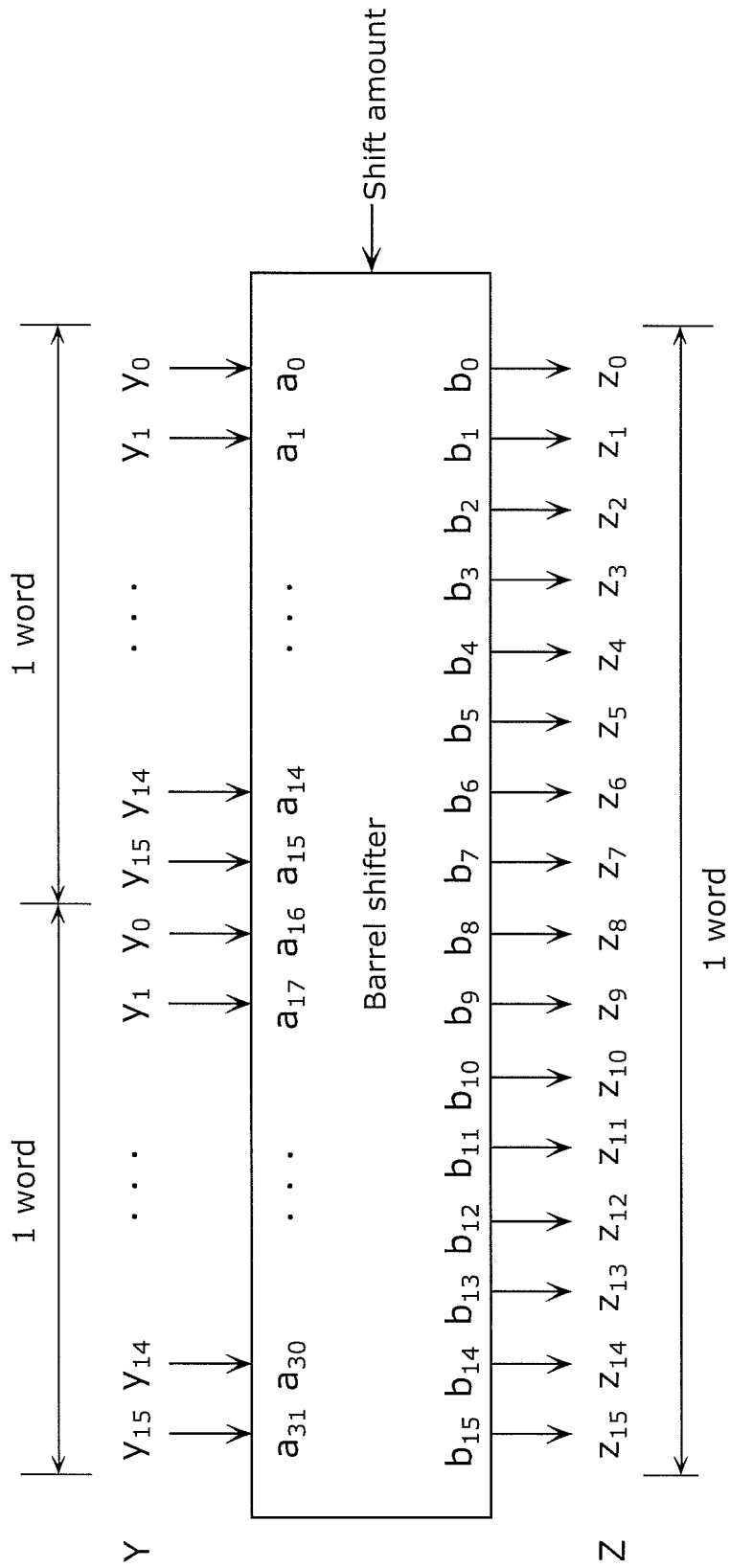
FIG. 35 is a diagram showing an information symbol extract instruction (3) in the super Hamming coding scheme according to the present invention.
Figure 36:
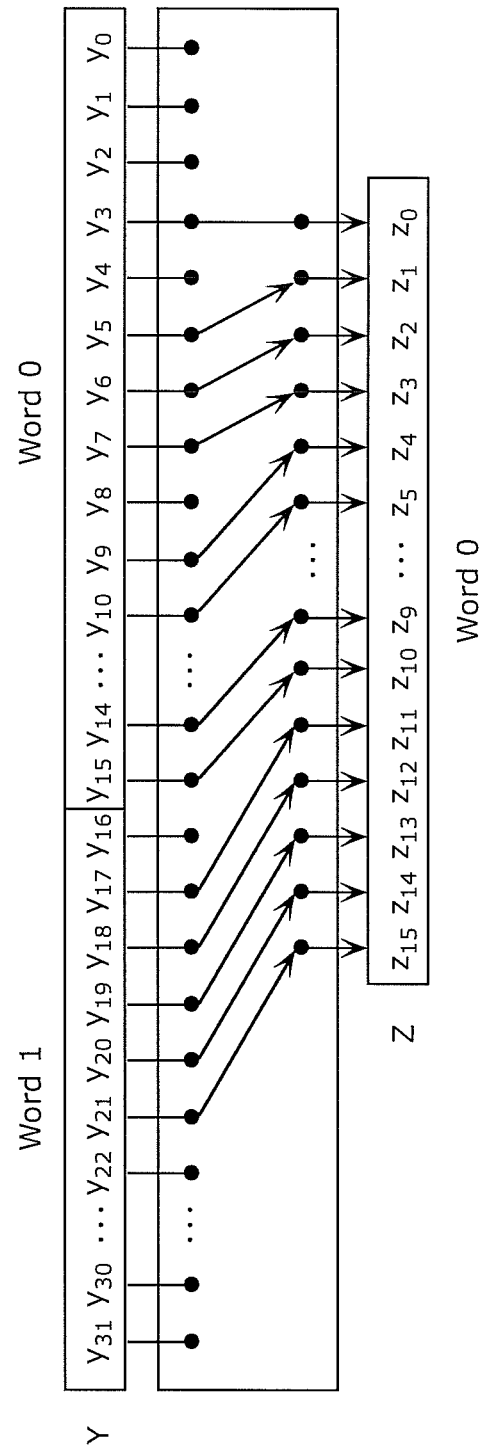
FIG. 36 is a diagram showing an example of application of the information symbol extract instruction (1) in the super Hamming coding scheme according to the present invention.
Figure 37:
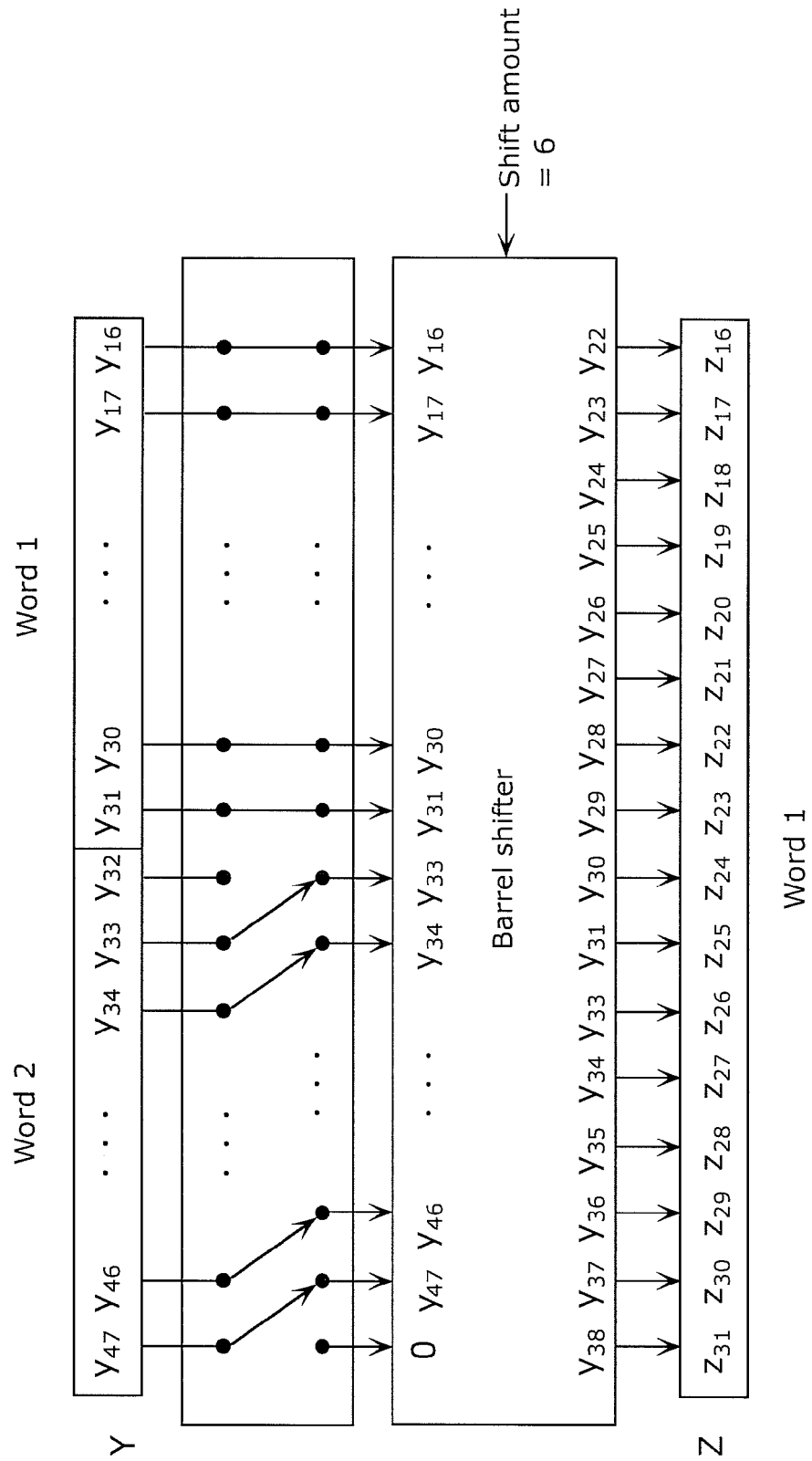
FIG. 37 is a diagram showing an example of application of the information symbol extract instruction (2) in the super Hamming coding scheme according to the present invention.
Figure 38:
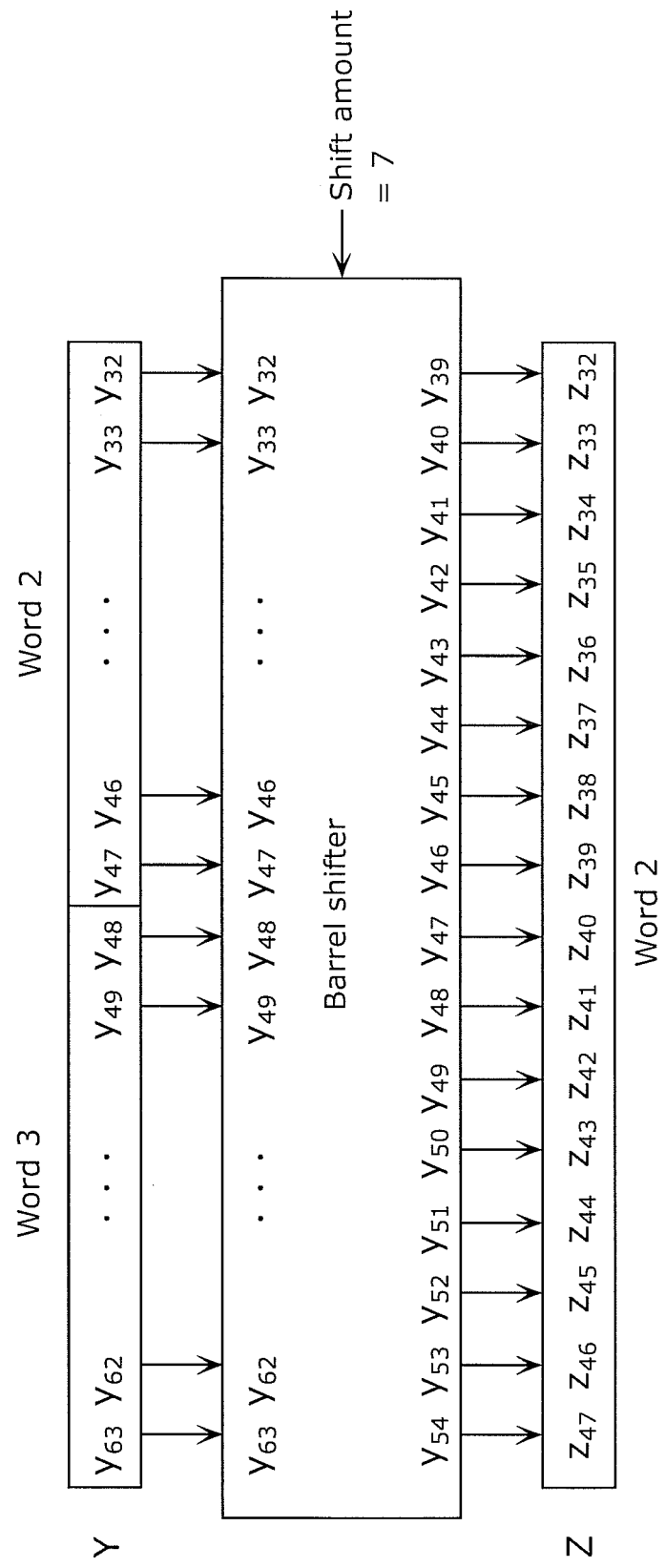
FIG. 38 is a diagram showing an example of application (1) of the information symbol extract instruction (3) in the super Hamming coding scheme according to the present invention.
Figure 39:
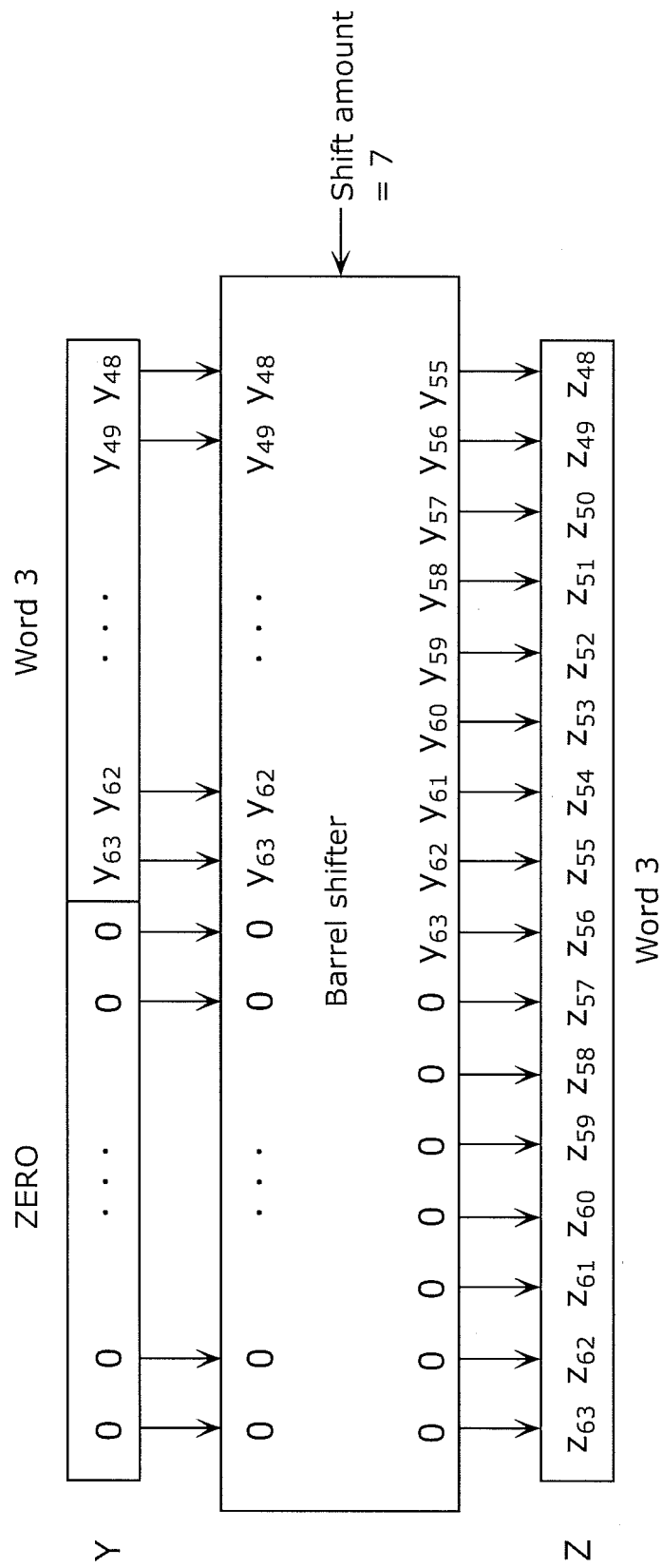
FIG. 39 is a diagram showing an example of application (2) of an information symbol extract instruction (4) in the super Hamming coding scheme according to the present invention.

(b) Dedicated Instruction for Extracting Information Symbols from a Decoded Code Word In consideration of the rule regarding the location where the check symbols are embedded that is described in (a), by using three types of instructions having functions of block diagrams shown by FIGS. 33 to 35, it is possible to extract information symbols from a code word having a given length. Among the three types of instructions, an information symbol extract instruction (3) shown by FIG. 35 has the same function as the information symbol relocation instruction (3) shown by FIG. 27, and thus the information symbol relocation instruction (3) may be used for the both purposes. Although FIGS. 33 to 35 show the functions of the instructions in a 16-bit processor, when a word length of the processor is a power of 2, it is possible to perform, using three similar types of instructions, processing on even information symbols having a greater word length. For instance, the information symbol extract instructions shown by FIGS. 33 to 35 may be used for a case where information symbols of 57 bits is extracted from a code word expressed in four words (64 bits) when a length of one word is 16 bits. FIGS. 36 to 39 show a method of extracting, using three types of instructions, information symbols from a code word of four words. When a code word has a much greater length, information symbols can be efficiently extracted by using the three types of instructions.

(c) Dedicated Instruction for Calculating, in One Cycle, Check Symbols and a Syndrome for a Code Word Having a Length Less than or Equal to One Word When the number of bits of one word is $N_w$, it is possible to easily implement a dedicated instruction for inputting information symbols having a length less than or equal to $L=2^n-n-1$ and calculating, in one cycle, check symbols and a parity or a syndrome. Here, when exclusive OR p and r of all the inputted bits are simultaneously calculated in the calculation of the check symbols as shown by FIG. 14 or the calculation of the syndrome as shown by FIG. 40, it is possible to concurrently calculate information required for calculating check symbols and a syndrome of a symbol sequence having a length greater than or equal to two words. FIG. 41 shows locations of bits to be calculated. An output is n+1 bits even when p or r is included, and thus the output sufficiently fits into one word ($N_w=2^n$ bits).

(d) Dedicated Instruction for Detecting and Correcting, in One Cycle, an Error in a Code Word Having a Length Less than or Equal to One Word As is the case for the extended Hamming coding scheme, when error detection is performed using the syndrome $S=[s_{n-1}, s_{n-2}, \ldots, s_1, s_0, r]$ calculated with the dedicated instruction of (c), it is possible to determine the presence or absence, and a type, of the error as shown by Table 1. In Table 1, t represents exclusive OR of all bits of a vector ($s_{n-1}, s_{n-2}, \ldots, s_1, s_0$).

TABLE 1

| Case | Condition | Logical expression |
|---|---|---|
| Case 1 (No error) | r = 0 and $(s_{n-1}, s_{n-2}, \ldots, s_1, s_0) = 0$ | not (r) ∧ not (t) |
| Case 2 (Single error) | r = 1 | r |
| Case 3 (Double error) | r = 0 and $(s_{n-1}, s_{n-2}, \ldots, s_1, s_0) \neq 0$ | not (r) ∧ t |

Figure 42:
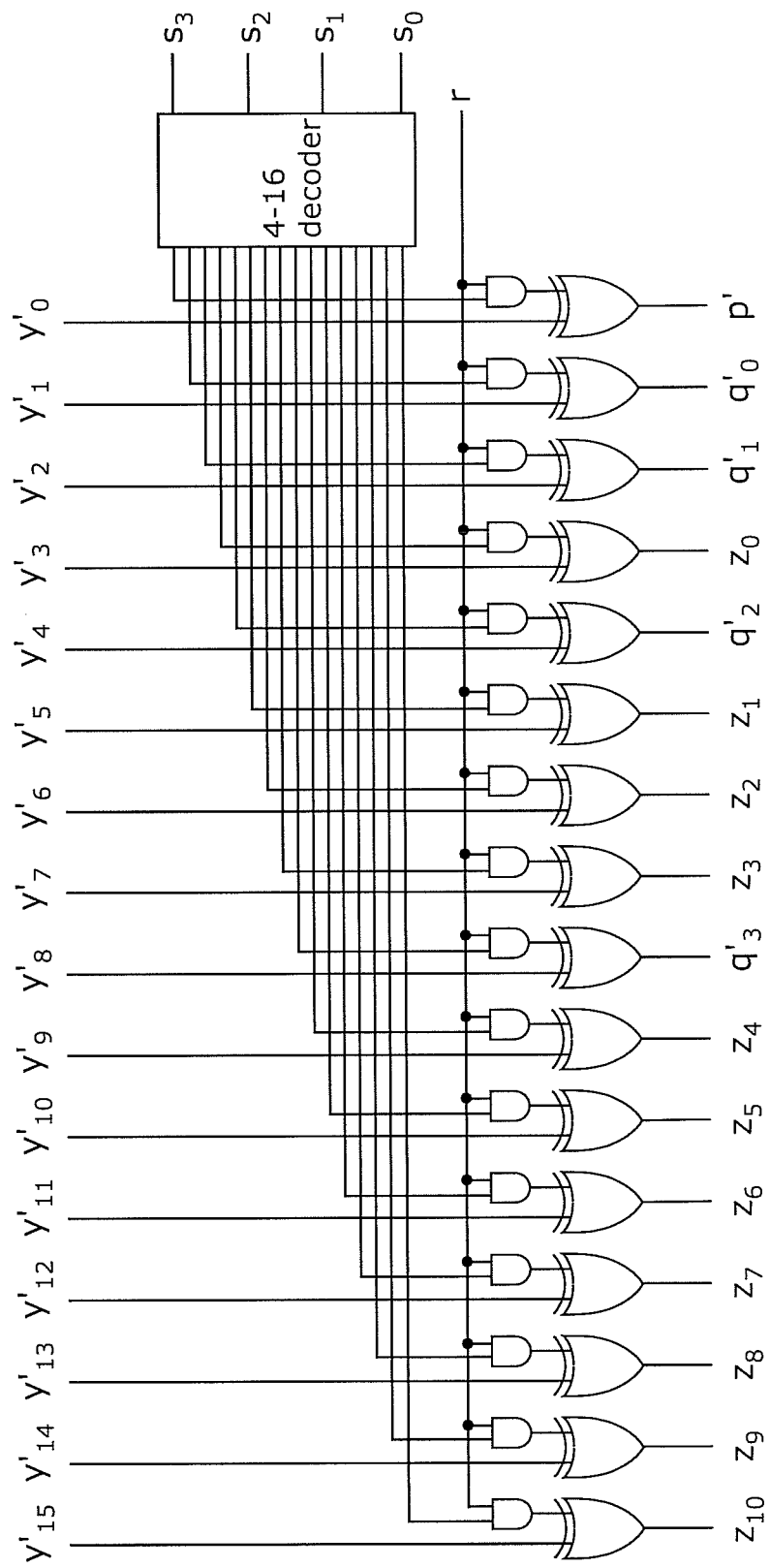
FIG. 42 is a diagram showing a single error correction circuit in the super Hamming coding scheme according to the present invention.

It is possible to easily implement an instruction for correcting a single error when, for example, a circuit shown by FIG. 42 is used.

(e) Auxiliary Instruction for Efficiently Calculating, Using the Instruction of (c) Repeatedly, Check Symbols and a Syndrome of a Symbol Sequence Having a Length Greater than or Equal to Two Words When a symbol sequence expressed by Equation 10 has a length greater than or equal to two words, check symbols (or a syndrome) may be calculated in the following manner. First, the calculation of the check symbols is described. A bit length of one word is $N=2^n$. In addition, a length of a symbol sequence to be coded is $M=2^m$ words. Word numbers are from 0 to M−1. Check symbols of an i-th word is $Q_i=[q_{i, n-1}, q_{i, n-2}, \ldots, q_{i, 1}, q_{i, 0}]$. Moreover, exclusive OR of all bits of the i-th word is $p_i$. Check symbols $Q=[q_{m+n-1}, \ldots, q_1, q_0]$ for all the words can be calculated, as shown by FIG. 43, by using exclusive OR of the check symbols and all the bits of each word.

Figure 44:
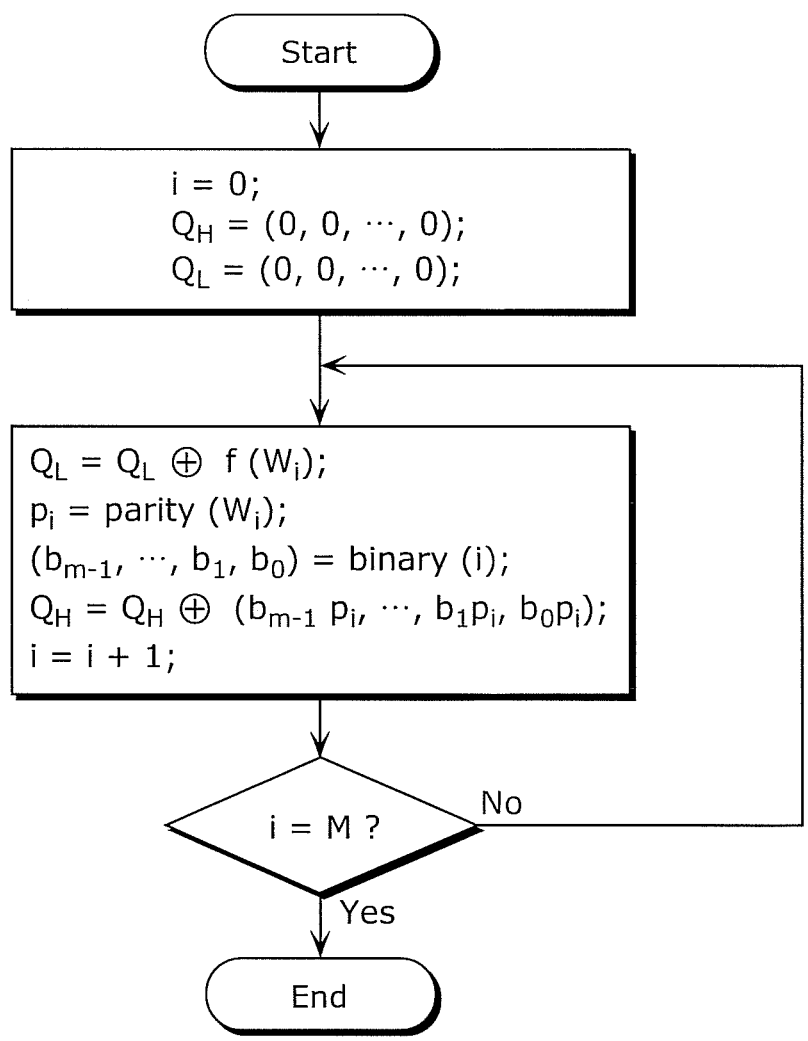
FIG. 44 is a diagram showing a procedure for calculating check symbols corresponding to information symbols including words in the super Hamming coding scheme according to the present invention.
Figure 46:
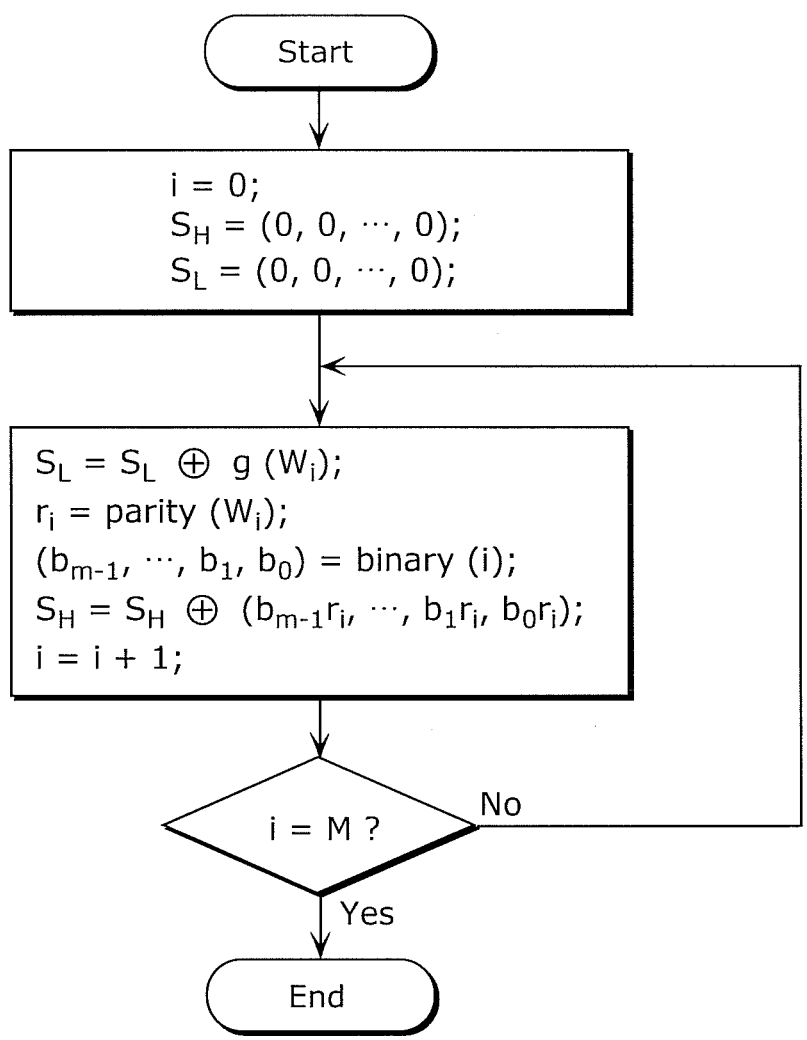
FIG. 46 is a diagram showing a procedure for calculating a syndrome of a code word including words in the super Hamming coding scheme according to the present invention.

FIG. 44 shows an exemplary procedure for calculating check symbols for extended information symbols stored in M words $W_{M-1}, W_{M-2}, \ldots, W_1, W_0$. In FIG. 44, a function $f(W_i)$ represents a check symbol sequence for $W_i$, a function parity($W_i$) represents exclusive OR of all bits of $W_i$, and a function binary(i) represents an integer number i in binary. As shown by expressions in FIG. 45, a syndrome can be calculated using exclusive OR of a syndrome and all bits of each word. FIG. 46 shows an exemplary procedure for calculating a syndrome for a code word stored in M words $W_{M-1}, W_{M-2}, \ldots, W_1, W_0$. In FIG. 46, a function $g(W_i)$ represents a syndrome for $W_i$, a function parity($W_i$) represents exclusive OR of all bits of $W_i$, and a function binary(i) represents an integer number i in binary.

Figure 10:
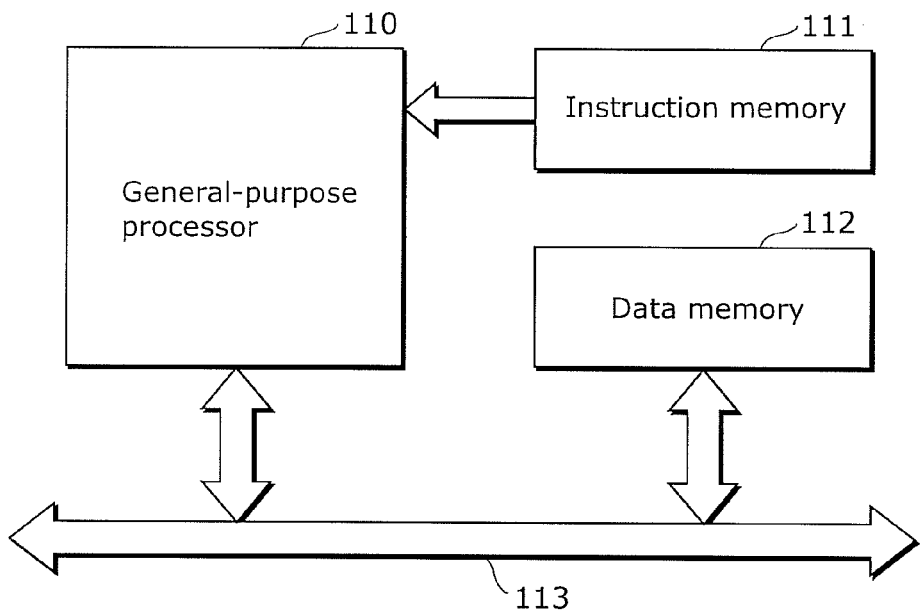
FIG. 10 is a diagram showing implementation of conventional error-correcting code processing, using software on a general-purpose processor.

(f) Auxiliary Instruction for Efficiently Detecting and Correcting an Error in a Code Word Having a Length Greater than or Equal to Two Words By analyzing the syndrome generated with the auxiliary instruction of (e) for the code word having the length greater than or equal to the two words, it is possible to easily detect and correct an error in the whole code word. High-order bits of the generated syndrome $S_H=[s_{m+n-1}, \ldots, s_{n+1}, s_n]$ correspond to word numbers, and low-order bits $S_L=[s_{n-1}, \ldots, s_1, s_0]$ correspond to bit locations in a word. Thus, when a single error is corrected, it is possible to easily identify a word in which the error has occurred, using the high-order bits $S_H$ of the syndrome, as well as a bit at which the error has occurred, using the low-order bits $S_L$ of the syndrome. It is to be noted that a method of implementing a device that performs coding and a device that performs decoding and error correcting according to the present invention is not limited to the above method. For example, the conventional implementation methods shown by FIGS. 10 (the conventional method (A)) and 11 (the conventional method (B)) may be employed. The features of Embodiment 1 of the present invention are summarized as follows.

(1) <High Code Rate> Because of a high code rate like the extended Hamming coding scheme, it is possible to efficiently transmit information.

(2) <High Performance and Low Power Consumption> By using, as the implementation method, the processor having the dedicated instructions suitable for coding and decoding as shown by FIG. 22, the implementation method makes it possible to flexibly respond to a change of specifications in the same manner as an implementation method using a general-purpose processor and software, and achieves high performance and low power consumption like an implementation method using dedicated hardware. Table 2 shows a comparison of the features of the implementation method according to Embodiment 1 with those of the conventional methods.

(3) <Flexibility toward Change of Specifications> The extended Hamming coding scheme is improved to give symmetry to the expressions for check symbols. Consequently, it is possible to easily perform calculation even when a length of a code word is great. In addition, it is possible to easily respond to a change of the length of the code word.

The feature (1) is an advantage of using a new coding scheme. In addition, the features (2) and (3) are advantages produced by an implementation method for coding and decoding. Table 2 shows a comparison between the conventional methods and the method according to Embodiment 1 regarding the features (2) and (3). It is to be noted that a method according to Example 1 corresponds to the method according to Embodiment 1 in Table 2, and is hereinafter also referred to as a proposed method. In addition, a method (A) and a method (B) correspond to the conventional method (A) and the conventional method (B) in Table 2, respectively.

transmits, to the decoding circuit 124, data and a command indicating a process to be performed (initialization, coding, decoding, and so on), waits until the process is completed, and receives data after correction and status information indicating whether or not an error is present, correctable, or the like.

Since the generator matrix used for coding and the check matrix used for calculating the syndrome have in common in the conventional method (B), when coding and decoding are not simultaneously performed, it is possible to efficiently perform the coding and decoding using the same dedicated hardware circuit. However, since it is necessary to design in advance the internal configuration (size of a register or a memory, a control circuit, and so on) of the dedicated hardware in consideration of a coding scheme to be employed and the upper limit of a code length, excessive specifications must be implemented except for a case where specifications are determined in advance. Such excessive specifications lack flexibility and extensibility.

TABLE 2

| Method | Other methods | | Method according to Embodiment 1 Processor to which dedicated instruction is added (ASIP) |
|---|---|---|---|
| | (A) Implementation using software on general-purpose processor | (B) Implementation using dedicated hardware (ASIC) | |
| Hardware amount | Small (only memory storing program executed by general-purpose processor required) | Large (dedicated operation circuit and controller required) | Larger than method (A) but smaller than method (B) (only dedicated operation circuit required) |
| Execution time (the number of execution cycles) | Long | Shorter than method (A) | Shorter than method (A) (highly likely to be shorter than method (B)) |
| Power consumption | Large | Smaller than method (A) | Small (highly likely to be smaller than method (B)) |
| Flexibility to change of specifications | High (flexible to change of coding scheme or code length) | Low (less flexible to change of coding scheme or code length) | As high as method (A) (flexible to change of coding scheme or code length) |

Since, to calculate a syndrome using the conventional method (A), it is necessary to perform an exclusive-OR operation n×(n−1) times where n is the number of elements of x, the complexity of a calculation time is expressed by $O(n^2)$. Moreover, to detect and correct an error after the calculation of the syndrome for received data, it is necessary to execute, using software, conditional judgment and conditional branching corresponding to the above cases, and a subsequent bit operation.

In contrast, in the conventional method (B), calculations can be efficiently performed with a delay time $O(n)$, using an operation circuit with a high regularity in which exclusive OR operation units are implemented. Moreover, it is possible to implement, using a combinational logic circuit, a calculation of a syndrome for a received code word, error detection, and error correction. However, when a code length is great, it is necessary to perform an operation in clock cycles, and thus a data bus (an operation circuit) and a controller (a sequential circuit) are implemented in combination.

Figure 11:
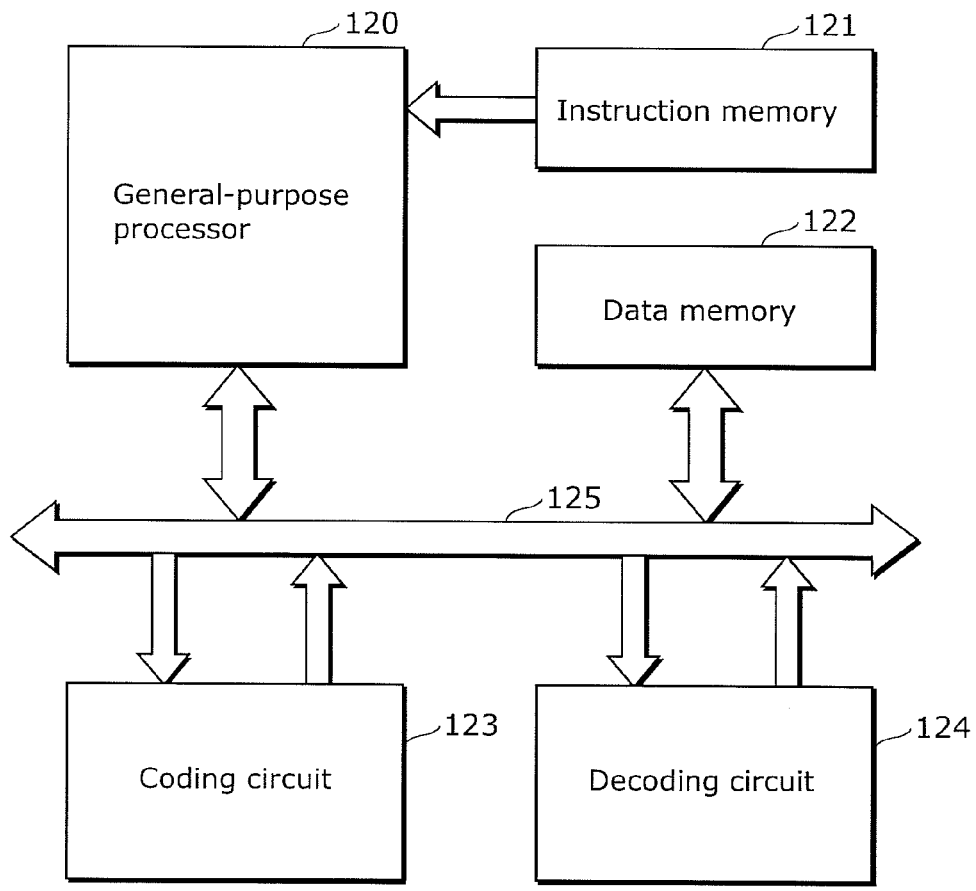
FIG. 11 is a diagram showing implementation of the conventional error-correcting code processing, using a general-purpose processor and a dedicated peripheral circuit (ASIC).

In the conventional method (B), as shown by FIG. 11, it is a standard manner to connect the decoding circuit 124 as a periphery circuit to the data bus 125 of a computer, and exchange data through input to and output from the data memory 122. In this case, the general-purpose processor 120

The implementation method, proposed in Embodiment 1, using a processor to which dedicated instructions are added is a method of efficiently performing coding or decoding by adding, to the RISC processor 222 having a simple instruction set shown by FIG. 22, (1) an instruction for relocating information symbols, (2) an instruction for calculating check symbols or a syndrome, (3) an instruction for detecting and correcting an error, and so on. As shown by Table 2, the proposed method has a feature of achieving the same flexibility and extensibility as those in software processing on a general-purpose processor while providing processing performance (the number of execution cycles) substantially equal to that of the conventional method (B) and having execution capability with less power consumption.

The proposed method is highly likely to perform processing in a smaller number of execution cycles than that of the conventional method (B). This is because of the following reason. In the conventional method (B), it is necessary to execute a protocol for transmitting a command and data to the decoding circuit 124 shown by FIG. 11, checking a status, and obtaining resultant data, and the protocol causes an overhead. In the proposed method, instruction execution corresponds to command execution, and data can be transmitted to the operation circuit, using a register of the processor. As a result, it is possible to reduce the overhead of the protocol that is caused in the conventional method (B). In addition, accordingly, it can be expected that power consumption will be smaller than that of the conventional method (B).

The present invention is applicable to application fields such as error correction in a transmission path such as a memory of a computer and a bus, in addition to the field of information transmission. When a parameter such as the number of bits of data simultaneously forwarded from the memory of the computer or through the transmission path is fixed, implementing the present invention using the dedicated hardware circuit can produce the maximum effect. Moreover, in the case of the information transmission, it is possible to select one of implementing the present invention using the dedicated hardware circuit and implementing the present invention using the application specific instruction-set processor (ASIP), depending on whether or not specifications of a communication mode are fixed.

Embodiment 2

In a high-dimensional parity coding scheme, a code word is generated by adding 2n check symbols to L (=$2^n$) information symbols. FIG. 47 shows expressions for check symbols and a syndrome used in the high-dimensional parity coding scheme. A high-dimensional parity enables single error correction and double error detection. Thus, the high-dimensional parity coding scheme has the same bit error correction and detection capability as the extended Hamming coding scheme or the super extended Hamming coding scheme.

Although the high-dimensional parity coding scheme is inferior in a code rate to the Hamming coding scheme, the extended Hamming coding scheme, and the super Hamming coding scheme, the expressions for the check symbols and the syndrome used in the high-dimensional parity coding scheme have a high regularity. Among the expressions for the check symbols used in the high-dimensional parity coding scheme, the expression $q_{n-1}, q_{n-2}, \ldots, q_0, r$ is the same in format as the expressions for the check symbols in the super Hamming coding scheme. In addition, as shown by FIG. 48, among the expressions for the check symbols used in the high-dimensional parity coding scheme, the expression $p_0, p_1, \ldots, p_{n-1}$ is completely the same in format as the expression $q_0, q_1, \ldots, q_{n-1}$, when the input $x_{n-1}, x_{n-2}, \ldots, x_0$ is reversed in order into $x_0, x_1, \ldots, x_{n-1}$. Thus, it is possible to implement a dedicated instruction for efficiently processing a high-dimensional parity code, by extending the dedicated instruction for the super Hamming code described in Embodiment 1.

When a length of information symbols is stored in words, it is possible to easily extend the dedicated instruction in the same manner as in the case of the super Hamming coding scheme described in Embodiment 1. It is to be noted that a procedure for decoding is as follows.

(1) A syndrome is generated by calculating exclusive OR of received check symbols and check symbols calculated from received information symbols. The syndrome is checked. (a) When all bits are 0, it is determined that no error has occurred, and (b) when at least one bit is not 0, the procedure proceeds to the next step (2).

(2) Exclusive OR of a p component and a q component of the syndrome is calculated. (a) When all bits are 1, it is determined that a single error is in the received information symbols, (b) when only one of bits is 1, it is determined that a single error is in the received check symbols, and (c) when all bits are 0, it is determined that a double error is in the received information symbols.

(3) When the single error is in the received information symbols, an error in the received information symbols that is identified by the q component of the syndrome is corrected.

Embodiment 3

The super Hamming coding scheme is highly flexible for a code length, and thus it is possible to establish a communications system that uses a suitable code length according to a transmission error rate at the time of communication, by taking advantage of the characteristics of the super Hamming coding scheme. For instance, when the transmission error rate is low, transmission efficiency is increased by extending the code length, and it is possible to reduce a processing time overhead and a power consumption. Moreover, when the transmission error rate is high, it is possible to enhance bit error resistance by reducing the code length. An adaptive communication mode that adjusts a code word length in such a manner can be effectively applied to the following situations (a) and (b).

Figure 49:
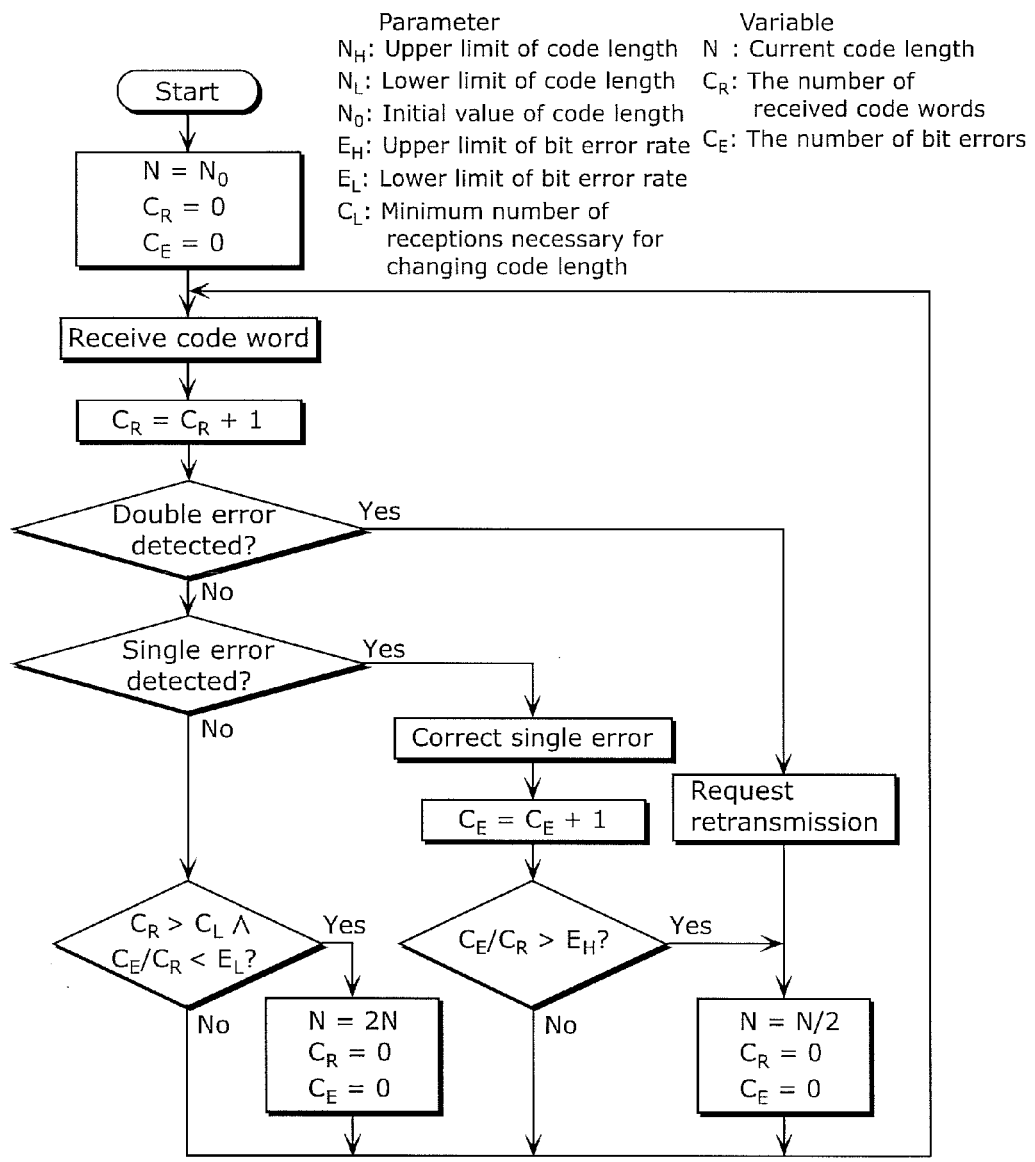
FIG. 49 is a flow chart showing an exemplary procedure for adjusting a code word length in an adaptive code word length adjustment communication mode according to the present invention.

(a) Application to a communication path whose bit error rate is unknown (b) Application to a communication path whose bit error rate slowly varies with time FIG. 49 shows an exemplary procedure for adjusting a code word length. When a code length is changed, both a transmission system and a receiving system need to change settings of a transmission and receiving system, and thus the changes in the settings cause a time overhead and an energy (power consumption) overhead. Thus, it is not desirable to frequently change the code word length. In the code word length adjustment procedure, adjusting a code word length using two threshold values ($E_H$, $E_L$) of a bit error rate eliminates the need for frequently changing the code word length in regard to a tiny variation in the bit error rate. A response (sensitivity) to the variation in the bit error rate in the code word length adjustment procedure can be controlled by adjusting values of parameters $E_H$, $E_L$, and $C_L$.

Embodiment 4

When a mobile terminal that performs data transmission is used in an environment where there is a possibility that errors of consecutive bits (hereafter, referred to as a burst error) occur during transmission, a cyclic redundancy checking (CRC) coding scheme that has a small amount of calculation and requires no complex operation among burst error detection coding schemes is employed as an error detecting and correcting method.

The following describes an error-correcting code processing method based on the CRC coding scheme according to Embodiment 4 of the present invention. Here, a CRC coding method of the present invention includes a check symbol calculation method performed by a circuit (1) below. In addition, a CRC decoding method of the present invention includes a syndrome calculation method performed by a circuit (2) below and an error correction method performed by a circuit (3) below.

(1) Check Symbol Calculating Circuit

Check symbols in the CRC coding scheme are calculated by a remainder of generator polynomial $g(x)$ of information symbols X. Here, the information symbols X is expressed by Equation 14.

[Math. 14]

$$X = \sum_{i=0}^{k} \alpha_i x^i$$ (Equation 14)

A coefficient $\alpha_i$ of x' is calculated in a Galois field of 2, and addition of coefficients is calculated as exclusive OR. On a computer, information is expressed in a bit string in which the coefficient $\alpha_i$ of $x^i$ is placed at i-th bit.

Figure 50:
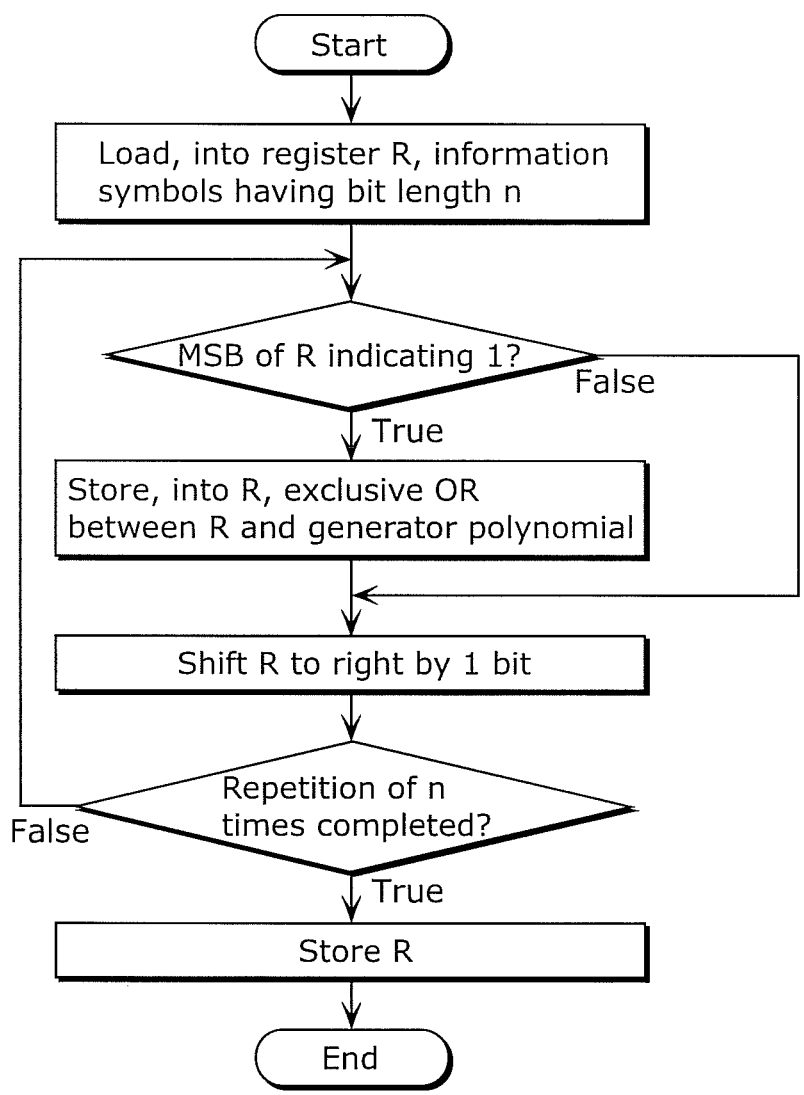
FIG. 50 is a flow chart showing a calculation flow for check symbols in a conventional CRC coding scheme.

FIG. 50 shows a calculation flow for check symbols in the CRC coding scheme. A residue for calculating check symbols in the coding method using a generator polynomial is calculated in the following (a) to (d) steps. The steps (b) and (c) need to be repeated plural times.

(a) Use an initial value $A_0$ of intermediate data $A_j$ as information symbols (b) Shift the intermediate data $A_j$ by 1 bit to obtain data A;

(c) Calculate, when the most significant bit of $A'_j$ is 1, exclusive OR of $A'_j$ and a bit string indicating a generator polynomial, to obtain intermediate data $A_{j+1}$ for the next step (d) Where a bit width of the information symbols is $L_i$, when $j<L_i-1$, return to (b) as j=j+1, and when $j=L_i-1$, use $A'_{Li-1}$ (i is a subscript) as check symbols Hereafter, the steps (b) and (c) are expressed as an operation (A).

The operation (A) allows the calculation of the check symbols to arrive at a matrix operation in the format of $A_{j+1}=A_j G$. In addition, the operation successively performed n times can be expressed as $A_{j+1}=A_j G^n$. In the present invention, using a circuit that multiplies given n by $G^n$ increases a speed of the calculation of the check symbols. FIG. 51 shows G corresponding to the generator polynomial $x^8+x^2+x+1$.

When a bit width of information symbols is L, and a bit width of check symbols is $L_c$, a check symbol calculation process can be expressed by Equation 15.

[Math. 15]

$$\left( x^{L_c} \sum_{k=0}^{L_i} \alpha_k x^k \right) \mod g(x)$$ (Equation 15)

Here, when $L_c<L_d<L_i+L_c$, the check symbol calculation process can be recursively divided by Equation 16.

[Math. 16]

$$\left( x^{L_c} \sum_{k=0}^{L_i} \alpha_k x^k \right) \mod g(x) = \left( \left( x^{L_c} \sum_{k=0}^{L_d-L_c-1} \alpha_k x^k \right) \mod g(x) \right) + \left( \left( x^{L_d} \sum_{k=0}^{L_i+L_c-L_d-1} \alpha_{k+L_d} x^k \right) \mod g(x) \right)$$ (Equation 16)

The process is divided into units of n bits using Equation 16, and the speed of the calculation of the check symbols is increased using a circuit that calculates $G^{2n}$ and $G^n$. For example, when a check matrix is calculated in units of 8 bits, $G^8$ or $G^{16}$ is used. FIGS. 52 and 53 show $G^8$ and $G^{16}$ corresponding to the generator polynomial $x^8+x^2+x+1$, respectively.

Figure 54:
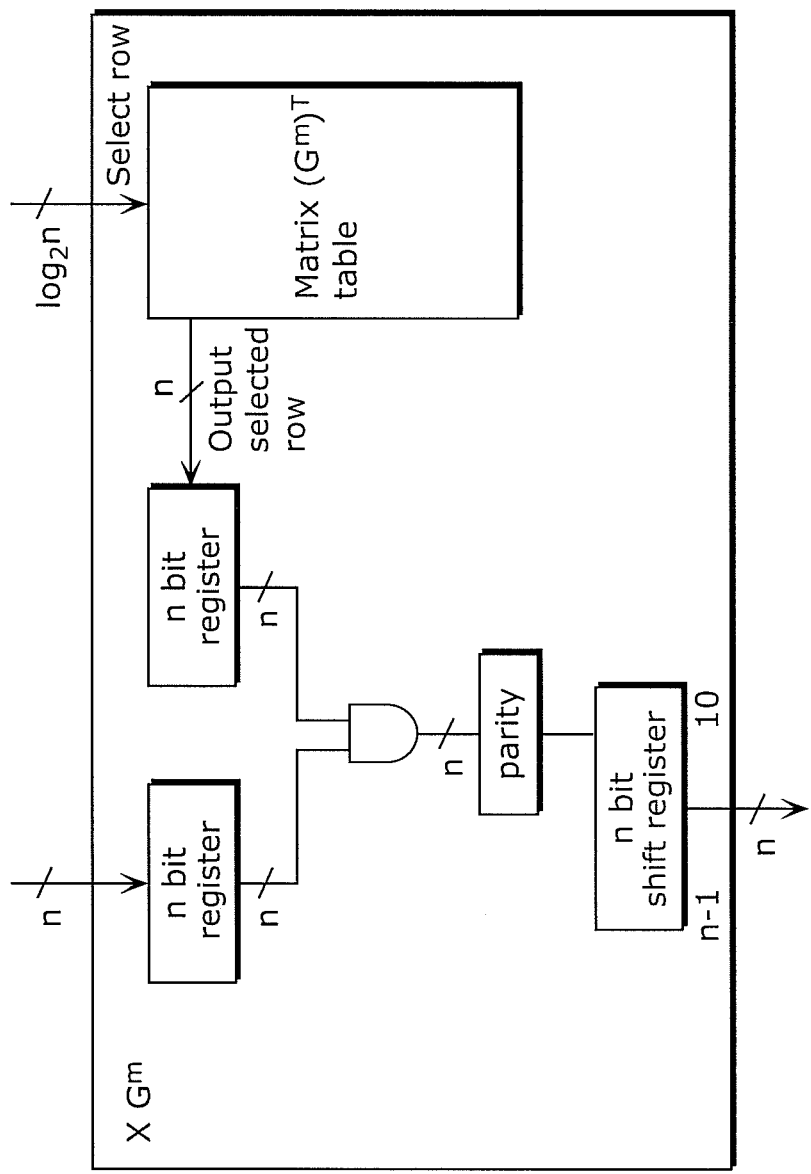
FIG. 54 is a diagram showing a configuration of a $\times G^m$ dedicated operation unit (n-cycle version) in a CRC coding scheme according to the present invention.

Configuring a dedicated operation unit that multiplies $G^m$ as shown by FIG. 54 allows the generator polynomial to dynamically change. The following describes a method of performing, in n cycles, a calculation in the operation (A), based on (i) to (vi).

(i) An n-bit input data register is included. Inputted data is stored in the input data register.

(ii) An n-bit row storage register and n bits x n bits matrix table are included. The matrix table specifies a row, and outputs information in the specified row to the row storage register. It is to be noted that a matrix $(G^m)^T$ table in FIG. 54 is obtained by arranging, in a table, a transposed matrix of a matrix indicating $G^m$. For instance, a table for a dedicated operation unit that multiplies $G^8$ in the generator polynomial $x^8+x^2+x+1$ is formed as shown by FIG. 55. The matrix table is implemented using, for example, a RAM or registers.

(iii) An n-bit 2-input AND operation unit is included. The AND operation unit outputs a logical product of the input data register and the row storage register.

(iv) An n-bit parity operation unit is included. The parity operation unit outputs exclusive OR of all bits for the output of the AND operation unit.

(v) An n-bit shift register is included. The shift register stores a calculation result of the parity operation unit into the least significant bit. In addition, upon receiving a shift signal, the shift register shifts a stored value by 1 bit to the left.

(vi) An output of the shift register is used as an output of the operation unit.

Figure 56:
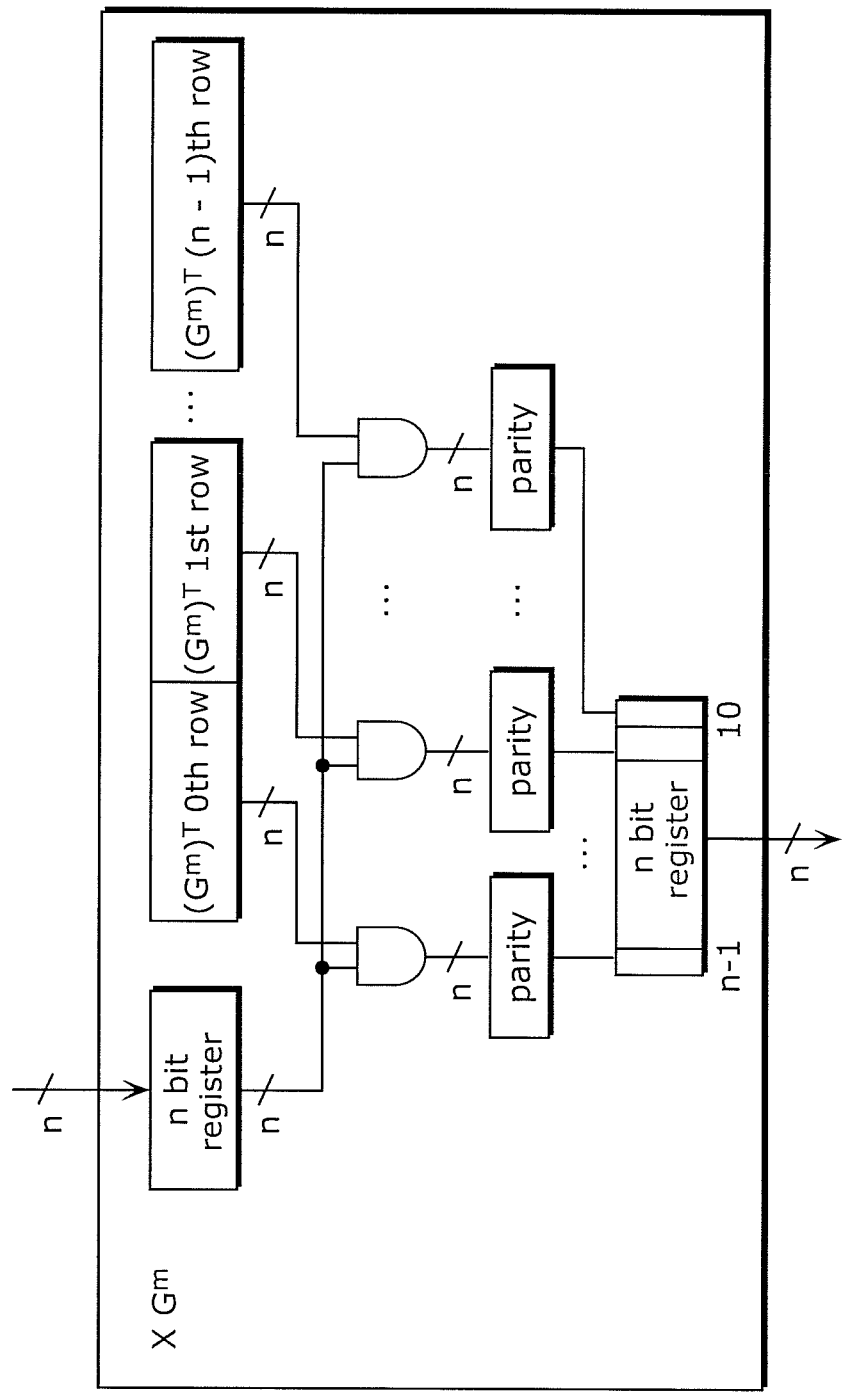
FIG. 56 is a diagram showing a configuration of a $\times G^m$ dedicated operation unit (one-cycle version) in the CRC coding scheme according to the present invention.

It is to be noted that the dedicated operation unit that multiplies $G^m$ may be formed as shown by FIG. 56. In FIG. 56, using a dedicated operation unit that processes, in parallel, the operations in (ii) to (v) makes the process n-parallelized, and it is possible to perform the same operation as in FIG. 54 in one cycle.

Figure 57:
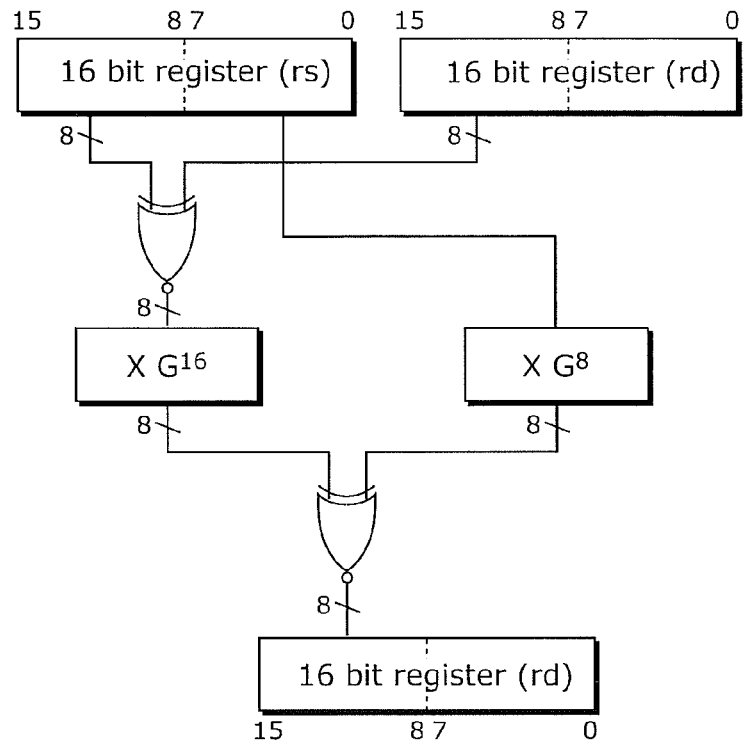
FIG. 57 is a diagram showing a configuration of a check symbol calculation circuit in the CRC coding scheme according to the present invention.

FIG. 57 shows exemplary check symbol calculating circuit implementation. FIG. 57 shows a circuit for incorporating a (24, 16) CRC code processing circuit into a 16-bit processor. $x^8+x^2+x+1$ is used as a generator polynomial. $G^8$ and $G^{16}$ in FIG. 57 are a circuit that multiplies the matrix shown by FIG. 52 and a circuit that multiplies the matrix shown by FIG. 53, respectively. The circuit shown by FIG. 57 inputs a value when check symbols are being calculated into a rd register, and sequentially inputs information symbols into a rs register, to (i) perform the operation (A) 16 times in one cycle when the dedicated operation unit shown by FIG. 54 is used or in eight cycles when the dedicated operation unit shown by FIG. 56 is used and (ii) write back, to the rd register, a halfway result of the next check symbols obtained as a result.

(2) Syndrome Calculating Circuit

Calculation of a syndrome from a code word in the CRC coding scheme is the same as the calculation of the check symbols from the information symbols. Thus, the check symbol calculating circuit described in (1) is used for the calculation of the syndrome, and accordingly a description thereof is omitted.

(3) Error Correction Circuit

In the CRC coding scheme, an error location of a single error is calculated from the syndrome obtained by the syndrome calculating circuit described in (2).

When a bit width of information symbols is $L_i$, a bit width of check symbols are $L_c$, and an error is at an e-th bit, calculation of a syndrome is expressed by FIG. 17.

[Math. 17]

$$\left( x^e + x^{L_c} \sum_{k=0}^{L_i} \alpha_k x^k \right) \mod g(x) \quad \text{(Equation 17)}$$

Moreover, since Equation 18 shown below is divisible without residue by g(x) due to the nature of the CRC coding scheme, the syndrome is expressed by Equation 19.

[Math. 18]

$$x^{L_c} \sum_{k=0}^{L_i} \alpha_k x^k \quad \text{(Equation 18)}$$

[Math. 19]

$$x^e \mod g(x) \quad \text{(Equation 19)}$$

Since g(x) is a polynomial greater than or equal to $L_c$ order, when a single error is in low-order $L_c$ bits, that is, $e<L_c$, $x^e$ mod $g(x)=x^e$, and thus the error location matches e.

The following (i) and (ii) describe error correction for a case where the single error is in the low-order $L_c$ bits and a case other than the case, respectively.

(i) Case where the Single Error is in the Low-Order $L_c$ Bits

When the single error is in the low-order $L_c$ bits of the code word in which the bit width of the check symbols is $L_c$, a location of a bit being 1 in the syndrome matches a location of the error bit. Only when the single error is in the $L_c$ bits from low order, a total number of bits being 1 in the syndrome is one.

(Ii) Case where the Single Error does not Occur in the Low-Order $L_c$ Bits

When a syndrome corresponding to a code word Y is S', a syndrome S' corresponding to a bit string Y' obtained by shifting the code word Y by k bits to the right matches S'×G$^{-n}$. Multiplication of G$^{-n}$ represents multiplication of an inverse matrix of G n times which is used by the check symbol calculating circuit.

The code word is shifted by k bits to the right, and simultaneously the syndrome is multiplied by G$^{-k}$. Here, when a total number of bits being 1 is one in a bit string S' obtained by multiplying the syndrome by G$^{-k}$, it is determined that the single error is in the $L_c$ bits from low order, and the error is corrected. When the total number of the bits being 1 is greater than or equal to two in S', the above operation is repeated.

When the generator polynomial is dynamically changed also in the error correction circuit, the dedicated operation unit that multiplies G$^m$ is configured as shown by FIG. 54 or FIG. 56 in the same manner as the check symbol calculation.

Figure 58:
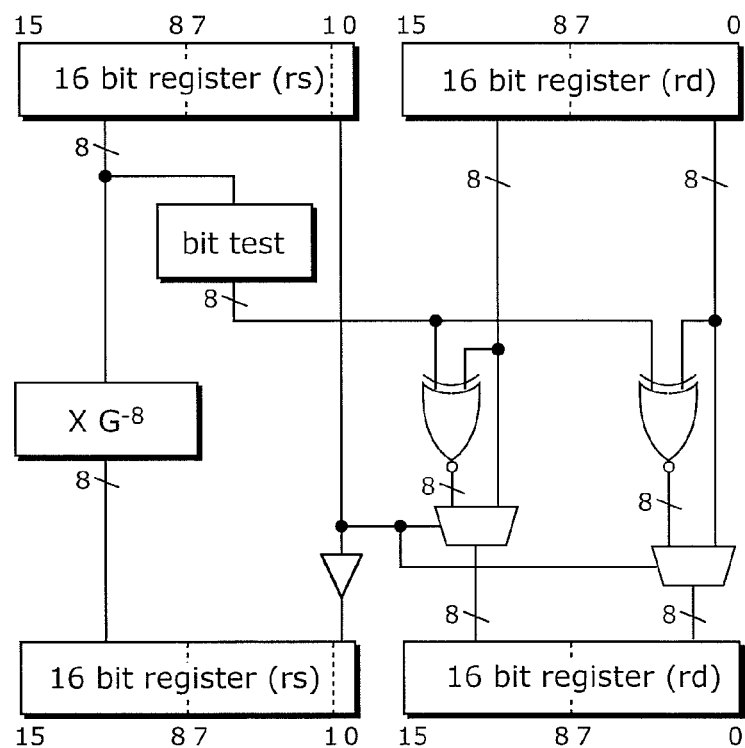
FIG. 58 is a diagram showing a configuration of an error correction circuit in the CRC coding scheme according to the present invention.

FIG. 58 shows exemplary error correction circuit implementation. FIG. 58 shows a circuit for incorporating a (24, 16) CRC code processing circuit into a 16-bit processor. $x^8+x^2+x+1$ is used as a generator polynomial. Bit test in FIG. 58 is a circuit that outputs an input value in the case where the input value includes only one bit being 1 and outputs 0 for a case other than the case. Moreover, G$^{-8}$ in FIG. 58 is a circuit that multiplies a matrix shown by FIG. 59. The circuit shown by FIG. 58 inputs a code word into a rd register and a syndrome into high-order 8 bits of a rs register, to (i) perform the operation (A) in two cycles when the dedicated operation unit shown by FIG. 54 is used or in 16 cycles when the dedicated operation unit shown by FIG. 56 is used and (ii) write back a corrected code word to the rd register.

The following summarizes steps of a coding method and a decoding method in the CRC coding scheme. When coefficients of a remainder polynomial are calculated, as check symbols, through a first operation, a code word is generated by combining the check symbols and information symbols, and the code word is transmitted as data, the first operation being calculating a remainder by dividing, by a generator polynomial, a shift information symbol polynomial obtained by multiplying, by $x^k$ (k is a degree of the generator polynomial), an information symbol polynomial obtained by expressing the information symbols in a polynomial having x as a variable (modulo 2), a coding process is performed using a method including: generating, by multiplying only a matrix G by a matrix G a predetermined number of times in advance, a submatrix that represents a sub operation unit of the first operation after a second operation is repeated the predetermined number of times, the second operation being (i) deleting in stages each of terms from a highest degree of the variable x of the shift information symbol polynomial in the first operation by multiplying the generator polynomial by a power of the variable x and subtracting the product from each term and (ii) represented by a product of a vector obtained by arranging coefficients of the shift information symbol polynomial and a corresponding matrix G and a product of a vector obtained by arranging remainder coefficients of the shift information symbol polynomial still in one of the stages of the deletion and a corresponding matrix G; and generating the check symbols by sequentially performing an operation starting from calculating, as a remainder vector still in one of the stages, a product of a vector of the shift information symbol polynomial and the submatrix, to calculating, as a next remainder vector still in one of the stages, a product of the remainder vector still in the stage and the submatrix for each of the predetermined number of times. When a received code word that is data obtained by receiving the code word transmitted as data is decoded, a decoding process is performed using a method including: generating a syndrome by sequentially performing, in a fourth operation that is deleting in stages each of terms from a highest order of a variable x of a received code word polynomial in a third operation by multiplying the generator polynomial of Claim 10 by a power of the variable x and subtracting the product from each term, an operation starting from calculating, as a remainder vector still in one of the stages, a product of a vector of the received code word polynomial and the submatrix of Claim 10, to calculating, as a next remainder vector still in one of the stages, a product of the submatrix and a remainder vector still in the stage for each of a predetermined number of times, when coefficients of a remainder polynomial are generated as the syndrome, the received code word polynomial being obtained by expressing the received code word in a polynomial, and the third operation being calculating a remainder by dividing the received code word polynomial by the generator polynomial; calculating in advance an inverse matrix of the submatrix; determining, based on the syndrome, presence or absence, and a type, of an error; correcting the received code word by inverting a value of a bit of the received code word which is identified by a bit location where the bit is 1 in the syndrome, when, in the case where a total number of bits being 1 in the syndrome is one, it is determined that a single error is present in a bit width of check symbols from a low order of the received code word; and correcting the received code word by inverting a value of a bit identified by a bit location where the bit is 1 in a bit width at a t+1-th (t is an integer greater than or equal to 1) position from a low order of the received code word in a t-th syndrome resulting from repeatedly multiplying the syndrome by the inverse matrix, when, in the case where a total number of bits being 1 in the syndrome is two or more and a total number of bits being 1 in the t-th syndrome is one, it is determined that a single error is present in a bit width at the t+1-th position from the low order of the received cord word with a bit width of the check symbols being a unit width.

A CRC coding method for generating a code word and transmitting the code word as data, wherein when the number of bits of one word is a natural number multiple m of a bit length k of the check symbols, and the data has a length of M words, in the generating of a submatrix, the submatrix includes m product matrices $G^{mk}$, $G^{(m-1)k}$, $G^{(m-2)k}$, ..., $G^k$ with the predetermined number of times being mk, (m−1)k, ..., k each of which is a multiple of k, and when, in the generating of the check symbols, dividing the vector of the shift information symbol polynomial into words and sequentially performing a collective operation for each of the words, instead of sequentially performing the operation starting from calculating the vector of the shift information symbol polynomial, to calculating the remainder vector still in the stage for each of the predetermined number of times, the one word is divided into vectors each having a bit width k and including k elements, and exclusive OR of elements of (i) a vector and elements of (ii) a vector resulting from multiplying each of (m−1) vectors by a corresponding one of the matrices $G^{(m-1)k}$, $G^{(m-2)k}$, ..., $G^k$ is calculated as the collective operation for each word, (i) the vector being obtained by calculating exclusive OR of elements of a vector resulting from multiplying, among the vectors, a first vector by the product matrix $G^{mk}$ and elements of a vector resulting from the collective operation performed for a word previous to the word, and the (m−1) vectors each being subsequent to the first vector including the k elements and including the k elements.

A CRC decoding method for decoding a received code word that is data obtained by receiving the code word transmitted as data, wherein when the number of bits of one word is a natural number multiple m of a bit length k of the check symbols, and the data has a length of M words, in the generating, the submatrix includes m product matrices $G^{mk}$, $G^{(m-1)k}$, $G^{(m-2)k}$, ..., $G^k$ with the predetermined number of times being mk, (m−1)k, ..., k each of which is a multiple of k, when, in the generating of a syndrome, dividing the vector of the received code word polynomial on a word basis and performing a collective operation for each of the words, instead of sequentially performing the operation starting from calculating the vector of the shift information symbol polynomial, to calculating the remainder vector still in the stage for each of the predetermined number of times in the generating of the check symbols, the one word is divided into vectors each having a bit width k and including k elements, and exclusive OR of elements of (i) a vector and elements of (ii) a vector resulting from multiplying each of (m−1) vectors by a corresponding one of the matrices $G^{(m-1)k}$, $G^{(m-2)k}$, ..., $G^k$ is calculated as the collective operation for each word, (i) the vector being obtained by calculating exclusive OR of elements of a vector resulting from multiplying, among the vectors, a first vector by the product matrix $G^{mk}$ and elements of a vector resulting from the collective operation performed for a word previous to the word, and the (m−1) vectors each being subsequent to the vector including the k elements and including the k elements, and the inverse matrix is an inverse matrix $G^{-k}$ of $G^k$.

Embodiment 5

Conventional methods of adding, to a processor-based system, a coding function and a decoding function that are based on the CRC coding scheme can be classified into the following three types: (1) Implementation using software on a general-purpose processor (hereafter, referred to as a conventional method (1)); (2) Implementation by adding dedicated hardware (ASIC) (hereafter, referred to as a conventional method (2)); and (3) Implementation by adding dynamically reconfigurable hardware (hereafter, referred to as a conventional method (3)). The methods have the trade-offs as indicated below.

In the conventional method (1), although it is not necessary to add hardware since a general-purpose processor that is used for original processing can be directly used and it is possible to easily address a change of a coding scheme or a change of a code length, an execution time is long due to a large number of execution cycles, and power consumption is large.

In the conventional method (2), although the number of execution cycles is small since a dedicated circuit can be used, an amount of hardware to be added for implementation is large, and further it is not possible to easily address the change of the coding scheme or the change of the code length.

In the conventional method (3), although it is possible to change specifications of a generator polynomial or a code length by dynamically reconfiguring a circuit, power consumption is large and an amount of hardware required for implementation is also large.

As a result of further miniaturization of semiconductors, an integration degree and a clock frequency of VLSI are increased, and performance of the VLSI is enhanced. However, consequently, a power consumption of the VLSI is likely to increase. In particular, the general-purpose processor has a significant problem that an amount of heat generation and a temperature are increased with the increase in the power consumption. The conventional method (2) is superior in power consumption to the conventional method (1), but has difficulty flexibly responding to the change of specifications. Moreover, the conventional method (3) using hardware that flexibly responds to the change of specifications is not suitable for power saving, because the hardware consumes a lot of power. Thus, a problem to be solved is to develop an implementation method that flexibly responds to error resilience of a code or a change of code length, consumes less power, and requires less execution time. However, as stated above, the convention methods have difficulty meeting such a demand.

In response, an implementation method according to Embodiment 5 of the present invention (hereafter, referred to as a proposed method (1)) implements an error-correcting code processing device by using the calculation of the check symbols according to Embodiment 4 and a processor having dedicated instructions for calculating a syndrome and correcting an error.

Figures 59, 60A:
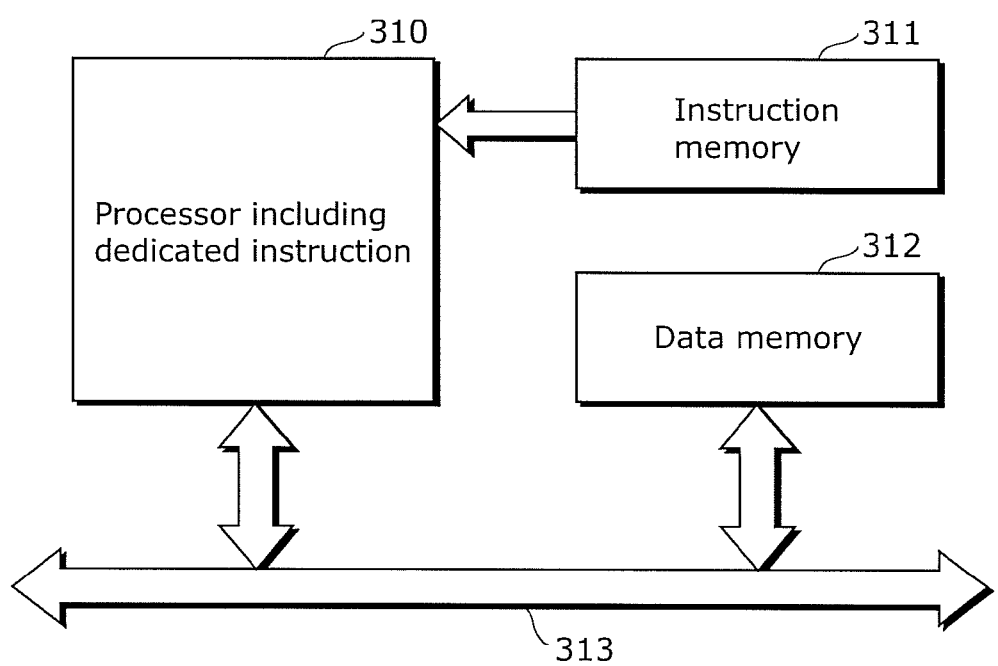
FIG. 59 is a diagram showing a matrix representing $G^{-8}$ according to the present invention.
FIG. 60A is a diagram showing a configuration of a proposed method (1) according to the present invention.

FIG. 60A is a diagram showing a configuration of the proposed method (1) according to the present invention. In FIG. 60A, an instruction memory 311 and a data memory 312 are outside of a processor 310 that includes dedicated instructions. The instruction memory 311 holds instructions including dedicated instructions for calculating check symbols, calculating a syndrome, and correcting an error. The processor 310 including the dedicated instructions performs a coding operation and a decoding operation in the error-correcting code processing according to an instruction read from the instruction memory 311. Moreover, the processor 310 including the dedicated instructions reads data held by the data memory 312 via a data bus 313, according to an instruction read by the instruction memory 311. Furthermore, the processor 310 including the dedicated instructions stores a result of an operation performed by the processor 310, into the data memory 312 via the data bus 313.

The proposed method (1) has the following features (a) to (c).

(a) Like an implementation method using dedicated hardware and reconfigurable hardware, an execution time is short.

(b) Like an implementation method using a general-purpose processor, a power consumption is low.

(c) Like an implementation method using a general-purpose processor and reconfigurable hardware, it is possible to flexibly respond to error resilience of a code or a change of a code length.

Table 3 shows a summary of features of the conventional methods (1) to (3) and the proposed method (1).

TABLE 3

|  | Conventional method (1) | Conventional method (2) | Conventional method (3) | Proposed method (1) |
|---|---|---|---|---|
| Execution time | X Long | ○ Short | ○ Short | ○ Short |
| Hardware amount to be added | ○ None | X Large | X Large | ○ Small |
| Increase in power consumption | ○ None | Δ Small | X Large | ○ Little |
| Flexibility to change of specifications | ○ High | X Low | ○ High | ○ High |

It is to be noted that a method of implementing a device that performs coding and a device that performs decoding according to the present invention is not limited to the proposed method (1). For instance, the following proposed methods (2) and (3) make it possible to implement the device that performs coding and the device that performs decoding.

The proposed method (2) is a method that uses the dedicated processor used in the proposed method (1), for check symbol/syndrome calculation, and uses table lookup, a conventional method, for error correction.

Figure 60B:
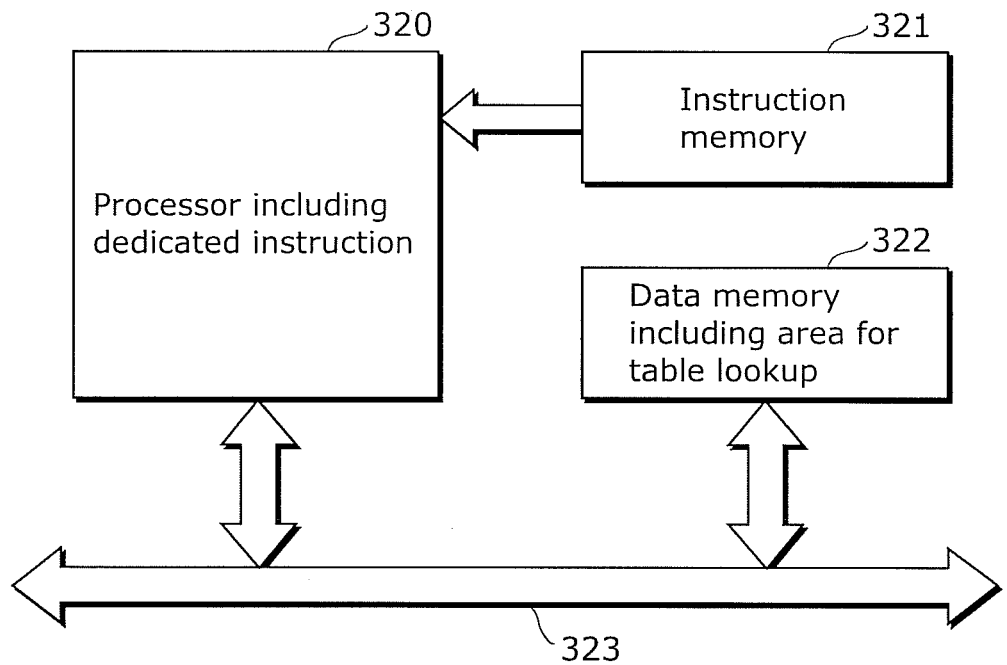
FIG. 60B is a diagram showing a configuration of a proposed method (2) according to the present invention.

FIG. 60B is a diagram showing a configuration of the proposed method (2) according to the present invention. In FIG. 60B, an instruction memory 321 and a data memory 322 including an area for table lookup are outside of a processor 320 that includes dedicated instructions. The instruction memory 321 holds instructions including dedicated instructions for calculating check symbols, calculating a syndrome, and correcting an error. The processor 320 including the dedicated instructions performs a coding operation and a decoding operation in the error-correcting code processing according to an instruction read from the instruction memory 321. Moreover, the processor 320 including the dedicated instructions reads data held by the data memory 322 including an area for table lookup via a data bus 323, according to an instruction read by the instruction memory 321. Here, the data memory 322 including an area for table lookup is a memory including an area for table lookup that holds a look-up table for calculating an error location. Furthermore, the processor 320 including the dedicated instructions stores a result of an operation performed by the processor 320, into the data memory 322 including an area for table lookup via the data bus 323.

Although the proposed method (1) requires, for calculation of an error location, the number of cycles proportional to a code length, the proposed method (2) makes it possible to perform the calculation in the number of cycles for a single memory access, by using table lookup. However, since a memory area necessary for storing data for table lookup significantly increases, the proposed method (2) needs to further increase an amount of a data memory in comparison with the proposed method (1).

The proposed method (3) is a method of configuring a dedicated operation unit that performs $\times G^m$ in addition to check symbol/syndrome calculation and error correction, by using reconfigurable hardware such as a FPGA (Field-Programmable Gate Array).

Figure 60C:
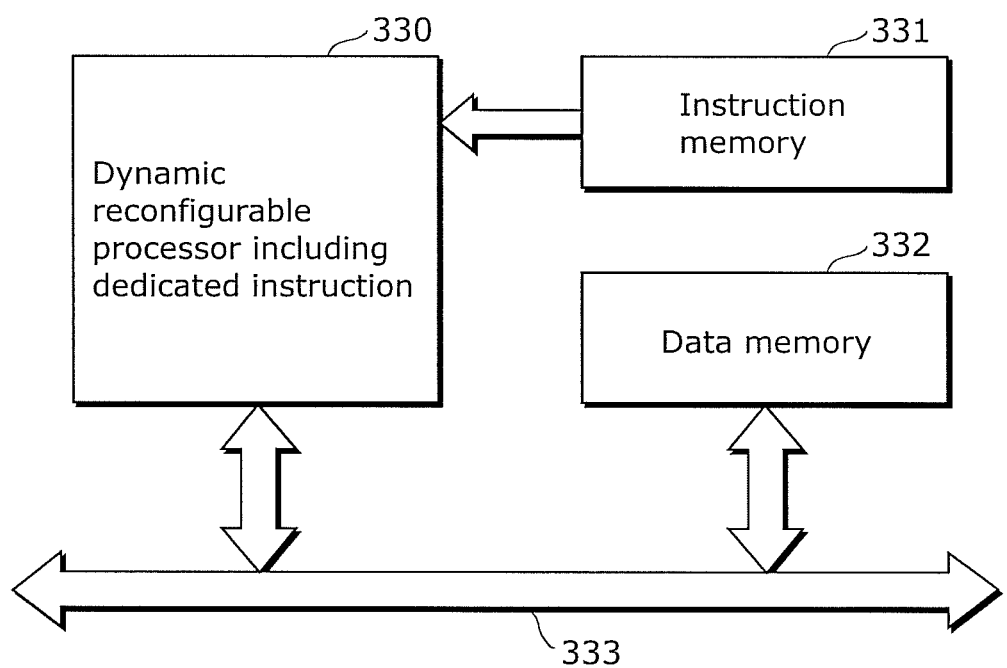
FIG. 60C is a diagram showing a configuration of a proposed method (3) according to the present invention.

FIG. 60C is a diagram showing a configuration of the proposed method (3) according to the present invention. In FIG. 60C, an instruction memory 331 and a data memory 332 are outside of a dynamically reconfigurable processor 330 that includes dedicated instructions. The instruction memory 331 holds instructions including dedicated instructions for calculating check symbols, calculating a syndrome, and correcting an error. The dynamically reconfigurable processor 330 including the dedicated instructions performs a coding operation and a decoding operation in the error-correcting code processing according to an instruction read from the instruction memory 331. Moreover, the dynamically reconfigurable processor 330 including the dedicated instructions reads data held by the data memory 332 via a data bus 333, according to an instruction read from the instruction memory 331. Furthermore, the dynamically reconfigurable processor 330 including the dedicated instructions stores a result of an operation performed by the dynamically reconfigurable processor 330, into the data memory 332 via the data bus 333.

Figure 61:
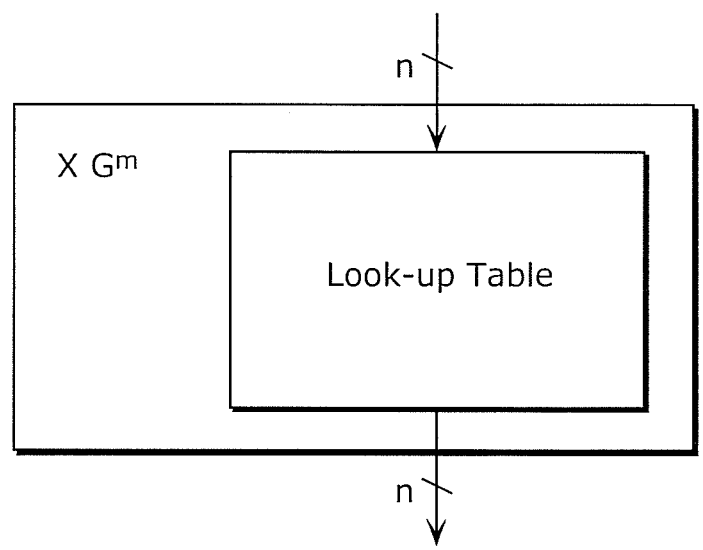
FIG. 61 is a diagram showing a configuration of a $\times G^m$ dedicated operation unit in FIG. 60C and according to the present invention.

As shown by FIG. 61, the proposed method (3) makes it possible to configure the dedicated operation unit that performs $\times G^m$, by using a look-up table of the FPGA, and thus enables fast operation on equal terms with the proposed method (1). It is to be noted that when a base system to which an ECC (Error Checking and Correction) instruction is added includes reconfigurable hardware, the proposed method (3) does not require that hardware be added.

Table 4 shows a summary of check symbol/syndrome calculation and error correction in the proposed methods (1) to (3).

TABLE 4

|  | Check symbol/ Syndrome calculation | Error correction |
|---|---|---|
| Proposed method (1) | Calculate using dedicated instruction of dedicated processor | Calculate using dedicated instruction of dedicated processor |
| Proposed method (2) | Calculate using dedicated instruction of dedicated processor | Calculate by table lookup |
| Proposed method (3) | Calculate using dedicated instruction of processor provided on FPGA | Calculate using dedicated instruction of processor provided on FPGA |

Table 5 shows a summary of features of the proposed methods (1) to (3).

TABLE 5

|  | Execution time | Hardware amount to be added | Increase in power consumption | Flexibility to change of specifications |
|---|---|---|---|---|
| Proposed method (1) | ○ Short | ○ Small | ○ Little | ○ High |
| Proposed method (2) | ⊚ Shorter than proposed method (1) | Δ Slightly small | Δ Small | ○ High |

TABLE 5-continued

|  | Execution time | Hardware amount to be added | Increase in power consumption | Flexibility to change of specifications |
|---|---|---|---|---|
| Proposed method (3) | ○ Short | ○ None | ○ None | ○ High |

Embodiment 6

Figure 62:
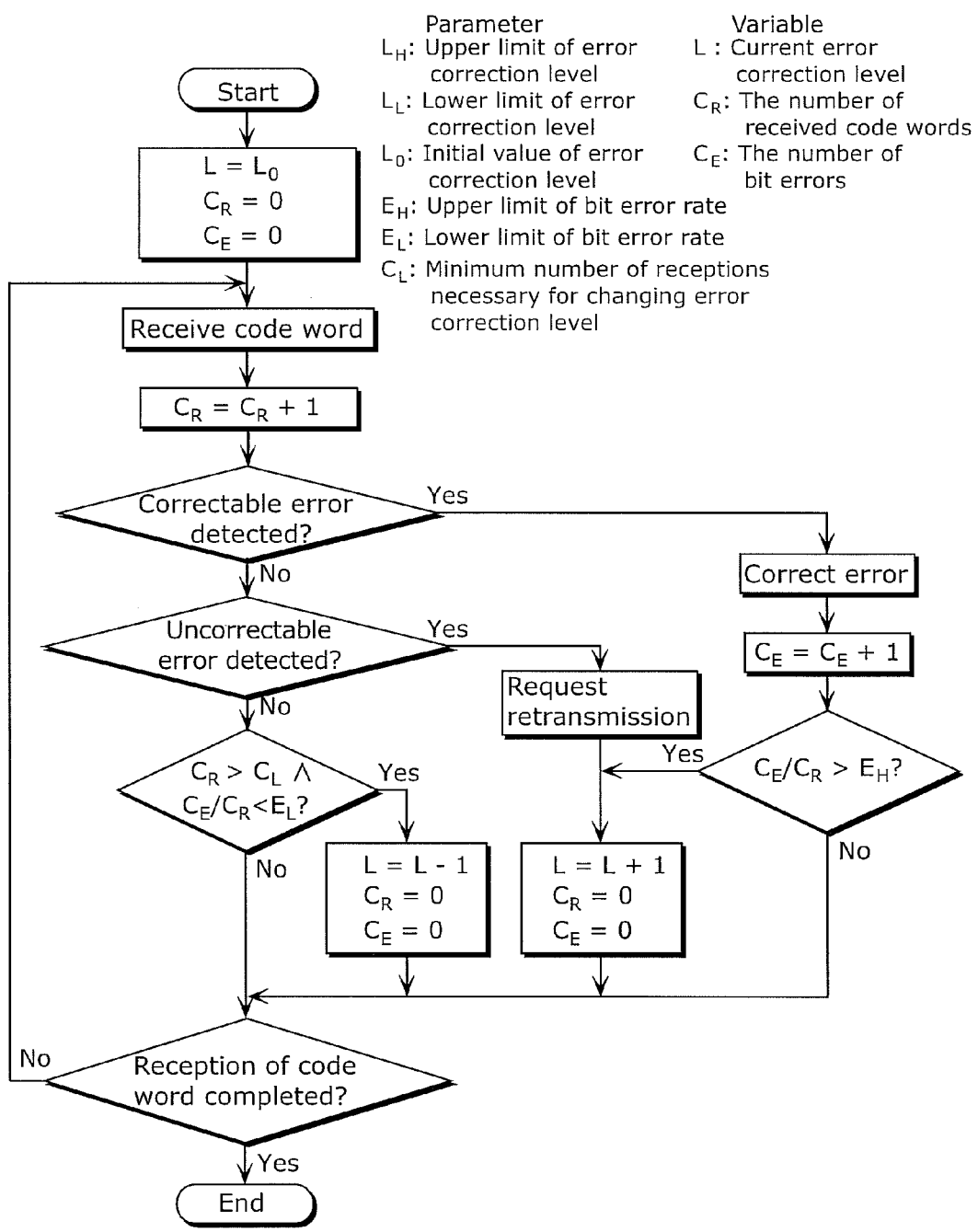
FIG. 62 is a flow chart showing an exemplary procedure for adjusting a code word length and a generator polynomial (a receiving side) according to the present invention.

FIG. 62 and Table 6 show, as Embodiment 6, an exemplary procedure for adjusting a code word length and a generator polynomial (a receiving side).

TABLE 6

| Error correction level L | 1 | 2 | 3 | 4 | 5 | 6 |
|---|---|---|---|---|---|---|
| Generator polynomial | CRC-16 | | | CRC-8 | | |
| Code length | 256 | 128 | 64 | 32 | 16 | 8 |

There are, for example, six error correction levels as shown by Table 6, and a generator polynomial and a code length to be used are determined in advance for each level. Here, an 8-bit CRC (CRC-8) and a 16-bit CRC (CRC-16) (specifically, $x^8+x^2+x+1$ and $x^{16}+x^{15}+x^2+1$) are used as generator polynomials.

In FIG. 62, the number of received code words $C_R$ is counted, the number of bit errors $C_E$ is counted when a correctable error is detected, and a bit error rate $C_E/C_R$ is calculated as an index of a transmission error rate.

When the code length or the generator polynomial is changed, both a transmission system and a receiving system need to change settings of a transmission and receiving system, and thus the changes in the settings cause a time overhead and an energy (power consumption) overhead. Thus, it is not desirable to frequently change the code word length or the generator polynomial. In the code word length and generator polynomial adjustment procedure, adjusting a code word length using two threshold values ($E_H$, $E_L$) of a bit error rate eliminates the need for frequently changing the code word length in regard to a tiny variation in the bit error rate.

In other words, in the receiving system, when, for instance, the bit error rate $C_E/C_R$ exceeds $E_H$ as shown by FIG. 62, an error correction level L is increased, and when an error is not detected (error detection processing not shown), the number of received code words $C_R$ exceeds a minimum number of receptions $C_L$ necessary for changing an error correction level, and the bit error rate $C_E/C_R$ is less than $E_L$, the error correction level L is decreased. In addition, in the receiving system, when exceeding an upper limit of an error correction level $L_H$ as a result of calculation of L+1, the error correction level L is $L_H$, and when being less than a lower limit of error correction level $L_L$ as a result of calculation of L−1, the error correction level L is $L_L$. By notifying the error correction level calculated by the receiving system of the transmission system, both the transmission system and the receiving system make it possible to change the setting of the transmission and receiving system.

A response (sensitivity) to the variation in the bit error rate in the code word length and generator polynomial adjustment procedure can be controlled by adjusting values of parameters $E_H$, $E_L$, and $C_L$.

With this, it is possible to adaptively change the code length according to the bit error rate, thereby (i) using an error correcting code having a long code length and high coding efficiency, in communication with less errors, (ii) using an error correcting code having a short code length and high error correctability, in communication with more errors, and (iii) selecting a code length having as high communication efficiency as possible while decreasing the number of retransmissions of information, to reduce power consumption necessary for communication.

Example

Next, an experiment has been made to check the effects of the error-correcting code processing device according to Embodiment 5 of the present invention, and the experimental result is described with reference to Table 7.

Table 7 shows a comparison of the numbers of execution cycles when an error-correcting code processing device is implemented in the CRC coding scheme by using a general-purpose processor and a processor into which the circuit according to Embodiment 4 is incorporated. Here, a method of using the processor into which one of the circuits configured as shown by FIGS. 56 to 58 is incorporated is referred to as a proposed method (1), and a method of using the general-purpose processor is referred to as a conventional method (1).

TABLE 7

| Information symbol length | Coding | | | Decoding | | |
|---|---|---|---|---|---|---|
| | Conventional method (1) | Proposed method (1) | Reduction rate | Conventional method (1) | Proposed method (1) | Reduction rate |
| 16 bit | 158 | 12 | 92.4% | 161 | 15 | 90.7% |
| 32 bit | 310 | 20 | 93.5% | 313 | 23 | 92.7% |
| 64 bit | 614 | 36 | 94.1% | 617 | 39 | 93.7% |

Table 7 shows the numbers of execution cycles necessary for coding and decoding of 16-bit, 32-bit, and 64-bit information symbols, and rates of reduction in the number of execution cycles achieved by the proposed method (1) with respect to the conventional method (1). It is verified from Table 7 that the proposed method (1) reduces the number of execution cycles by 90% or more in comparison with the conventional method (1).

With this, it is possible to reduce the number of execution cycles for calculation, thereby reducing a power consumption necessary for coding and decoding.

Although the error-correcting code processing method and the error-correcting code processing device according to the embodiments of the present invention have been described above, the present invention is not limited to the embodiments.

For instance, the configurations of the error-correcting code processing device are exemplary configurations for specifically describing the present invention, and the error-correcting code processing device according to the present invention does not necessarily include all of components of the configurations. To put it another way, the error-correcting code processing device according to the present invention may include only minimal components for achieving the effects of the present invention.

Likewise, the error-correcting code processing method is an exemplary method for specifically describing the present invention, and the error-correcting code processing method according to the present invention does not necessarily include all the above steps. Stated differently, the error-correcting code processing method according to the present invention may include minimal steps for achieving the effects of the present invention. Moreover, the order of executing the steps is an exemplary order for specifically describing the present invention, and an order other than the order may be used. Furthermore, part of the steps may be executed concurrently (in parallel) with the other steps.

Moreover, the present invention includes various modifications conceived by a person with an ordinary skill in the art within the scope of the present invention.

INDUSTRIAL APPLICABILITY

The present invention makes it possible to detect and correct an error occurred during information transmission or on a transmission path such as a memory and a bus of a computer.

REFERENCE SIGNS LIST 110, 120 General-purpose processor
111, 121, 225, 311, 321, 331 Instruction memory
112, 122, 226, 312, 332 Data memory
113, 125, 228, 313, 323, 333 Data bus
123 Coding circuit
124 Decoding circuit
220 Error-correcting code processing device
222 RISC processor
223 Check matrix/syndrome operation circuit
224 Error correction circuit
227 Internal bus
310, 320 Processor including dedicated instructions
322 Data memory including an area for table lookup
330 Dynamically reconfigurable processor including dedicated instructions

The invention claimed is:

1. A CRC coding method for calculating, as check symbols, coefficients of a remainder polynomial through a first operation, generating a code word by combining the check symbols and information symbols, and transmitting the code word as data, the first operation being calculating a remainder by dividing, by a generator polynomial, a shift information symbol polynomial obtained by multiplying, by $x^k$ (k is a degree of the generator polynomial), an information symbol polynomial obtained by expressing the information symbols in a polynomial having x as a variable (modulo 2), the method comprising:
generating, by multiplying only a matrix G by a matrix G a predetermined number of times in advance, a submatrix that represents a sub operation unit of the first operation after a second operation is repeated the predetermined number of times, the second operation being (i) deleting in stages each of terms from a highest degree of the variable x of the shift information symbol polynomial in the first operation by multiplying the generator polynomial by a power of the variable x and subtracting the product from each term and (ii) represented by a product of a vector obtained by arranging coefficients of the shift information symbol polynomial and a corresponding matrix G and a product of a vector obtained by arranging remainder coefficients of the shift information symbol polynomial still in one of the stages of the deletion and a corresponding matrix G; and
generating the check symbols by sequentially performing an operation starting from calculating, as a remainder vector still in one of the stages, a product of a vector of the shift information symbol polynomial and the submatrix, to calculating, as a next remainder vector still in one of the stages, a product of the remainder vector still in the stage and the submatrix for each of the predetermined number of times.

2. A CRC decoding method for decoding a received code word that is data obtained by receiving the code word of claim 1 transmitted as data, the CRC decoding method comprising:
generating a syndrome by sequentially performing, in a fourth operation that is deleting in stages each of terms from a highest order of a variable x of a received code word polynomial in a third operation by multiplying the generator polynomial of claim 1 by a power of the variable x and subtracting the product from each term, an operation starting from calculating, as a remainder vector still in one of the stages, a product of a vector of the received code word polynomial and the submatrix of claim 1, to calculating, as a next remainder vector still in one of the stages, a product of the submatrix and a remainder vector still in the stage for each of a predetermined number of times, when coefficients of a remainder polynomial are generated as the syndrome, the received code word polynomial being obtained by expressing the received code word in a polynomial, and the third operation being calculating a remainder by dividing the received code word polynomial by the generator polynomial;
calculating in advance an inverse matrix of the submatrix;
determining, based on the syndrome, presence or absence, and a type, of an error;
correcting the received code word by inverting a value of a bit of the received code word which is identified by a bit location where the bit is 1 in the syndrome, when, in the case where a total number of bits being 1 in the syndrome is one, it is determined that a single error is present in a bit width of check symbols from a low order of the received code word; and
correcting the received code word by inverting a value of a bit identified by a bit location where the bit is 1 in a bit width at a t+1-th (t is an integer greater than or equal to 1) position from a low order of the received code word in a syndrome resulting from t-th repetition of multiplying the syndrome by the inverse matrix, with a bit width of the check symbols being a unit width, when, in the case where a total number of bits being 1 in the syndrome is two or more and a total number of bits being 1 in the resultant syndrome is one, it is determined that a single error is present in a bit width at the t+1-th position from the low order of the received cord word with the bit width of the check symbols being the unit width.

3. The CRC decoding method according to claim 2, for decoding a received code word that is data obtained by receiving the code word transmitted as data,
wherein when the number of bits of one word is a natural number multiple m of a bit length k of the check symbols, and the data has a length of M words,
in the generating, the submatrix includes m product matrices $G^{mk}$, $G^{(m-1)k}$, $G^{(m-2)k}$, . . . , $G^k$ with the predetermined number of times being mk, (m−1)k, . . . , k each of which is a multiple of k,
when, in the generating of a syndrome, dividing the vector of the received code word polynomial on a word basis and performing a collective operation for each of the words, instead of sequentially performing the operation starting from calculating the vector of the received code word polynomial, to calculating the remainder vector still in the stage for each of the predetermined number of times in the generating of the check symbols, the one word is divided into vectors each having a bit width k and including k elements, and exclusive OR of elements of (i) a vector resulting from multiplying a vector A by the product matrix $G^{mk}$ and elements of (ii) a vector resulting from multiplying each of (m−1) vectors by a corresponding one of the matrices $G^{(m-1)k}$, $G^{(m-2)k}$, ..., $G^k$ is calculated as the collective operation for each word, the vector A being obtained by calculating exclusive OR of elements of a first vector among the vectors in the word and elements of a vector resulting from the collective operation performed for a word previous to the word, and the (m−1) vectors each being subsequent to the vector including the k elements in the word and including the k elements, and the inverse matrix is an inverse matrix $G^{-k}$ of $G^k$.

4. An error-correcting code processing device that performs the method according to claim 3, the device comprising:
- a processor;
- an instruction memory that stores, as instructions issued when the method is performed, (i) an instruction for collectively performing, for each word, an operation for calculating the syndrome in the generating of a syndrome, and (ii) an instruction for performing error correction in the code word;
- a dedicated operation circuit that calculates a syndrome or error correction when the processor issues the instructions of the instruction memory, and outputs data resulting from the calculation;
- a data memory that stores data to be transmitted, received data, and the data resulting from the calculation; and
- a data bus for data transfer among the processor, the dedicated operation circuit, and the data memory.

5. The CRC coding method according to claim 1, for generating a code word and transmitting the code word as data,
wherein when the number of bits of one word is a natural number multiple m of a bit length k of the check symbols, and the data has a length of M words, in the generating of a submatrix, the submatrix includes m product matrices $G^{mk}$, $G^{(m-1)k}$, $G^{(m-2)k}$, ..., $G^k$ with the predetermined number of times being mk, (m−1)k, ..., k each of which is a multiple of k, and when, in the generating of the check symbols, dividing the vector of the shift information symbol polynomial into words and sequentially performing a collective operation for each of the words, instead of sequentially performing the operation starting from calculating the vector of the shift information symbol polynomial, to calculating the remainder vector still in the stage for each of the predetermined number of times, the one word is divided into vectors each having a bit width k and including k elements, and exclusive OR of elements of (i) a vector resulting from multiplying a vector A by the product matrix $G^{mk}$ and elements of (ii) a vector resulting from multiplying each of (m−1) vectors by a corresponding one of the matrices $G^{(m-1)k}$, $G^{(m-2)k}$, ..., $G^k$ is calculated as the collective operation for each word, the vector A being obtained by calculating exclusive OR of elements of a first vector among the vectors in the word and elements of a vector resulting from the collective operation performed for a word previous to the word, and the (m−1) vectors each being subsequent to the first vector including the k elements in the word and including the k elements.

6. An error-correcting code processing device that performs the method according to claim 5, the device comprising:
- a processor;
- an instruction memory that stores, as instructions issued when the method is performed, an instruction for collectively performing, for each word, an operation for calculating the check symbols in the generating of the check symbols;
- a dedicated operation circuit that calculates a check matrix when the processor issues the instructions of the instruction memory, and outputs data resulting from the calculation;
- a data memory that stores data to be transmitted, received data, and the data resulting from the calculation; and
- a data bus for data transfer among the processor, the dedicated operation circuit, and the data memory.

* * * * *